US012167654B2

United States Patent
Long et al.

(10) Patent No.: US 12,167,654 B2
(45) Date of Patent: Dec. 10, 2024

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Long, Beijing (CN); Yudiao Cheng, Beijing (CN); Chao Wu, Beijing (CN); Weiyun Huang, Beijing (CN); Xingliang Xiao, Beijing (CN); Benlian Wang, Beijing (CN); Yao Huang, Beijing (CN)

(73) Assignees: Beijing BOE Technology Development Co., Ltd., Beijing (CN); Chnegdu BOE Optoelectronics Technology Co., Ltd., Sichuan (CN)

(*) Notice: Subject to any disclaimer, the term of this patent is extended or adjusted under 35 U.S.C. 154(b) by 421 days.

(21) Appl. No.: 17/768,920

(22) PCT Filed: May 13, 2021

(86) PCT No.: PCT/CN2021/093638
§ 371 (c)(1),
(2) Date: Apr. 14, 2022

(87) PCT Pub. No.: WO2021/254049
PCT Pub. Date: Dec. 23, 2021

(65) Prior Publication Data
US 2023/0048918 A1 Feb. 16, 2023

(30) Foreign Application Priority Data

Jun. 18, 2020 (CN) .......................... 202010558219.9

(51) Int. Cl.
H01L 27/32 (2006.01)
H10K 59/131 (2023.01)
H10K 59/35 (2023.01)

(52) U.S. Cl.
CPC ......... *H10K 59/131* (2023.02); *H10K 59/351* (2023.02)

(58) Field of Classification Search
CPC .. H10K 59/131; H10K 59/351; H10K 59/121; H10K 59/353; H10K 59/65
(Continued)

(56) References Cited

U.S. PATENT DOCUMENTS 10,545,588 B2  1/2020  Li et al.
2014/0204302 A1  7/2014  Shen
(Continued)

FOREIGN PATENT DOCUMENTS

CN  105788466 A  7/2016
CN  110690265 A  1/2020
(Continued)

OTHER PUBLICATIONS

Liu, Xun, Display Panel And Display Device, Translation for CN-210627870-U (Year: 2020).*

*Primary Examiner* — Jami Valentine Miller
*Assistant Examiner* — Ashley Nicole Blackwell
(74) *Attorney, Agent, or Firm* — Chiwin Law LLC

(57) ABSTRACT

A display substrate and a display apparatus are provided, including a first side for displaying and a second side opposite the first side, a base substrate, a display area, at least one connection line and at least one transfer electrode. Each of the at least one connection line at least partially extends in a first direction and is connected to first power lines respectively connected to adjacent first pixel unit groups in a first display area in the first direction; and each
(Continued)

of the at least one transfer electrode at least partially extends in the first direction and is connected to first signal lines that are respectively connected to the adjacent first pixel unit groups in the first display area in the first direction, film layers where at least part of the at least one transfer electrode and each of the at least one connection line are located are different.

20 Claims, 32 Drawing Sheets

(58) Field of Classification Search
USPC .......................................................... 257/91
See application file for complete search history.

(56) References Cited

U.S. PATENT DOCUMENTS

2021/0043135 A1    2/2021   Zhao et al.
2021/0376046 A1   12/2021  Dong

FOREIGN PATENT DOCUMENTS

CN      210575037 U     5/2020
CN      210627870 U  *  5/2020

* cited by examiner

C1-C2

C3-C4

C5-C6

DISPLAY SUBSTRATE AND DISPLAY APPARATUS

CROSS REFERENCES TO RELATED APPLICATIONS

The application is a U.S. National Phase Entry of International Application No. PCT/CN2021/093638 filed on May 13, 2021, designating the United States of America and claiming priority to Chinese Patent Application No. 202010558219.9, filed on Jun. 18, 2020. The present application claims priority to and the benefit of the above-identified applications and the above-identified applications are incorporated by reference herein in their entirety.

TECHNICAL FIELD

Embodiments of the present disclosure relate to a display substrate and a display apparatus.

BACKGROUND

The market demand for display panels with a high screen-to-body ratio is becoming more and more urgent, so that users can have a better visual experience. For example, for electronic products, such as mobile phones and tablet computers, because these electronic devices need to combine components, such as cameras and light sensors, the existing designs, such as "bang screen" and "water-drop screen" are gradually unable to meet the requirements of users, in this situation, an under-screen camera technology emerges as required, which does not require a hole in the screen to place the camera, and makes full screen display possible.

SUMMARY

At least an embodiment of the present disclosure provides a display substrate, provided with a first side for display and a second side opposite to the first side, comprising: a base substrate, a display area, at least one connection line, and at least one transfer electrode. The display area comprises a first display area, the first display area allows at least part of light from the first side of the display substrate to be transmitted to the second side of the display substrate, the first display area comprises a first sub-pixel array, the first sub-pixel array comprises a plurality of first pixel unit groups, a plurality of first signal lines, and a plurality of first power lines arranged respectively in a first direction and a second direction intersecting the first direction, each of the first pixel unit groups comprises at least one first pixel unit, at least a part of each of the plurality of first signal lines extends along the first direction and is configured to provide first display signals to a plurality of first pixel units, the plurality of first signal lines are connected with the first pixel units of the plurality of first pixel unit groups, at least a part of each of the plurality of first power lines extends along the first direction and is configured to provide first power supply voltages to the plurality of first pixel units, and the plurality of first power lines are connected with the first pixel units of the plurality of first pixel unit groups; at least a part of each of the at least one connection line extends along the first direction and is connected with the first power lines respectively connected to adjacent first pixel unit groups in the first direction; and at least a part of each of the at least one transfer electrode extends along the first direction and is connected with the first signal lines respectively connected to adjacent first pixel unit groups in the first direction; a film layer where at least part of the at least one transfer electrode is located is different from a film layer where each of the at least one connection line is located, and an orthographic projection of the at least one transfer electrode on the base substrate is at least partially overlapped with an orthographic projection of the at least one connection line on the base substrate.

For example, in the display substrate provided by at least an embodiment of the present disclosure, the at least one connection line comprises a first connection line, the first connection line extends along the first direction, the first connection line is connected with the first power lines connected with first pixel units that are adjacent in the first direction and are belong to different first pixel unit groups, and the first connection line and the first power lines are arranged in a same layer and are integrally formed.

For example, in the display substrate provided by at least an embodiment of the present disclosure, at least one first pixel unit of the first pixel unit groups comprises a plurality of first pixel units, the at least one transfer electrode comprises a plurality of transfer electrodes, the plurality of transfer electrodes are connected in a one-to-one correspondence with the plurality of first pixel units that are adjacent along the first direction and are belong to different first pixel unit groups, and film layers where the plurality of transfer electrodes are respectively located are different.

For example, in the display substrate provided by at least an embodiment of the present disclosure, the plurality of first pixel units of the first pixel unit groups are arranged in at least two parallel columns along the second direction, the plurality of transfer electrodes comprise a first transfer electrode and a second transfer electrode, the first transfer electrode and the second transfer electrode are arranged in parallel, the first transfer electrode and the second transfer electrode are connected with the first signal lines respectively connected with the first pixel units that are adjacent in the first direction and belong to different first pixel unit groups, a film layer where the first transfer electrode is located is different from a film layer where the second transfer electrode is located, and an orthographic projection of the first transfer electrode on the base substrate and an orthographic projection of the second transfer electrode on the base substrate are at least partially overlapped with an orthographic projection of the first connection line on the base substrate.

For example, in the display substrate provided by at least an embodiment of the present disclosure, an orthographic projection of a part of the first transfer electrode extending along the first direction and an orthographic projection of a part of the second transfer electrode extending along the first direction on the base substrate are overlapped with an orthographic projection of a part of the first connection line extending along the first direction on the base substrate.

For example, in the display substrate provided by at least an embodiment of the present disclosure, gaps allowing light transmission are provided between adjacent first pixel unit groups in the first direction and between adjacent first pixel unit groups in the second direction respectively, and a part of the first connection line and a part of each of the at least one transfer electrode extend along the second direction and bypass the gaps allowing light transmission.

For example, in the display substrate provided by at least an embodiment of the present disclosure, the first connection line is a bending line, and comprises a first part, a second part, and a third part, a first end of the first part and a first end of the second part are connected with two ends of the third part respectively, and extend along the second direction different from the first direction, the third part extends along the first direction, and a second end of the first part and a second end of the second part are respectively connected with the first power lines that are respectively connected with adjacent first pixel units in the first direction.

For example, in the display substrate provided by at least an embodiment of the present disclosure, the orthographic projection of the first transfer electrode on the base substrate and the orthographic projection of the second transfer electrode on the base substrate are overlapped with an orthographic projection of at least one of the first part, the second part, and the third part of the first connection line on the base substrate.

For example, in the display substrate provided by at least an embodiment of the present disclosure, the plurality of first pixel units of each first pixel unit group comprise at least three columns of first pixel units arranged in parallel along the second direction, the at least one transfer electrode comprises a first transfer electrode, a second transfer electrode, and a third transfer electrode, the first transfer electrode, the second transfer electrode, and the third transfer electrode are arranged in parallel, the third transfer electrode is located between the first transfer electrode and the second transfer electrode, the first transfer electrode, the second transfer electrode, and the third transfer electrode are respectively connected with the first signal lines that are respectively connected with adjacent first pixel units in the first direction, film layers where the first transfer electrode, the second transfer electrode, and the third transfer electrode are located are different, the orthographic projection of the first connection line on the base substrate is at least partially overlapped with an orthographic projection of at least one of the first transfer electrode and the second transfer electrode on the base substrate, and the third transfer electrode is arranged in a same layer as the first connection line.

For example, in the display substrate provided by at least an embodiment of the present disclosure, an orthographic projection of the third transfer electrode on the base substrate is at least partially overlapped with an orthographic projection of the first transfer electrode or an orthographic projection of the second transfer electrode on the base substrate.

For example, the display substrate provided by at least an embodiment of the present disclosure further comprises a first insulating layer, a second insulating layer, and a third insulating layer, the first insulating layer is located on the base substrate, the second insulating layer is located on a side of the first insulating layer away from the base substrate, and the third insulating layer is located on a side of the second insulating layer away from the base substrate, the plurality of first signal lines, the plurality of first power lines, and the first connection lines are located on a side of the third insulating layer away from the base substrate, the second transfer electrode is located on a side of the first insulating layer away from the base substrate and is connected with the first signal lines connected to adjacent first pixel units in the first direction through via holes penetrating the second insulating layer and the third insulating layer, the first transfer electrode is located on a side of the second insulating layer away from the base substrate and is connected with the first signal lines connected to adjacent first pixel units in the first direction through via holes penetrating the third insulating layer, and the third transfer electrode is located on a side of the third insulating layer away from the base substrate.

For example, in the display substrate provided by at least an embodiment of the present disclosure, the plurality of first pixel units of each first pixel unit group are arranged in at least one row along the second direction, in a same row, the each first pixel unit group comprises at least two first pixel units, each of the first pixel units of the each first pixel unit group comprises a first pixel driving circuit and a first light-emitting device, the first pixel driving circuit is connected with the first light-emitting device and drives the first light-emitting device to emit light, the first pixel driving circuit comprises a storage capacitor, the storage capacitor comprises a first electrode plate and a second electrode plate arranged at least partially overlapping with the first electrode plate, the first electrode plate is located on a side of the second insulating layer away from the base substrate, the second electrode plate is located on a side of the first insulating layer away from the base substrate, the plurality of first power lines connected with each of the first pixel units are connected with the first electrode plate through a via hole penetrating the third insulating layer, and the first electrode plates of at least two first pixel units in a same row of the each first pixel unit group are connected with each other and are integrally formed.

For example, the display substrate provided by at least an embodiment of the present disclosure further comprises a fourth transfer electrode, at least a part of the fourth transfer electrode extends along the second direction, and the fourth transfer electrode is connected with the first power lines that are respectively connected with the first pixel units that are misaligned in the second direction and that are adjacently arranged and belong to different first pixel unit groups.

For example, the display substrate provided by at least an embodiment of the present disclosure further comprises a fourth transfer electrode, wherein the fourth transfer electrode extends along the second direction, and the fourth transfer electrode is connected with first power lines that are respectively connected with two first pixel units arranged adjacent to the second direction and belonging to different first pixel unit groups.

For example, in the display substrate provided by at least an embodiment of the present disclosure, two ends of the fourth transfer electrode are respectively connected with the first electrode plates of the two first pixel units arranged adjacently and belonging to different first pixel unit groups, to connect the first power lines located in different first pixel unit groups.

For example, in the display substrate provided by at least an embodiment of the present disclosure, the fourth transfer electrode is located on a side of the third insulating layer away from the base substrate, the fourth transfer electrode is connected with the first electrode plates of the two first pixel units arranged adjacently and belonging to different first pixel unit groups through via holes penetrating the third insulating layer.

For example, in the display substrate provided by at least an embodiment of the present disclosure, the fourth transfer electrode is located on a side of the second insulating layer away from the base substrate, and the fourth transfer electrode and the first electrode plates of the two first pixel units arranged adjacently and belonging to different first pixel unit groups are arranged in a same layer and integrally formed.

For example, in the display substrate provided by at least an embodiment of the present disclosure, the fourth transfer electrode comprises a first transfer sub-electrode, a second transfer sub-electrode, and a third transfer sub-electrode, a first end of the first transfer sub-electrode and a first end of the second transfer sub-electrode are respectively connected with two ends of the third transfer sub-electrode, a second end of the first transfer sub-electrode and a second end of the second transfer sub-electrode are respectively connected with the first electrode plates of two first pixel units arranged adjacently and belonging to different first pixel unit groups, the first transfer sub-electrode and the second transfer sub-electrode are arranged in a same layer and integrally formed with the first electrode plates of the two first pixel units that are arranged adjacently and belong to different first pixel unit groups, and the third transfer sub-electrode is located on a side of the third insulating layer away from the base substrate, and the third transfer sub-electrode is connected with the first transfer sub-electrode and the second transfer sub-electrode through via holes passing through the third insulating layer.

For example, in the display substrate provided by at least an embodiment of the present disclosure, the plurality of first pixel units of the first pixel unit group are arranged in multiple rows and multiple columns, in a same first pixel unit group, the first signal lines connected with the first pixel units in a same column are connected with each other and are formed integrally, and the first power lines connected with the first pixel units in a same column are also connected with each other and are formed integrally.

For example, in the display substrate provided by at least an embodiment of the present disclosure, the display area further comprises a second display area, at least a part of the second display area surrounds the first display area, the second display area comprises a second sub-pixel array, and the second sub-pixel array comprises a plurality of second pixel units, each of the plurality of second pixel units comprises a second light-emitting device and a second pixel driving circuit, the second pixel driving circuit is configured to drive the second light-emitting device to emit light, one of the first signal lines connected to a first pixel unit near the second display area extends to the second display area, to be connected with a second pixel unit located in the first direction relative to the first pixel unit, and one of the first power lines connected to a first pixel unit near the second display area extends to the second display area, to be connected with a second pixel unit located in the first direction relative to the first pixel unit.

For example, in the display substrate provided by at least an embodiment of the present disclosure, a pixel density of the second display area is greater than a pixel density of the first display area.

For example, the display substrate provided by at least an embodiment of the present disclosure further comprises a plurality of second signal lines and a plurality of second power lines located in the second display area, the plurality of second pixel units are arranged in a plurality of columns parallel in the second direction, the plurality of second signal lines extend along the first direction, each of the plurality of second signal lines passes through the plurality of second pixel units arranged in a column in the first direction, to provide second display signals to the plurality of second pixel units, the plurality of second power lines extend along the first direction, each of the plurality of second power lines passes through the plurality of second pixel units arranged in a column in the first direction, to provide a second power supply voltage to the plurality of second pixel units.

At least an embodiment of the present disclosure also provides a display apparatus, comprising any of the display substrates above.

For example, the display apparatus provided by at least an embodiment of the present disclosure further comprises a sensor, the sensor is arranged on the second side of the display substrate, and the sensor is configured to receive light from the first side of the display substrate.

For example, the display apparatus provided by at least an embodiment of the present disclosure, an orthographic projection of the sensor on the base substrate is at least partially overlapped with the first display area.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1A:
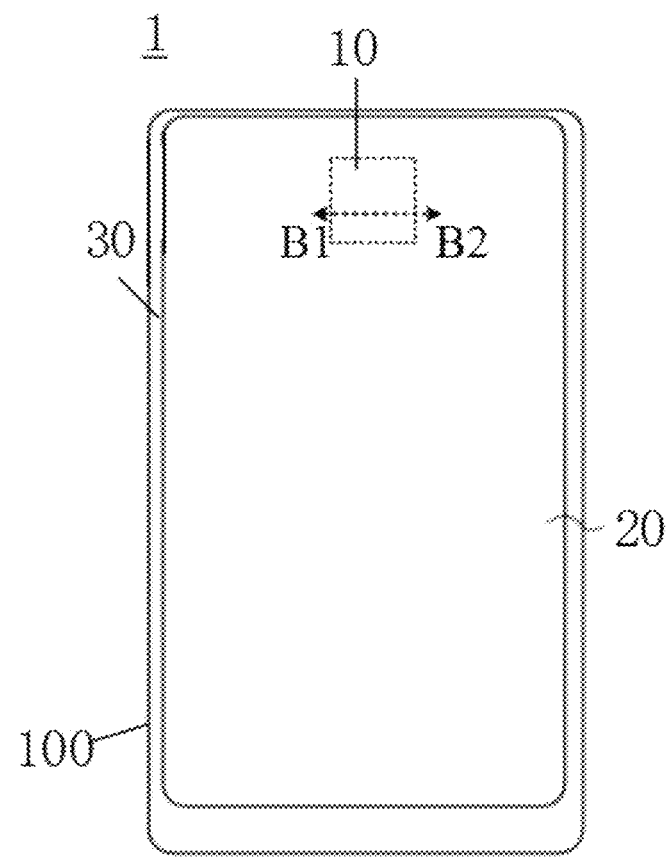
FIG. 1A is a schematic planar diagram of a display substrate provided by at least one embodiment of the present disclosure.

In order to make objects, technical solutions and advantages of embodiments of the present disclosure clearer, the technical solutions of the embodiments will be described in a clearly and fully understandable way in connection with the related drawings. It is apparent that the described embodiments are just a part but not all of the embodiments of the present disclosure. Based on the described embodiments herein, a person of ordinary skill in the art can obtain, without any inventive work, other embodiment(s) which is to be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the present disclosure, are not intended to indicate any sequence, amount or importance, but for distinguishing various components. Also, the terms, such as "a," "an," "the," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms. For the convenience of description, in some drawings, "upper", "lower", "front" and "back" are given. In the embodiments of the present disclosure, the vertical direction is the direction from "upper" to "lower", and the vertical direction is the direction of gravity, the horizontal direction is the direction perpendicular to the vertical direction, and the horizontal direction from right to left is the direction from front to back.

In recent years, mobile display technology has developed rapidly, and a new generation of display technology represented by flexible Active-Matrix Organic Light-Emitting Diode (AMOLED) is being used more and more widely. AMOLED has the characteristics of thinner and lighter, active light-emitting (no need for backlight), no viewing angle problem, high definition, high brightness, fast response, low energy consumption, wide using temperature range, strong shock resistance, and flexible display. Because these display devices need to combine components, such as cameras and light sensors, and these components usually occupy the display area of the display screen, so that a full-screen design of the display screen is difficult to be realized. For the light transmittance of an area where the camera is located in the display, usually, only the light-emitting device of the pixel circuit is reserved in the region where the camera is located to ensure the camera's photo effect. However, the above technology still needs to dig out a part of the display area, the overall effect is that a special-shaped display area is formed, and the visual experience is affected, and a technology is needed to improve the light transmittance of placing the camera.

In order to avoid sacrificing the display area, a technique has emerged that reduces Pixels Per Inch (PPI) in a local area and improves the light transmittance. In this technique, a camera is placed on a back side of the display substrate to image at a display side of the display substrate. This technology places the camera in the area of low PPI, in this area, due to the low resolution PPI and high light transmittance, light at the display side of the display substrate can pass through the low PPI area to reach the camera located on the back side of the display substrate. Horizontal and vertical wiring lines of pixel driving circuits form gratings, which will still adversely affect the imaging of the camera, and will also reduce the aperture ratio and the light transmittance of the PPI area.

At least one embodiment of the present disclosure provides a display substrate, the display substrate is provided with a first side for display and a second side opposite the first side, and the display substrate includes: a base substrate, a display area, at least one connection line and at least one transfer electrode. The display area is arranged on the base substrate and includes a first display area, the first display area allows at least part light from the first side of the display substrate to be transmitted to the second side of the display substrate. The first display area includes a first sub-pixel array, and the first sub-pixel array includes a plurality of first pixel unit groups, a plurality of first signal lines, and a plurality of first power lines arranged in a first direction and a second direction intersecting with the first direction. Each of the first pixel unit groups comprises at least one first pixel unit, at least a part of each of the plurality of first signal lines extends along the first direction and is configured to provide first display signals to a plurality of first pixel units, the plurality of first signal lines are connected with the first pixel units of the plurality of first pixel unit groups, at least a part of each of the plurality of first power lines extends along the first direction and is configured to provide first power supply voltages to the plurality of first pixel units, and the plurality of first power lines are connected with the first pixel units of the plurality of first pixel unit groups. At least a part of each of the at least one connection line extends along the first direction and is connected with the first power lines respectively connected to adjacent first pixel unit groups in the first direction. At least a part of each of the at least one transfer electrode extends along the first direction and is connected with the first signal lines respectively connected to adjacent first pixel unit groups in the first direction. A film layer where at least part of the at least one transfer electrode is located is different from the film layer where the at least one connection line is located, and an orthographic projection of the at least one transfer electrode on the base substrate is at least partially overlapped with an orthographic projection of the at least one connection line on the base substrate.

In the display substrate provided by the above embodiment, the orthographic projection of the at least one transfer electrode on the base substrate is at least partially overlapped with the orthographic projection of the at least one connection line on the base substrate. In this way, the wiring space occupied by the transfer electrodes and the connection lines in the first display area can be reduced, to help reduce a grating effect caused by the transfer electrodes and the connection lines in the first display area, and improve the aperture ratio and light transmittance of the first display area, which allows, for example, sensors to be arranged in the first display area and on the second side of the display substrate for sensing (such as imaging), and improves the sensing effect (image quality) of the sensor.

The embodiments of the present disclosure and examples thereof will be described in detail below with reference to the accompanying drawings.

Figure 1B:
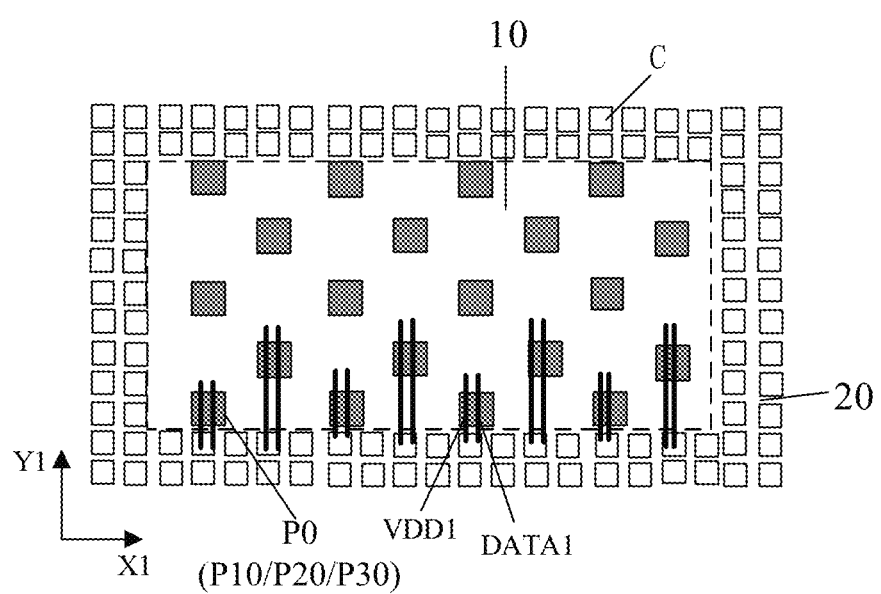
FIG. 1B is a schematic partial enlarged diagram of a display substrate provided by at least one embodiment of the present disclosure.
Figure 1C:
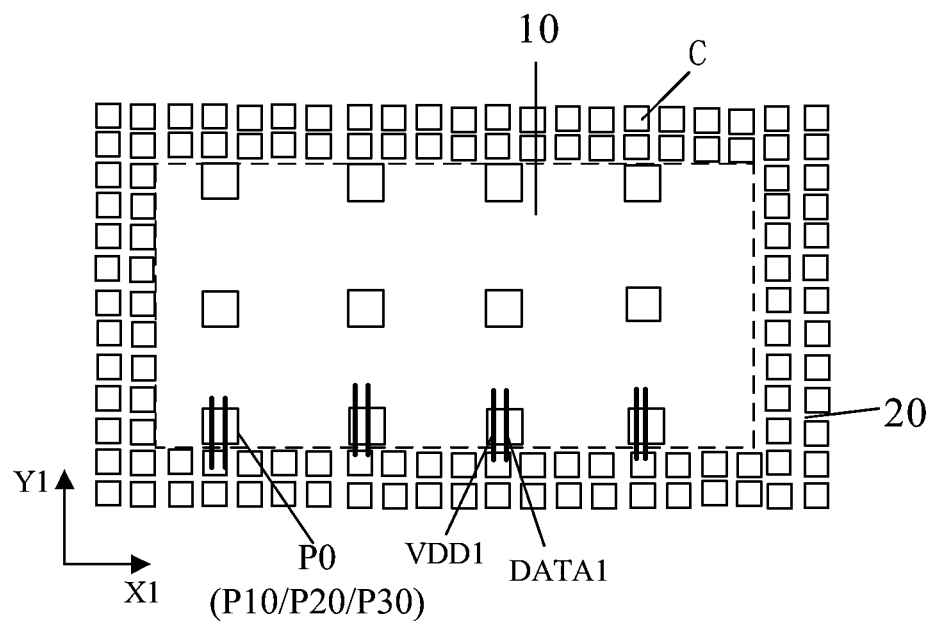
FIG. 1C is a schematic partial enlarged diagram of a display substrate provided by at least another embodiment of the present disclosure.

FIG. 1A is a schematic planar diagram of a display substrate provided by at least one embodiment of the present disclosure; FIG. 1B is a partial enlarged schematic diagram of a display substrate provided by at least one embodiment of the present disclosure; FIG. 1C is a schematically partial enlarged diagram of a display substrate provided by at least another embodiment of the present disclosure; and FIG. 1D is a schematically cross-sectional diagram along line B1-B2 in FIG. 1A.

For example, as shown in FIG. 1A, the display substrate 1 provided by at least one embodiment of the present disclosure includes a base substrate 100 and a display area. The display area is arranged on the base substrate 100, the display area includes a first display area 10 (such as a light-transmitting display area) and a second display area 20 (such as a normal display area). The display substrate 1 may further include a peripheral area 30, the peripheral area 30 surrounds (e.g., partially surrounds) the display area. The second display area 20 surrounds (such as partially surrounds) the first display area 10.

For example, the display substrate 1 provided by at least one embodiment of the present disclosure may be a display substrate, such as an organic light-emitting diode (OLED) display substrate, or a quantum dot light-emitting diode (QLED) display substrate. The embodiments of the present disclosure do not limit a specific type of the display substrate.

Figure 1D:
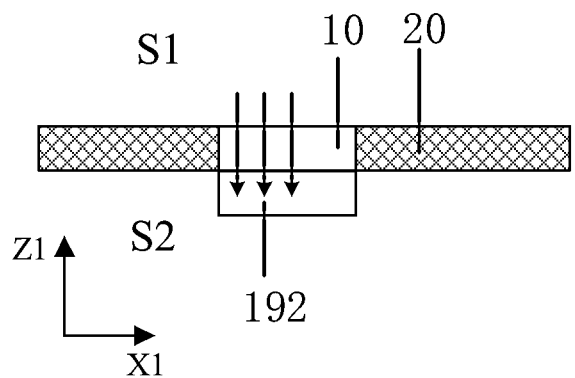
FIG. 1D is a schematic cross-sectional view along a line B1-B2 in FIG. 1A.

For example, as shown in FIG. 1D, the first display area 10 is a transparent display area, that is, light from the first side S1 (such as a display side) of the display substrate 1 is allowed to be at least partially transmitted to the second side S2 (such as a non-display side) of the display substrate 1. That is, incident light from the display side is transmitted through the first display area 10 to reach the non-display side of the display substrate 1. A sensor 192 may also be arranged on the second side S2 of the display substrate 1 to receive the transmitted light, so that corresponding functions (such as imaging, infrared sensing, distance sensing, etc.) are realized. For example, the sensor 192 is arranged on the second side S2 of the display substrate 1, an orthographic projection of the sensor 192 on the base substrate 100 is at least partially overlapped with the first display area 10, and the sensor is configured to receive and process light from the first side S1 of the display substrate 1. The light from the first side S1 of the display substrate 1 may be collimated light along a normal direction of the display substrate 1 (such as the Z1 direction), or may be non-collimated light.

For example, the sensor 192 is an image sensor, an infrared sensor, a distance sensor, etc., the sensor 192, for example, may be implemented in the form of a chip. The sensor 192 is arranged on the second side S2 (a side facing away from the user) of the display substrate 1. The sensor 192 is at least partially overlapped with the first display area 10 in the normal direction of the display surface of the display substrate.

For example, the sensor 192 may be an image sensor and can be used to collect images of an external environment facing a light-collecting surface of the sensor 192, for example, the sensor can be a CMOS image sensor or a CCD image sensor. The sensor 192 may also be an infrared sensor, or a distance sensor. The sensor 192 can be used to implement a camera of a mobile terminal, such as a mobile phone and a notebook, and the sensor can also include optical devices, such as lenses, mirrors, or optical waveguides, as needed, to modulate an optical path. The embodiments of the present disclosure do not limit the type, function, and arrangement of the sensor 192.

The sensor 192 is arranged on the first side S2 of the display substrate by a double-sided tape, and an orthographic projection of the sensor 192 on the base substrate 100 is at least partially overlapped with the first display area 10, and the sensor 192 is configured to receive light from the first side S1. In this way, the first display area 10 provides convenience for the arrangement of the sensor 192 while realizing the display.

For example, as shown in FIG. 1B and FIG. 1C, the first display area 10 includes a first sub-pixel array (gray boxes in the first display area 10), the first sub-pixel array includes a plurality of first pixel unit groups P0 (gray squares in the first display area 10) arranged in the first direction Y1 and the second direction X1 intersecting with the first direction Y1. Each of the plurality of first pixel unit groups P0 may further include at least one first pixel unit (such as a plurality of first pixel units) (described in detail later). Each first pixel unit includes a first light-emitting device and a first pixel driving circuit that are directly connected with each other, the first pixel driving circuit is configured to drive the first light-emitting device to emit light. The first light-emitting device and the first pixel driving circuit are located in a same pixel area, and are not separated from each other in position.

It is to be noted that the first direction Y1 and the second direction X1 may or may not intersect vertically. For example, an acute angle formed by the first direction Y1 and the second direction X1 intersect each other may be less than or equal to 10 degrees and greater than or equal to 45 degrees. In the drawings of the embodiments of the present disclosure, a vertical intersection of the first direction Y1 and the second direction X1 is used as an example for illustration.

Gaps are provided between the plurality of first pixel unit groups P0 that allow light to pass through, that is, the blank area in the first display area 10, which allows incident light from the first side S1 to be transmitted through the gaps between adjacent first pixel unit groups P0, to ensure the light transmittance of the first display area 10.

For example, as shown in FIG. 1B, the plurality of first pixel unit groups P0 are arranged in a staggered arrangement between two adjacent columns, that is, the first pixel unit groups P0 in the first column and the first pixel unit groups P0 in the second column in the figure are staggered in the second direction X1 and arranged in different rows. For example, the first pixel unit groups P0 of adjacent columns are in different rows.

For example, as shown in FIG. 1C, the plurality of first pixel unit groups P0 are arranged in multiple rows and multiple columns, that is, the first pixel unit groups P0 in the first column and the first pixel unit groups P0 in the second column in the figure are adjacent to each other and spaced apart from each other in the second direction X1.

For example, as shown in FIG. 1B and FIG. 1C, the second display area 20 includes a second sub-pixel array (white squares in the second display area 20), the second sub-pixel array includes a plurality of second pixel units C (white squares in the second display area 20). Each of the plurality of second pixel units C includes a second light-emitting device and a second pixel driving circuit that are directly connected with each other, the second pixel driving circuit is configured to drive the second light-emitting device to emit light. The second light-emitting device and the second pixel driving circuit are located in a same pixel area, and are not separated from each other in position.

For example, the pixel density of the second display area is greater than the pixel density of the first display area, as shown in FIG. 1B and FIG. 1C, arrangement density of the first pixel unit groups P0 in the first display area 10 is smaller than arrangement density of the second pixel units C in the second display area 20. That is, the resolution of the first display area 10 is designed to be lower than the resolution of the second display area 20, to leave a space for light to pass therethrough. That is, the pixel density for display arranged in the first display area 10 is smaller than the sub-pixel density of the second display area 20.

Figure 2:
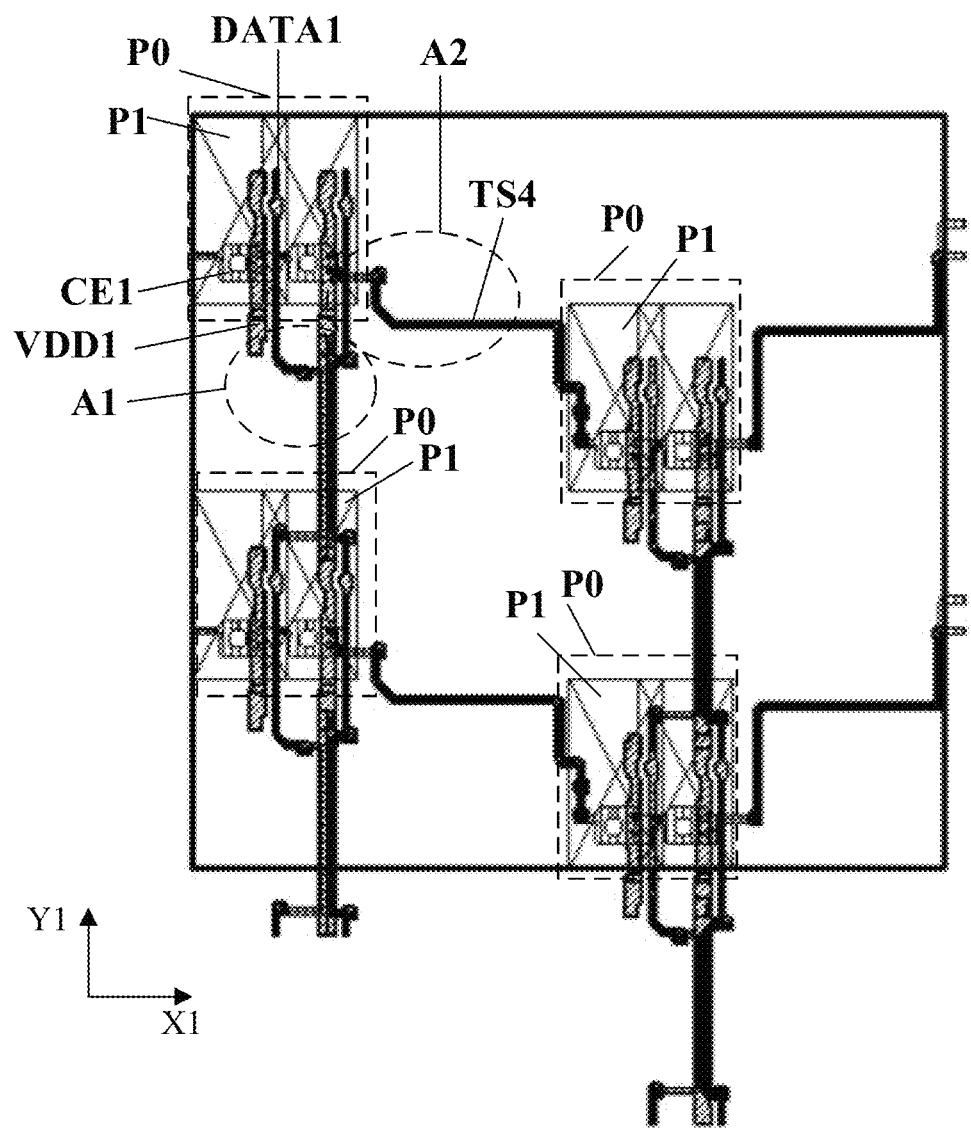
FIG. 2 is a schematic planar layout diagram of wiring lines in a first display area of a display substrate provided by at least one embodiment of the present disclosure.
Figure 3A:
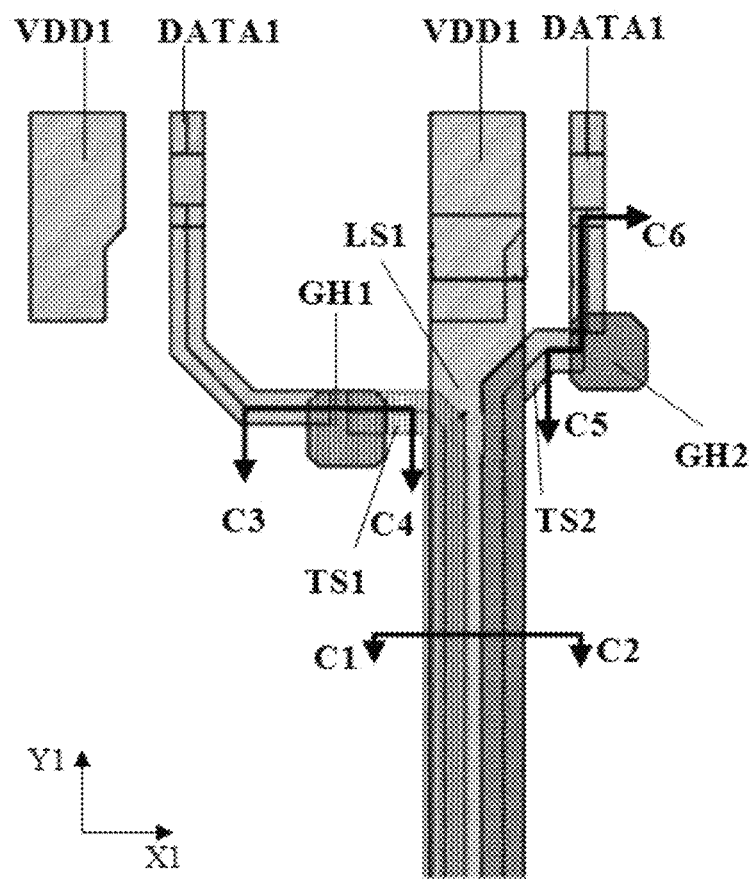
FIG. 3A is a schematic enlarged diagram of an A1 area in FIG. 2.
Figure 3B:
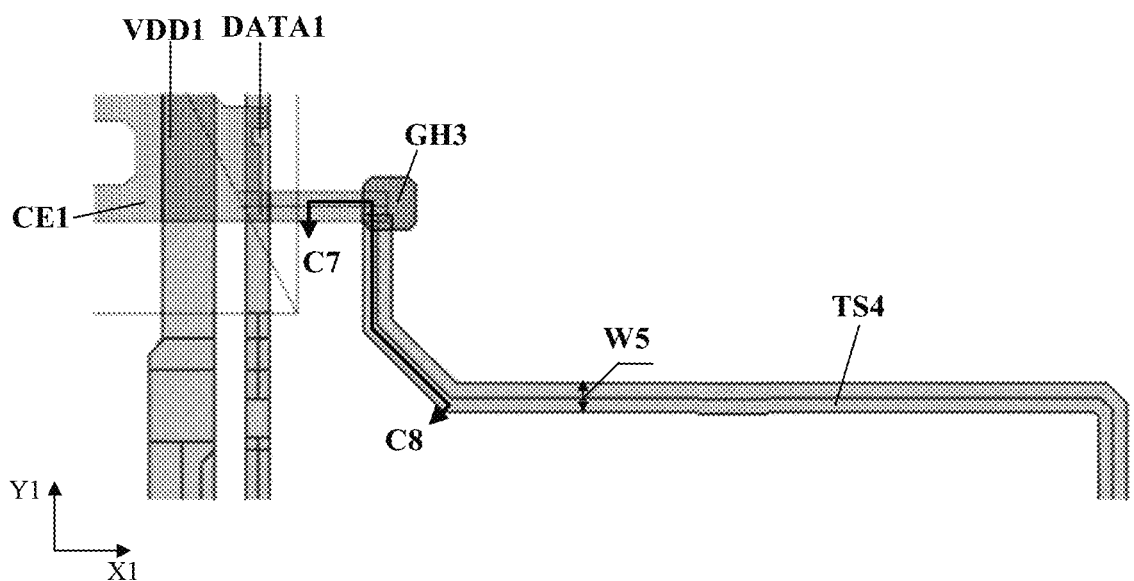
FIG. 3B is a schematic enlarged diagram of an A2 area in FIG. 2.
Figure 5A:
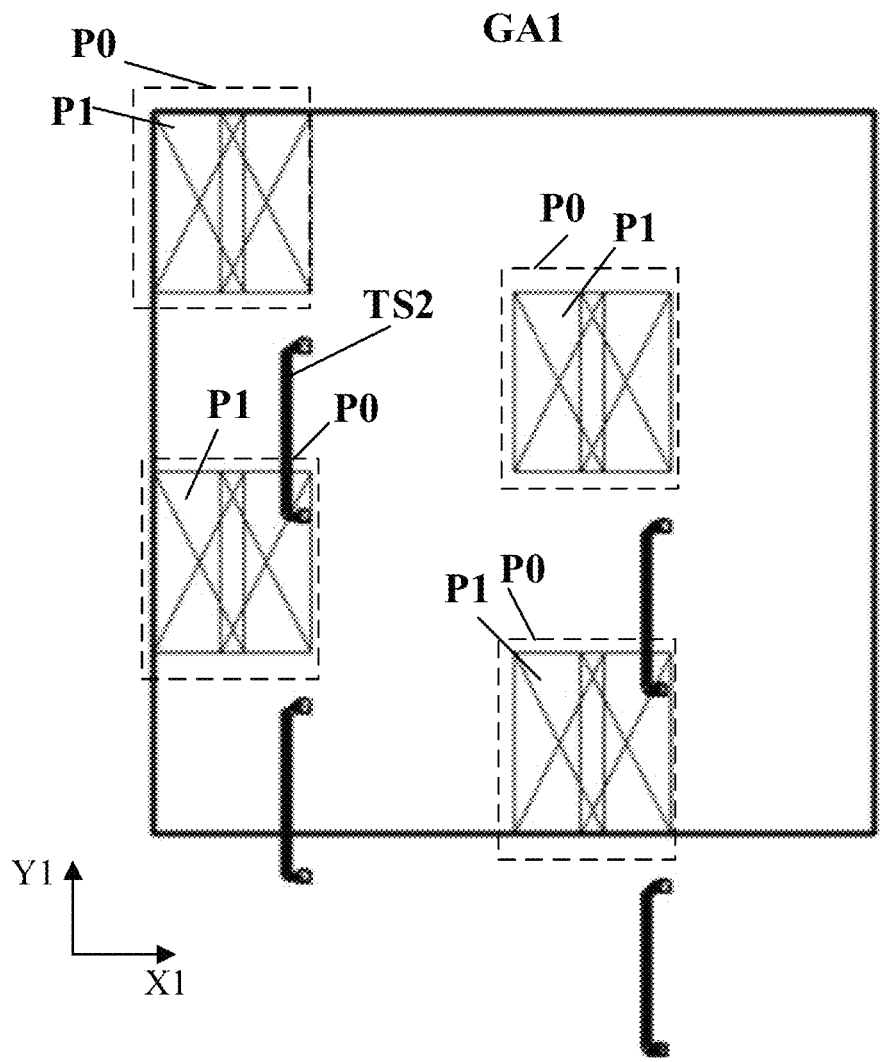
FIGS. 5A to 5C are schematic planar diagrams of each layer of wiring lines in the first display area shown in FIG. 2.
Figure 5B:
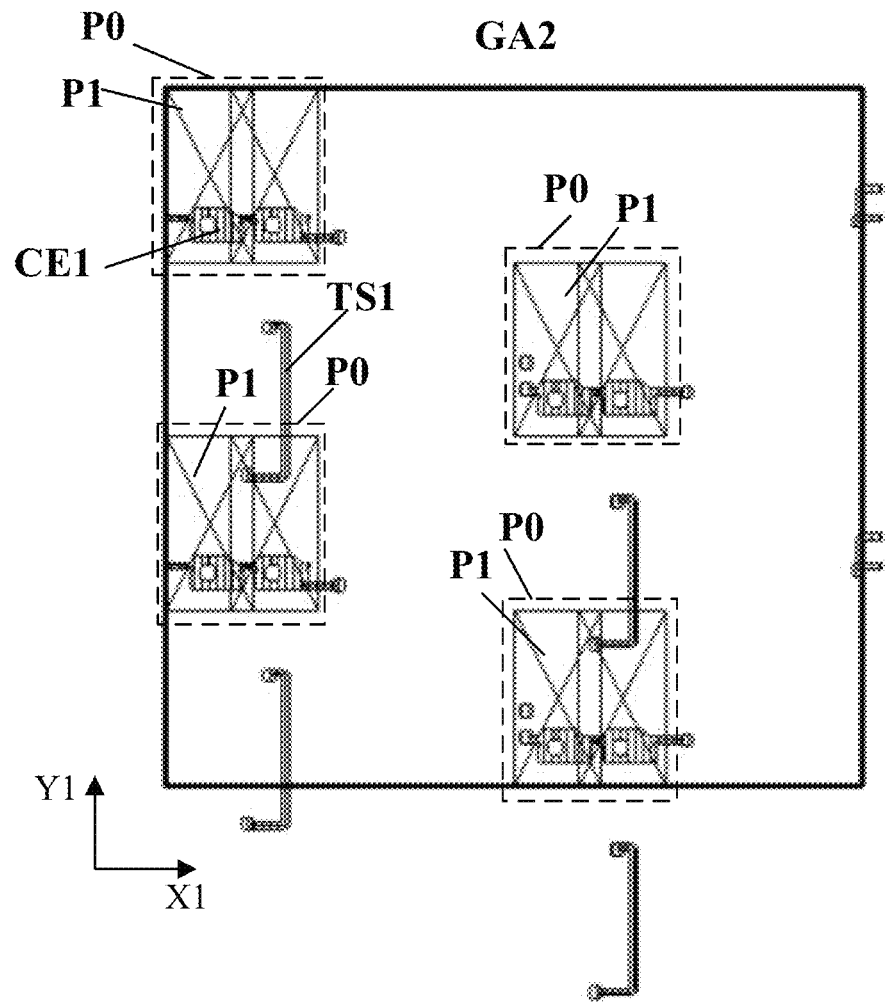
Figure 5C:
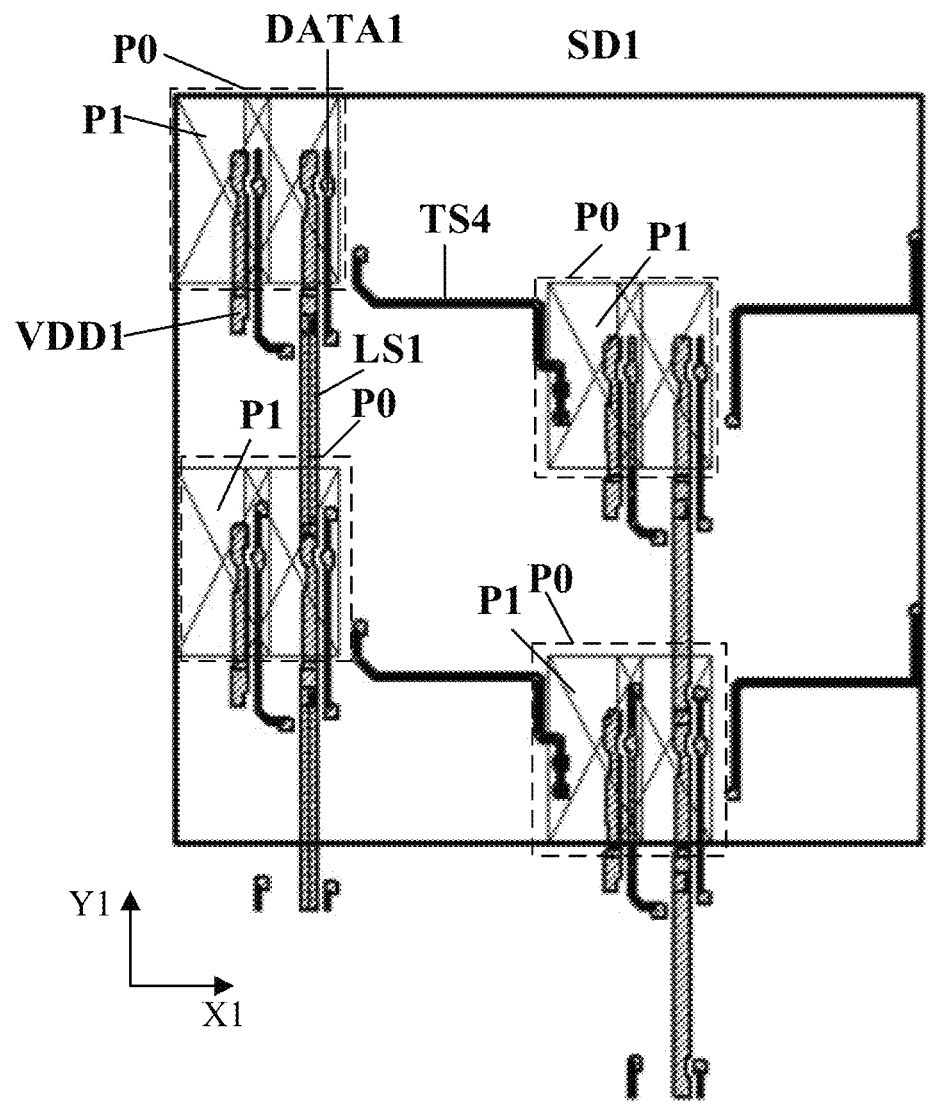

For example, FIG. 2 is a schematic planar layout diagram of wiring lines in a first display area of a display substrate provided by at least one embodiment of the present disclosure. FIG. 3A is a schematic enlarged diagram of an A1 area in FIG. 2. FIG. 3B is a schematic enlarged diagram of an A2 area in FIG. 2. FIGS. 5A to 5C are schematic planar diagrams of each layer of wiring lines in the first display area shown in FIG. 2. FIG. 5A is a schematic planar diagram of wiring lines in the first display area shown in FIG. 2 located in the first conductive layer GA1. FIG. 5B is a schematic planar diagram of wiring lines in the first display area shown in FIG. 2 located in the second conductive layer GA2. FIG. 5C is a schematic planar diagram of wiring lines in the first display area shown in FIG. 2 located in the third conductive layer SD1.

For example, as shown in FIG. 2 and FIG. 5C, the first display area 10 includes a plurality of first signal lines DATA1 and a plurality of first power lines VDD1. Each first pixel unit group P0 includes two first pixel units P1 adjacently arranged along the first direction X1. The plurality of first signal lines DATA1 and the plurality of first power lines VDD1 extend along the first direction Y1. Each of the plurality of first signal lines DATA1 is in one-to-one correspondence with and is connected with corresponding first pixel unit P1 of each of the plurality of first pixel unit groups P0. Each of the plurality of first power lines VDD1 is in one-to-one correspondence with and is connected with each of the first pixel units P1 of the plurality of first pixel unit groups P0. That is, each of the first pixel units P1 is respectively connected with a first signal line DATA1 and a first power line VDD1. The first signal line DATA1 is configured to provide a first display signal to the first pixel unit P1. The first power lines VDD1 are configured to provide first power voltages to the plurality of first pixel units P1, respectively.

It is to be noted that the "connection/connecting/connected" in the embodiments of the present disclosure includes direct connections of wiring lines or circuits, "electrical connections" and "signal connections" of wiring lines or circuits. The embodiments of the present disclosure are not limited to this.

For example, as shown in FIG. 5C, the first power line VDD1 and the first signal line DATA1 located in a same first pixel unit P1 are arranged in parallel. A lower part of a first signal line DATA1 on a left side in the same first pixel unit group P0 (i.e., the part used for connecting the transfer electrode) is bent to the right side (that is, the lower part of the first signal line DATA1 is bent toward the first voltage line VDD1 connected with the connection line).

For example, the display substrate 1 further includes at least one connection line, at least part of the connection line extends along the first direction and is connected with the first power lines respectively connected with adjacent first pixel unit groups in the first direction. As shown in FIG. 2, FIG. 3A and FIG. 5C, the display substrate 1 further includes a plurality of connection lines (for example, a plurality of first connection lines LS1), each of the plurality of connection lines extends along the first direction Y1 and is connected with a first power line VDD1 respectively connected with adjacent first pixel unit groups P0 in the first direction Y1. That is, the first power lines VDD1 in two corresponding first pixel units P1 of adjacent first pixel unit groups P0 in the first direction Y1 are connected with a connection line (such as the first connection line LS1). For example, the first power lines VDD1 connected with the first pixel unit groups P0 adjacent in the first direction Y1 are connected through a connection line (such as the first connection line LS1). That is, the first power line VDD1 in one of the two first pixel units P1 of the first pixel unit group P0 is connected with the connection line (for example, the first connection line LS1), to reduce the number of wiring lines, so that the aperture ratio and light transmittance of the first display area 10 are increased.

For example, the display substrate further includes at least one transfer electrode, at least a part of the transfer electrode extends along the first direction and is connected with the first signal lines respectively connected with adjacent first pixel unit groups in the first direction. As shown in FIG. 2 and FIG. 3A, the display substrate 1 further includes a plurality of transfer electrodes, for example, the plurality of transfer electrodes include a first transfer electrode TS1 and a second transfer electrode TS2. A main body part of each of the plurality of transfer electrodes (that is, most of the transfer electrodes) extends along the first direction Y1 and is respectively connected with the first signal lines DATA1 respectively connected with adjacent first pixel unit groups P0 in the first direction Y1. That is, the first signal lines DATA1 in two corresponding first pixel units P1 of the adjacent first pixel unit groups P0 in the first direction Y1 is connected with one of the plurality of transfer electrodes (the first transfer electrode TS1 or the second transfer electrode TS2). For example, the first signal lines DATA1 connected with the two adjacent first pixel units P1 in the first direction Y1 are connected through a transfer electrode (the first transfer electrode TS1 or the second transfer electrode TS2). The plurality of transfer electrodes are connected in a one-to-one correspondence with a plurality of first pixel units P1 that are adjacent in the first direction Y1 and are belong to different first pixel unit groups P0. That is, the first signal line DATA1 in one of the two first pixel units P1 of each first pixel unit group P0 (for example, located near a left side of one pixel unit P0) is connected with a transfer electrode (for example, the first transfer electrode TS1), and the first signal line DATA1 in the other of the two first pixel units P1 of the each first pixel unit group P0 (for example, located near a right side of one pixel unit P0) is connected with a transfer electrode (for example, the second transfer electrode TS2).

For example, with respect to the base substrate 1, a film layer where at least part of the at least one transfer electrode is located is different from a film layer where the at least one connection line is located, and an orthographic projection of the at least one transfer electrode on the base substrate is at least partially overlapped with an orthographic projection of the at least one connection line on the base substrate. As shown in FIG. 2 and FIG. 3A, the plurality of first connection lines (such as the first connection lines LS1) are located on a side of the plurality of transfer electrodes (such as the first transfer electrode TS1 or the second transfer electrode TS2) away from the base substrate 100. As shown in FIG. 3A, the orthographic projections of the connection lines (such as the first connection lines LS1) on the base substrate 100 is partially overlapped with the orthographic projections of the transfer electrodes (such as the first transfer electrode TS1 or the second transfer electrode TS2) on the base substrate 100, for example, the orthographic projections of parts of the transfer electrodes (such as the first transfer electrode TS1 or the second transfer electrode TS2) extending along the first direction Y1 on the base substrate 100 are overlapped with the orthographic projections of the connection lines (for example, the first connection lines LS1) on the base substrate 100. For example, the orthographic projection on the base substrate 100 of the part of the transfer electrodes (for example, the first transfer electrode TS1 or the second transfer electrode TS2) extending along the first direction Y1 is located in the orthographic projections of the connection lines (for example, the first connection lines LS1) on the base substrate 100, so that the connection lines are overlapped with the transfer electrodes and shield the transfer electrodes, a wiring space of the transfer electrodes is reduced, the aperture ratio and light transmittance of the first display area is improved, and occurrence of optical interference between different wiring lines can be reduced, thereby allowing for example sensors to be arranged in the first display area and on the second side S2 of the display substrate 1 for sensing (such as imaging), and improving the sensing effect (image quality) of the sensor.

It is to be noted that, in the embodiments of the present disclosure, "the film layers are different" includes that two functional layers or structural layers are formed of different layers and different materials in a hierarchical structure of the display substrate, that is, in the manufacturing process, the two functional layers or structural layers can be formed of different material layers, and required patterns and structures can be formed through different patterning processes.

For example, the at least one connection line includes a first connection line. As shown in FIG. 2, FIG. 3A and FIG. 5C, the first connection line LS1 extends along the first direction Y1, the first connection line LS1 is connected with the first power line VDD1 respectively connected with the first pixel units P1 that are adjacent in the first direction Y1 and belong to different first pixel unit groups P0. The first connection line LS1 and the first power line VDD1 to which the first connection line LS1 is connected are basically located in the first direction Y1. As shown in the figure, a gap is provided between adjacent first pixel unit groups P0 in the first direction Y1, to allow light from the first side S1 of the display substrate 1 to pass through. One of the two first pixel units P1 of the adjacent first pixel unit groups P0 in the first direction Y1 is connected with the first connection line LS1, to reduce the number of wiring lines, so that the aperture ratio and light transmittance of the first display area 10 are increased.

Figure 4A:
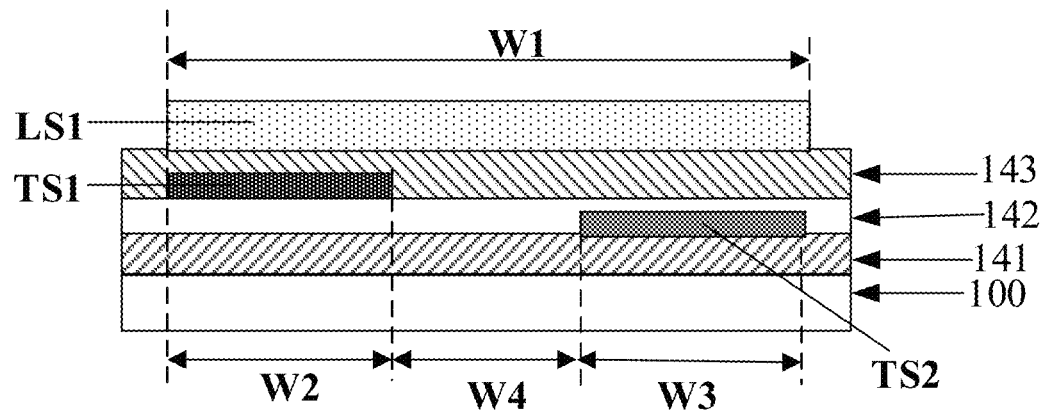
FIG. 4A is a schematic cross-sectional diagram along a line C1-C2 in FIG. 3A.

For example, the first connection line and the first power line are arranged in a same layer and are formed integrally. FIG. 4A is a schematic cross-sectional diagram along a line C1-C2 in FIG. 3A. The line C1-C2 pass through the first connection line LS1, the first transfer electrode TS1, and the second transfer electrode TS2 along the second direction X1.

As shown in FIG. 4A, the display substrate 1 includes a first insulating layer 141 (such as a first gate insulating layer), a second insulating layer 142 (such as a second gate insulating layer), and a third insulating layer 143 (such as an interlayer insulating layer), which are sequentially arranged on the base substrate 100. The second insulating layer 142 is located on a side of the first insulating layer 141 away from the base substrate 100, the third insulating layer 143 is located on a side of the second insulating layer 142 away from the base substrate 100. The first connection line LS1 is located on a side of the third insulating layer 143 away from the base substrate 100, the first power line VDD1 and the first connection line LS1 are arranged in a same layer and are formed integrally through a same patterning process. For example, as shown in FIG. 5C, the first connection line LS1 and the first power line VDD1 are located in the third conductive layer SD1.

It is to be noted that, in the embodiments of the present disclosure, the "formed integrally" refers to a structure in which two (or more than two) film layers or structures that are formed by a same deposition process and patterned by a same patterning process and connected with each other, and their materials can be the same or different.

For example, the materials of the first connection line LS1 and the first power line VDD1 (that is, the third conductive layer SD1) may include metal materials or alloy materials, for example, metal monolayer or multi-layer structure formed by molybdenum, aluminum, and titanium, etc., for example, the multi-layer structure is a multi-metal stack (such as a titanium, aluminum, and titanium tri-metal stack (Ti/Al/Ti)). The embodiments of the present disclosure do not specifically limit the materials of each functional layer.

It is to be noted that, in the embodiments of the present disclosure, "arranged in a same layer" includes that two functional layers or structural layers are formed in a same layer and are formed with a same material in the hierarchical structure of the display substrate, that is, in the manufacturing process, the two functional layers or structural layers can be formed from the same material layer, and desired patterns and structures can be formed through a same patterning process. For example, the patterning process includes steps, such as formation, exposure, development, and etching of photoresist.

For example, materials of one or more of the first insulating layer 141, the second insulating layer 142, and the third insulating layer 143 may include insulating materials, such as silicon oxide, silicon nitride, and silicon oxynitride. The materials of the first insulating layer 141, the second insulating layer 142, and the third insulating layer 143 may be the same or different.

It is to be noted that other film layers may also be arranged between the base substrate 100 and the first insulating layer 141, such as a buffer layer, a barrier layer, etc., which are not limited in the embodiments of the present disclosure.

For example, as shown in FIGS. 3A, 5A, and 5B, the plurality of transfer electrodes include a first transfer electrode TS1 and a second transfer electrode TS2, parts of the first transfer electrode TS1 and the second transfer electrode TS2 extending along the first direction Y1 are arranged in parallel. The two first pixel units P1 of each first pixel unit group P0 are arranged in two parallel columns along the second direction Y1. The first transfer electrodes TS1 and the second transfer electrodes TS2 are connected with the first signal lines DATA1 respectively connected with the first pixel units P1 that are adjacent in the first direction Y1 and belong to different first pixel unit groups P0. That is, the two first pixel units P1 of each first pixel unit group P0 located in the two columns are respectively connected with the first transfer electrode TS1 and the second transfer electrode TS2. The first transfer electrode TS1 and the second transfer electrode TS2 first extend along the second direction X1 near the first connection line LS1, then extend along the first direction Y1, and finally extend along the second direction X1, to connect the first signal lines DATA1 which are adjacent in the first direction Y1 and belong to different first pixel unit groups P0. The parts of the first transfer electrode TS1 and the second transfer electrode TS2 extending along the second direction X1 are relatively short, and the main body parts of the first transfer electrode TS1 and the second transfer electrode TS2 extend along the first direction Y1.

For example, as shown in FIG. 5A. the second transfer electrode TS2 has a "concave" liked shape or a "]" liked shape opening to the right side in the figure (away from the first connection line LS1). And as shown in FIG. 5B, the first transfer electrode TS1 has a "concave" liked shape or "[" liked shape opening to the left side (away from the first connection line LS1) in the figure. The directions of the second transfer electrode TS2 and the first transfer electrode TS1 are opposite, which are both converged to the position where the first connection line LS1 is located, so as to overlap with the first connection line LS1.

Figure 4B:
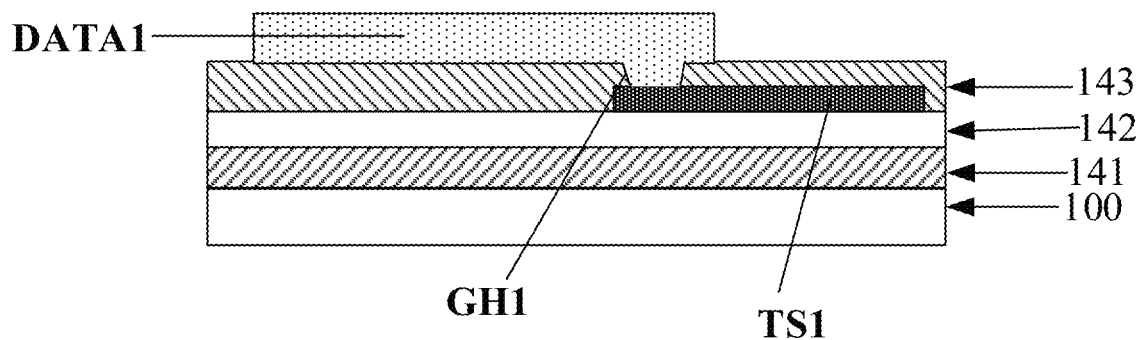
FIG. 4B is a schematic cross-sectional diagram along a line C3-C4 in FIG. 3A.
Figure 4C:
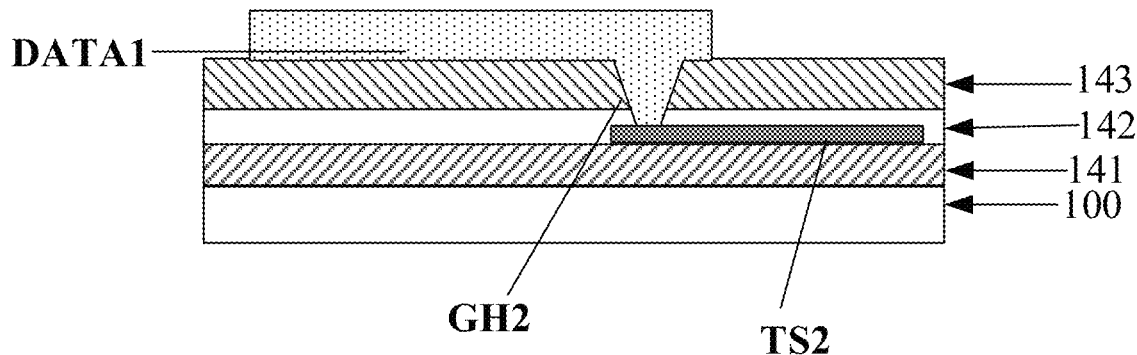
FIG. 4C is a schematic cross-sectional diagram along a line C5-C6 in FIG. 3A.

For example, with respect to the base substrate, the film layers where the plurality of transfer electrodes are respectively located are different. FIG. 4B is a schematic cross-sectional diagram along a line C3-C4 in FIG. 3A; and FIG. 4C is a schematic cross-sectional diagram along a line C5-C6 in FIG. 3A. As shown in FIGS. 3A, 4B and 4C, with respect to the base substrate 100, film layers where the first transfer electrode TS1 and the second transfer electrode TS2 are located are different. The first transfer electrode TS1 is located between the second insulating layer 142 and the third insulating layer 143. For example, as shown in FIG. 5B, the first transfer electrode TS1 is located in the second conductive layer GA2. The second transfer electrode TS2 is located between the first insulating layer 141 and the second insulating layer 142. For example, as shown in FIG. 5A, the second transfer electrode TS2 is located in the first conductive layer GA1. The second insulating layer 142 separates and insulates the first transfer electrode TS1 from the second transfer electrode TS2. The first transfer electrode TS1 and the second transfer electrode TS2 are located in different film layers, which can reduce a size of a spacing between the first transfer electrode TS1 and the second transfer electrode TS2, so that a space occupied by the first transfer electrode TS1 and the second transfer electrode TS2 is reduced.

For example, the materials of the first transfer electrode TS1 and the second transfer electrode TS2 (that is, the first conductive layer GA1 and the second conductive layer GA2) may include metal materials or alloy materials, for example, metal monolayer or multi-layer structure formed by molybdenum, aluminum, and titanium, etc., for example, the multi-layer structure is a multi-metal stack (such as a titanium, aluminum, and titanium tri-metal stack (Ti/Al/Ti)). The embodiments of the present disclosure do not specifically limit the materials of each functional layer.

For example, the orthographic projections of the first transfer electrodes and the second transfer electrodes on the base substrate are at least partially overlapped with the orthographic projections of the first connection lines on the base substrate. As shown in FIG. 3A and FIG. 4A, the orthographic projection of the first connection line LS1 on the base substrate is overlapped with the orthographic projections of the first transfer electrode TS1 (the part extending along the first direction Y1) and the second transfer electrode TS2 (the part extending along the first direction Y1) on the base substrate. That is, the orthographic projection of the first connection line LS1 on the base substrate covers the orthographic projections of the first transfer electrode TS1 (the part extending along the first direction Y1) and the second transfer electrode TS2 (the part extending along the first direction Y1) on the base substrate, so that the first transfer electrode TS1 shields the first connection line LS1 and the second transfer electrode TS2, thus the wiring space for connecting wiring lines is reduced, the aperture ratio and light transmittance of the first display area are improved, and the occurrence of optical interference between different wiring lines can be reduced.

For example, as shown in FIG. 4A, A value range of the width W1 of the cross section of the first connection line LS1 along the second direction X1 is, for example, from about 5 microns to about 6 microns, the value of the width W1 is, for example, about 5.55 microns. A value range of the width W2 of the cross section of the first transfer electrode TS1 along the second direction X1 is, for example, from about 2 microns to about 3 microns, the value of the width W2 is, for example, about 2.5 microns. A value range of the width W3 of the cross-section of the second transfer electrode TS2 along the second direction X1 is, for example, from about 2 microns to about 3 microns, the value of the width W3 is, for example, about 2.5 microns. A value range of the width W4 of a gap between the first transfer electrode TS1 and the second transfer electrode TS2 along the second direction X1 is, for example, from about 0.2 μm to about 1.5 μm. The value of the width W3 is, for example, about 0.55 μm.

It is to be noted that, in the embodiments of the present disclosure, the word "about" refers to the numerical range or the value of the numerical value may fluctuate within a range of, for example, ±5%, and for example, ±10%.

For example, the section line C3-C4 in FIG. 3A pass through the first signal line DATA1, the first via hole GH1 and the first transfer electrode TS1, and the section line C5-C6 in FIG. 3A pass through the first signal line DATA1, the second via hole GH2 and the second transfer electrode TS2. The two first signal lines DATA1 respectively connected with the first transfer electrode TS1 and the second transfer electrode TS2 are located in the two first pixel units P1 belonging to the first pixel unit group P0. As shown in FIG. 4B and FIG. 4C, the first signal line DATA1 is located on a side of the third insulating layer 143 away from the base substrate 100. The film layer where the first signal line DATA1 is located is different from the film layers where the first transfer electrode TS1 and the second transfer electrode TS2 are located. For example, as shown in FIG. 5C, the first signal line DATA1 is located in the third conductive layer SD1.

As shown in FIG. 4B, the first via hole GH1 is a via hole passing through the third insulating layer 143, and the first signal line DATA1 is connected with the first transfer electrode TS1 through the first via hole GH1.

As shown in FIG. 4C, the second via hole GH2 is a via hole passing through the third insulating layer 143 and the second insulating layer 142, and the first signal line DATA1 is connected with the second transfer electrode TS2 through the second via hole GH2.

Figure 21:
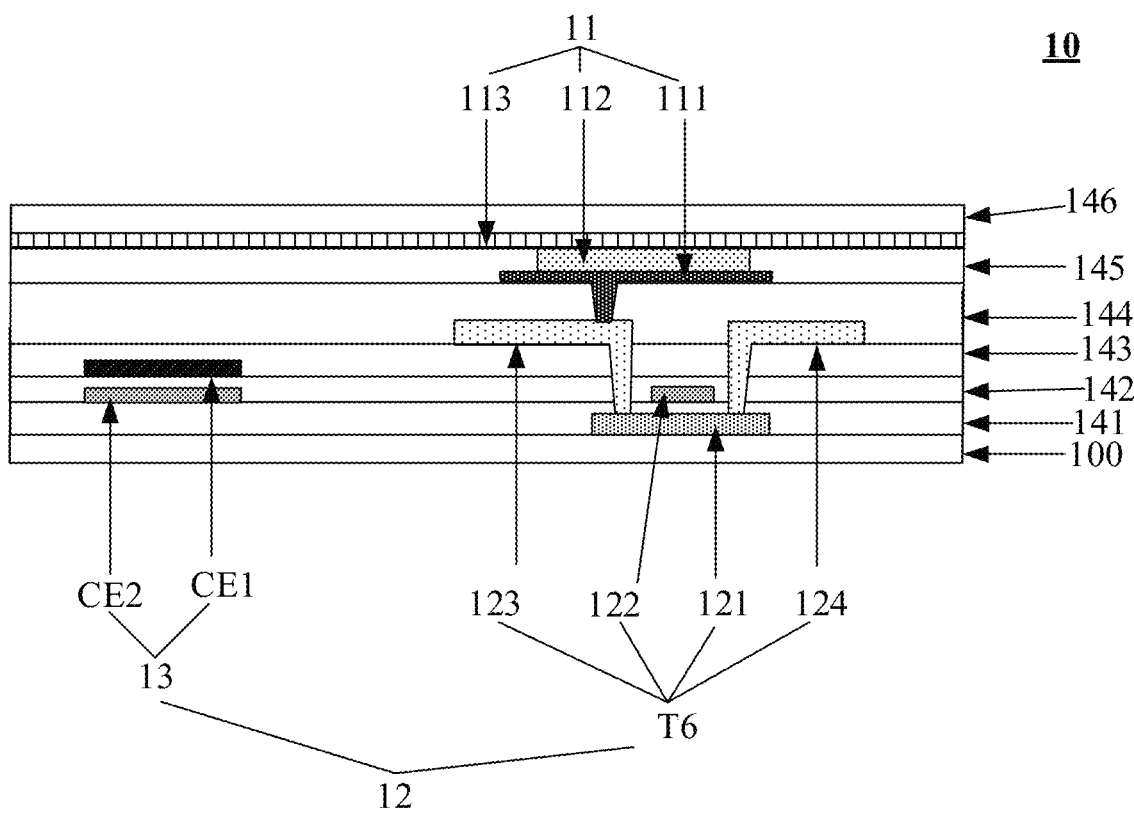
FIG. 21 is a schematic cross-sectional diagram of a first display area in a display substrate provided by at least one embodiment of the present disclosure.

For example, FIG. 21 is a schematic cross-sectional diagram of a first display area in a display substrate provided by at least one embodiment of the present disclosure. As shown in FIG. 2, the two first pixel units P0 of each first pixel unit group P0 are arranged in at least one row along Y1 of the first direction, that is, in a same row, the each first pixel unit group P0 includes two first pixel units P0. As shown in FIG. 21, each first pixel unit P1 of the each first pixel unit group P0 includes a first pixel driving circuit 12 and a first light-emitting device 11, the first pixel driving circuit 12 is connected with the first light-emitting device 11 and drives the first light-emitting device 11 to emit light. The first pixel driving circuit 12 includes a storage capacitor 13, and the storage capacitor 13 includes a first electrode plate CE1 and a second electrode plate CE2 arranged to overlap (such as partially overlap) with the first electrode plate CE1. The first electrode plate CE1 is located on a side of the second insulating layer 142 away from the base substrate 100. The second electrode plate CE2 is located on a side of the first insulating layer 141 away from the base substrate 100. For example, as shown in FIG. 5B, the second electrode plate CE2 is located in the second conductive layer GA2.

Figure 20A:
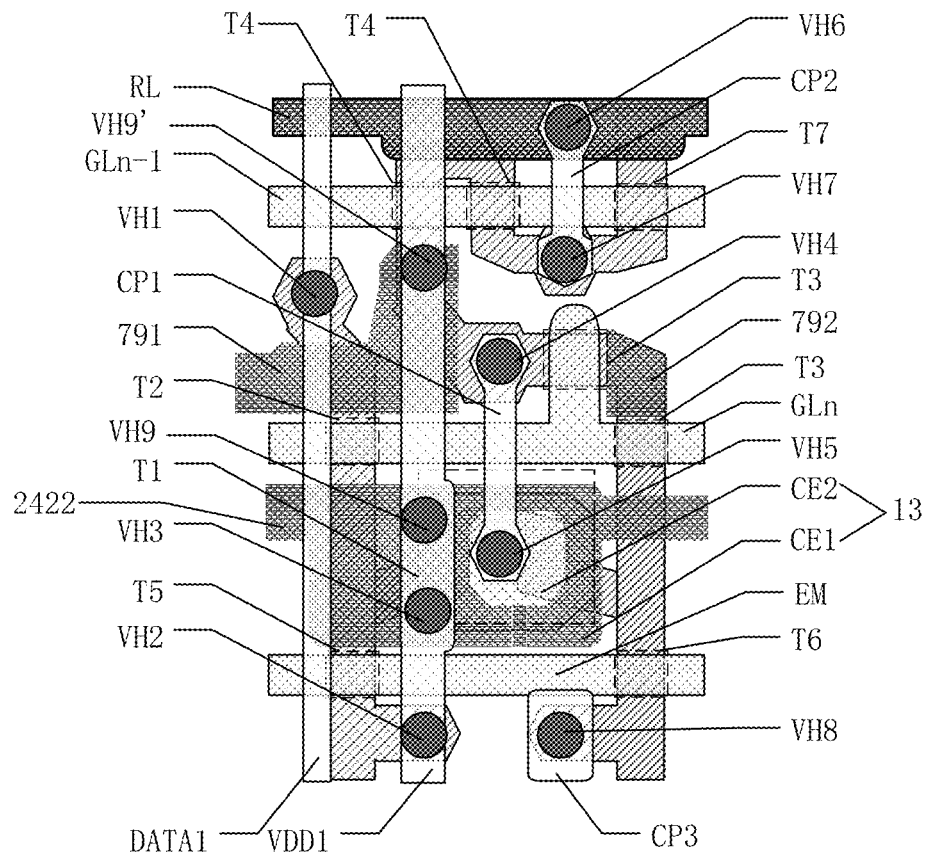
FIG. 20A is a schematic planar layout diagram of a first pixel driving circuit in a first display area of a display substrate provided by at least one embodiment of the present disclosure.

For example, FIG. 20A is a schematic planar layout diagram of a first pixel driving circuit in a first display area of a display substrate provided by at least one embodiment of the present disclosure. As shown in FIG. 2 and FIG. 20A, the plurality of first power lines VDD1 connected with each of the first pixel units P0 in a one-to-one correspondence are connected with the first electrode plate CE1 through the via holes VH9 and VH3 penetrating the third insulating layer 143. The first power line VDD1 can also be connected with the first electrode plate CE1 through one of the via hole VH9 and the via hole VH3, which are not limited in this embodiment of the present disclosure.

It is to be noted that the first pixel driving circuit shown in FIG. 20A is a 7T1C type (that is 7 transistors and 1 capacitor) pixel driving circuit, FIG. 20A is only an example of the first pixel driving circuit, the embodiments of the present disclosure do not limit the first pixel driving circuit, for example, the first pixel driving circuit can also be a 2T1C (that is 2 transistors and 1 capacitor) type pixel drive circuit, the two transistors are a data writing transistor and a driving transistor, respectively, the one capacitor is a signal storage capacitor (for example, the storage capacitor 13 in FIG. 20A), the first pixel driving circuit can generate a driving current for driving the light-emitting element to emit light according to the received scan signal and data signal, the light-emitting element generates light of different intensities according to a magnitude of the driving current. For example, the pixel circuit can also be other types of pixel circuits, for example, the pixel circuit may be further provided with a compensation function, a reset function, a sensing function, etc., in this way, the pixel circuit includes more than 2 thin film transistors.

For example, as shown in FIG. 2 and FIG. 5B, the first electrode plates CE1 of the two first pixel units P1 in the same row of the first pixel unit group P0 are connected with each other and are formed integrally, to save the manufacturing process and reduce the cost. That is, the first power line VDD1 in each first pixel unit P1 is connected with the first electrode plate CE1 of the storage capacitor 13 of the corresponding first pixel unit P1, to connect with the first pixel unit P1. The first power lines VDD1 in the two first pixel units P1 are connected by connecting the first electrode plates CE1 of the two first pixel units P1 in the same row of each first pixel unit group P0 to each other. As mentioned above, in a case that the first power lines VDD1 in the two first pixel units P1 belonging to one first pixel unit group P0 are connected, the first power line VDD1 in one of the two first pixel units P1 can be connected by providing a first connection line LS1, to reduce the number of wiring lines.

For example, as shown in FIG. 2 and FIG. 3B, the display substrate 1 further includes a fourth transfer electrode TS4, and a part (a most part) of the fourth transfer electrode TS4 extends along the second direction X1. The fourth transfer electrode TS4 is connected with the first power line VDD1 respectively connected with the first pixel units P1 that are misaligned in the second direction X1 and are arranged adjacently and belong to different first pixel unit groups P0. As shown in FIG. 2, the plurality of first pixel unit groups P0 (the first pixel unit groups P0 are shown in the FIG. 4) are arranged in the form shown in FIG. 1B. That is, the plurality of first pixel unit groups P0 in two adjacent columns are staggered and arranged in different rows, to leave more gaps in the first pixel unit groups P0, so that light from the first side S1 of the display substrate 1 is allowed to pass through.

For example, as shown in FIG. 2 and FIG. 5C, two ends of the fourth transfer electrode TS4 are respectively connected with the first electrode plates CE1 of the two first pixel units P1 which are arranged adjacently and belong to different first pixel unit groups P0, to connect the first power lines VDD1 located in different first pixel unit groups P1. Because the two first pixel units P1 arranged adjacently and belonging to different first pixel unit groups P0 are misplaced, and are not located in one row along the second direction X1, the fourth transfer electrode TS4 first extends along the first direction Y1, then extend along the second direction X1, and finally extend along the first direction Y1. That is, the fourth transfer electrode TS4 includes a part extending along the first direction Y1. Most of the fourth transfer electrode TS4 extends along the second direction X1.

Figure 4D:
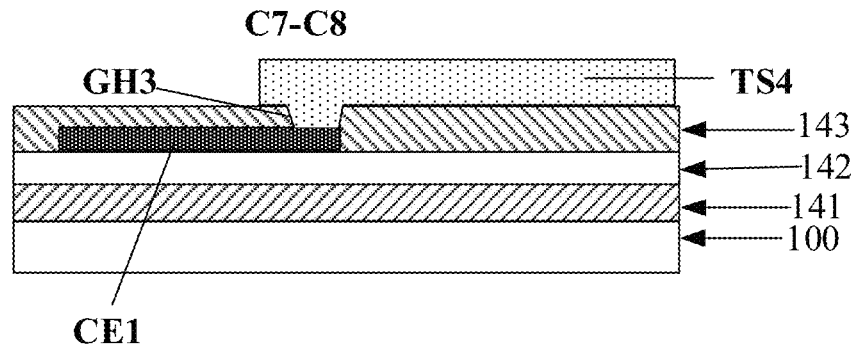
FIG. 4D is a schematic cross-sectional diagram along a line C7-C8 in FIG. 3B.

For example, the section line C7-C8 in FIG. 3B passes through a part of the first electrode plate CE1, the third via hole GH3, and the fourth transfer electrode TS4. FIG. 4D is a schematic cross-sectional diagram along the line C7-C8 in FIG. 3B. As shown in FIG. 4C, the fourth transfer electrode TS4 is located on a side of the third insulating layer 143 away from the base substrate 100, and the third via hole GH3 is a via hole passing through the third insulating layer 143. The fourth transfer electrode TS4 is connected with the first electrode plate CE1 of the first pixel unit P1 through the third via hole 143.

For example, as shown in FIG. 3B, a value range of the width W5 (for example, the width in a direction perpendicular to the wiring direction of the fourth transfer electrode TS4) of the fourth transfer electrode TS4 is, for example, from about 2 microns to about 3 microns, the value of the width W5 is, for example, about 2.5 microns.

Figure 5D:
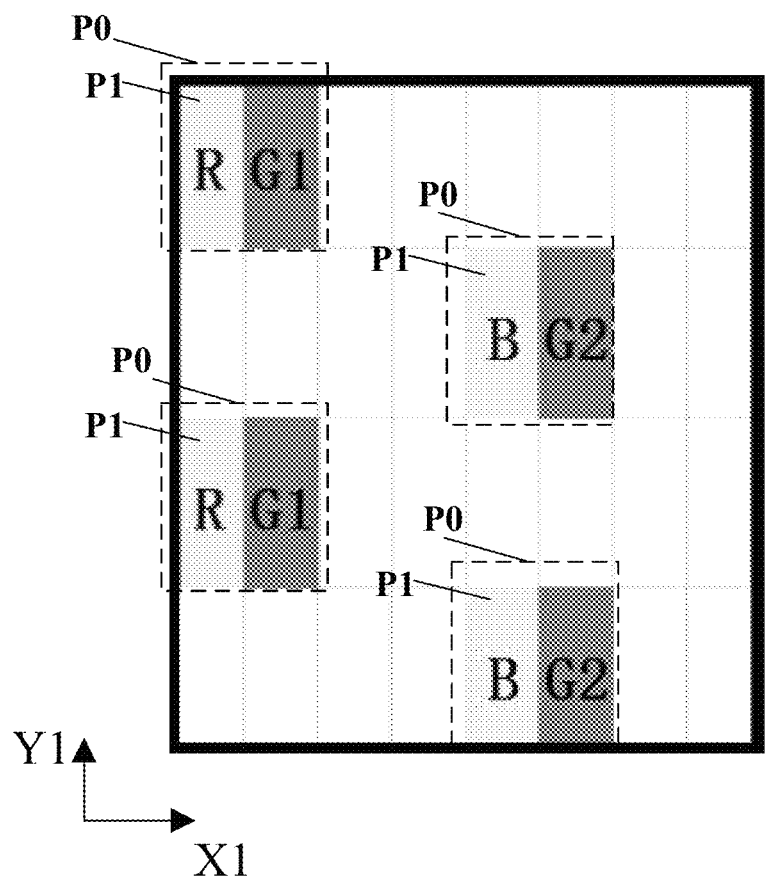
FIG. 5D is a schematic diagram of an arrangement of sub-pixels in the first display area shown in FIG. 2.

For example, FIG. 5D is a schematic diagram of an arrangement of sub-pixels in the first display area shown in FIG. 2. As shown in FIG. 5D, the two first pixel units P1 of the first pixel unit group P0 may respectively include red sub-pixels (R) and green sub-pixels (G), or blue sub-pixels (B) and green sub-pixels (G). For example, as shown in the figure, the first pixel unit group P0 in the first row in the first column includes red sub-pixels (R) and green sub-pixels (G1), that is, the light-emitting device 11 of the first pixel unit P1 on the left side of the first pixel unit group P0 emits red light, the light-emitting device 11 of the first pixel unit P1 on the right side of the first pixel unit group P0 emits green light. It is to be noted that the first pixel unit group P0 in the figure is regarded as a whole to be divided into rows and columns, that is, the first pixel unit groups P0 arranged in the first column includes two rows of the first pixel unit groups P0, and the first pixel unit groups P0 arranged in the second column includes two rows of the first pixel unit groups P0. The first pixel unit group P0 in the second row in the first column includes red sub-pixels (R) and green sub-pixels (G1), the first pixel unit group P0 in the first row in the second column includes blue sub-pixels (B) and green sub-pixels (G2), and the first pixel unit group P0 in the second row in the second column includes blue sub-pixels (B) and green sub-pixels (G2). The adjacent first pixel unit groups P0 in the second direction X1 share red sub-pixels (R) and blue sub-pixels (B), that is, the first pixel unit group P0 in the first column in the first row shares red sub-pixels (R) and blue sub-pixels (B) with the first pixel unit group P0 in the first row in the second column, and the first pixel unit group P0 in the second row in the first column shares red sub-pixels (R) and blue sub-pixels (B) with the first pixel unit group P0 in the second row in the second column, to realize the image display. The light-emitting color of the first pixel unit P1 of the first pixel unit groups P0 can be selected according to actual display needs, which is not limited in the embodiments of the present disclosure.

Figure 6:
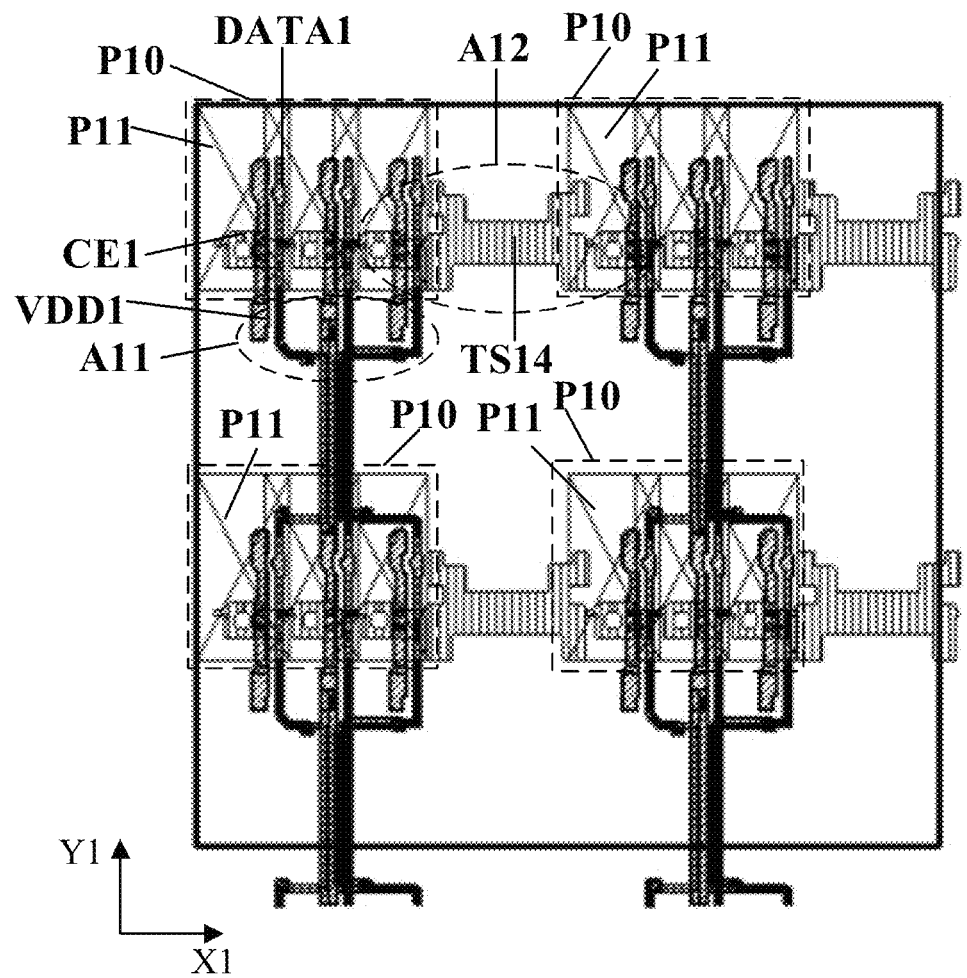
FIG. 6 is a schematic planar layout diagram of wiring lines in a first display area of a display substrate provided by at least another embodiment of the present disclosure.
Figure 7A:
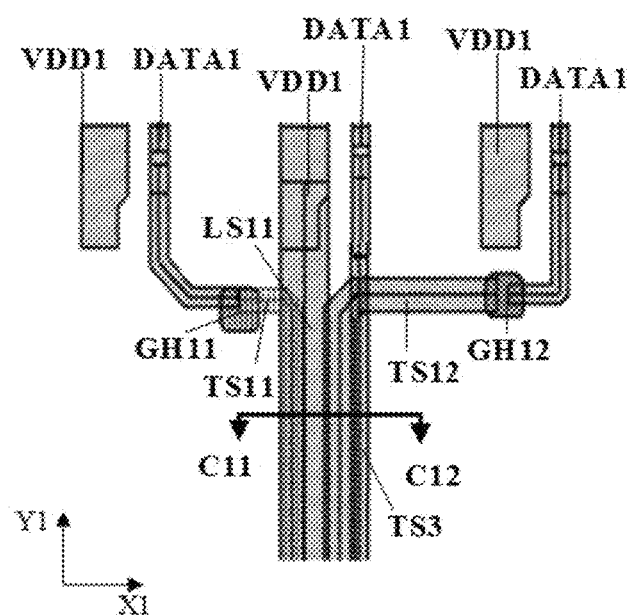
FIG. 7A is an enlarged diagram of an A11 area in FIG. 6.
Figure 7B:
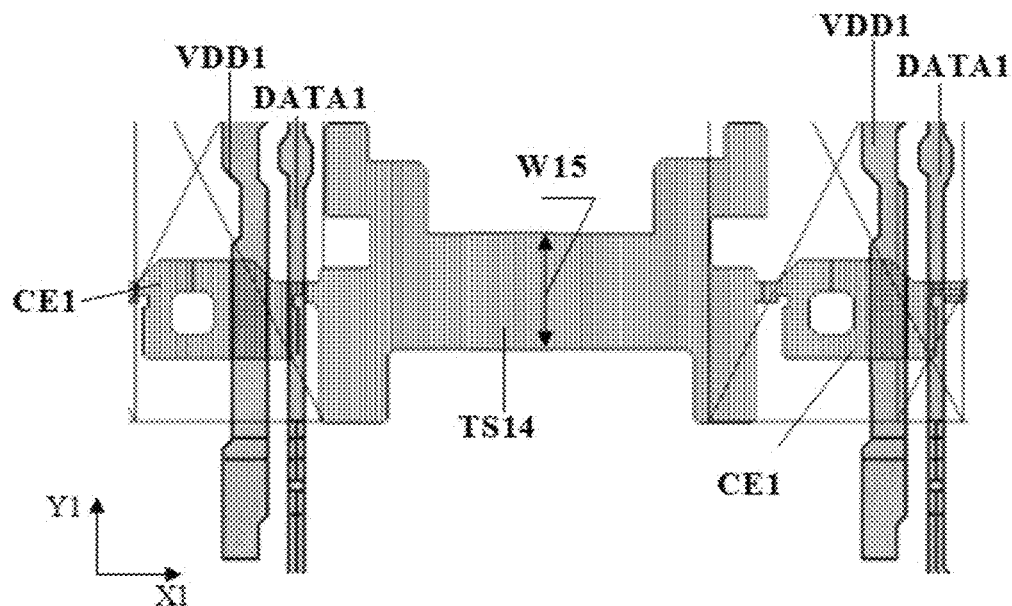
FIG. 7B is an enlarged diagram of an A12 area in FIG. 6.
Figure 9A:
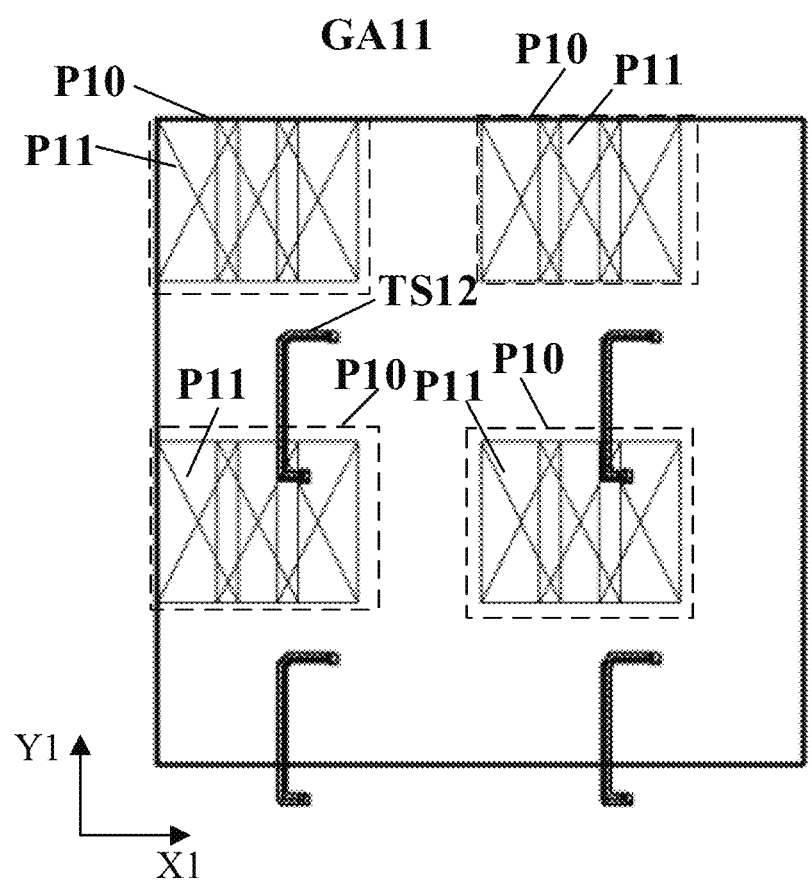
FIGS. 9A to 9C are schematic planar diagrams of each layer of wiring lines in a first display area shown in FIG. 6.
Figure 9B:
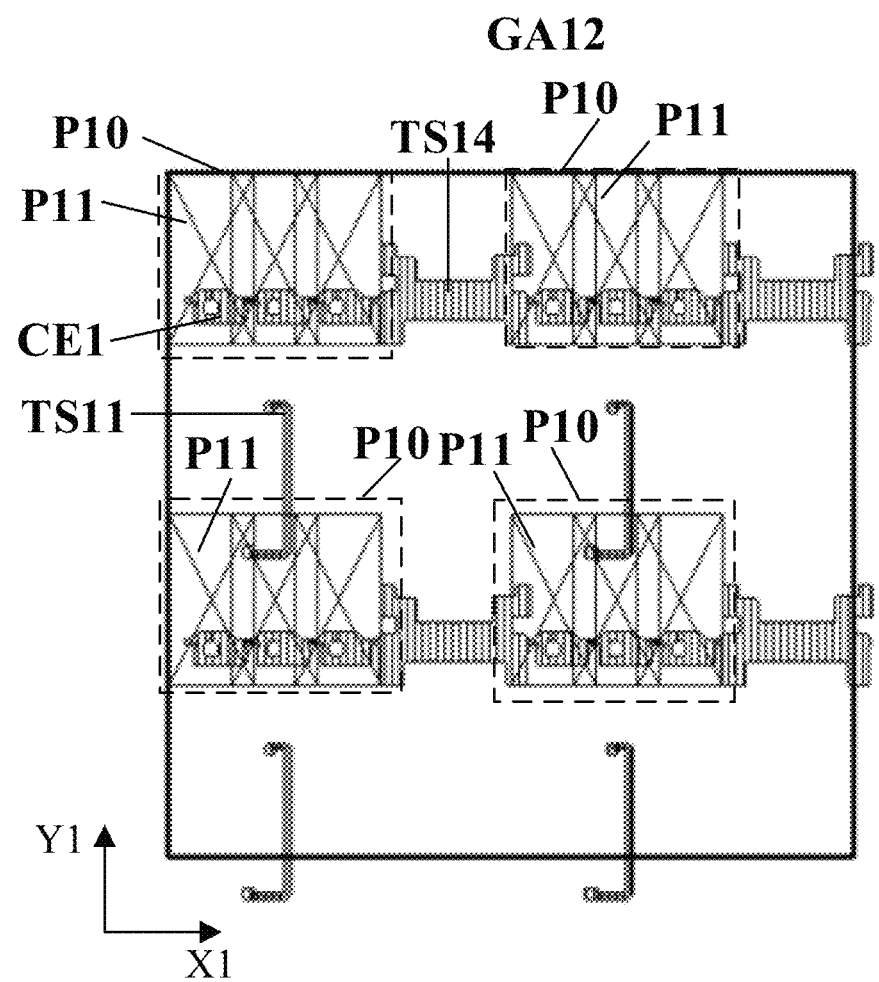
Figure 9C:
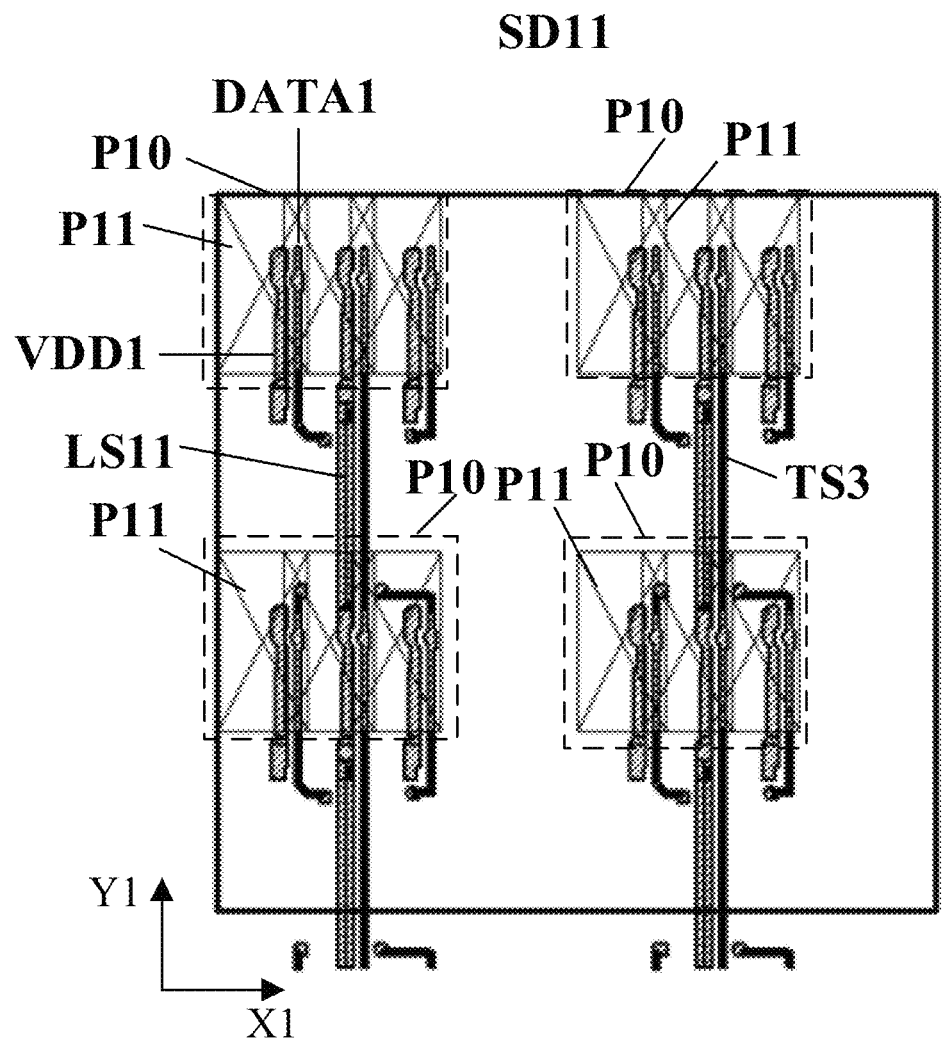

In another embodiment of the present disclosure, for example, FIG. 6 is a schematic planar layout diagram of wiring lines in a first display area of a display substrate provided by at least another embodiment of the present disclosure. FIG. 7A is a schematic enlarged diagram of an A11 area in FIG. 6. FIG. 7B is a schematic enlarged diagram of an A12 area in FIG. 6. FIGS. 9A to 9C are schematic planar diagrams of each layer of wiring lines in a first display area shown in FIG. 6. FIG. 9A is a schematic planar diagram of the wiring lines in the first display area shown in FIG. 6 located in the first conductive layer GA11. FIG. 9B is a schematic planar diagram of the wiring lines in the first display area shown in FIG. 6 located in the second conductive layer GA12. FIG. 9C is a schematic planar diagram of the wiring lines in the first display area shown in FIG. 6 located in the third conductive layer SD11.

For example, as shown in FIG. 6 and FIG. 9C, the first display area 10 includes a plurality of first pixel unit groups P10, a plurality of first signal lines DATA1, and a plurality of first power lines VDD1. The plurality of first pixel unit groups P10 are arranged in multiple rows and multiple columns, that is, according to the arrangement shown in FIG. 1C. The first pixel unit group P10 includes three first pixel units P11 adjacently arranged along the first direction X1 (ie, arranged in a row). The plurality of first signal lines DATA1 and the plurality of first power lines VDD1 extend along the first direction Y1. Each of the plurality of first signal lines DATA1 is in one-to-one correspondence with and is connected with the first pixel units P11 of the plurality of first pixel unit groups P10. Each of the plurality of first power lines VDD1 is in one-to-one correspondence with and is connected with the first pixel units P11 of the plurality of first pixel unit groups P10. That is, each of the first pixel units P11 is respectively connected with a first signal line DATA1 and a first power line VDD1. The first signal line DATA1 is configured to provide first display signals to the first pixel unit P11. The first power line VDD1 is configured to provide first power supply voltages to the plurality of first pixel units P11.

For example, as shown in FIG. 9C, the first power line VDD1 and the first signal line DATA1 located in a same first pixel unit P11 are arranged in parallel. A lower part (the part used to connect with the transfer electrode) of the first signal line DATA1 on the left side in a same first pixel unit group P0 is bent toward a direction close to the first power line VDD1 (used for connecting with the connection line) in the middle. A lower part (the part used for connecting to the transfer electrode) of the first signal line DATA1 on the right side in the same first pixel unit group P10 is bent toward a direction close to the first power line VDD1 (used for connecting with the connection line) located in the middle. In FIG. 9C, an upper part (the part used to connect the transfer electrodes) of the first signal line DATA1 located on the right side in the first pixel unit group P10 in the second row is bent toward a direction close to the first power line VDD1 (used for connecting with the connection line) located in the middle.

For example, the display substrate 1 further includes at least one connection line, at least part of the connection lines extends along the first direction and is connected with the first power lines respectively connected with the adjacent first pixel unit groups in the first direction. As shown in FIG. 6, FIG. 7A, and FIG. 9C, the display substrate 1 further includes a plurality of connection lines (for example, a plurality of first connection lines LS11), each of the plurality of connection lines extends along the first direction Y1 and is connected with the first power line VDD1 respectively connected with the adjacent first pixel unit groups P10 in the first direction Y1. That is, the first power lines VDD1 in the two corresponding first pixel units P11 of the adjacent first pixel unit groups P10 in the first direction Y1 is connected with a connection line (such as the first connection line LS11). For example, the first power line VDD1 connected with the first pixel unit group P10 adjacent in the first direction Y1 is connected by a connection line (such as the first connection line LS11). The first power line VDD1 in one of the three first pixel units P11 of the first pixel unit group P10 is connected with the connection line (such as the first connection line LS11), to reduce the total number of wiring lines, so that the aperture ratio and light transmittance of the first display area 10 are increased.

For example, the display substrate 1 further includes at least one transfer electrode, at least a part of the transfer electrode extends along the first direction and is connected with the first signal lines respectively connected with the adjacent first pixel unit groups in the first direction. As shown in FIG. 6 and FIG. 7A, the display substrate 1 further includes a plurality of transfer electrodes, for example, the transfer electrodes include a first transfer electrode TS11, a second transfer electrode TS12, and a third transfer electrode TS3. A main body part of each of the plurality of transfer electrodes (that is, most part of the transfer electrodes) extends along the first direction Y1, and the main body parts are respectively connected with the first signal lines DATA1 respectively connected with the adjacent first pixel unit groups P10 in the first direction Y1. That is, the first signal lines DATA1 in the two corresponding first pixel units P11 of the adjacent first pixel unit groups P10 in the first direction Y1 are connected with one of the plurality of transfer electrodes (the first transfer electrode TS11, the second transfer electrode TS12, or the third transfer electrode TS3). For example, the first signal lines DATA1 connected with the two adjacent first pixel units P11 in the first direction Y1 are connected through a transfer electrode (the first transfer electrode TS11, the second transfer electrode TS12, or the third transfer electrode TS3). The plurality of transfer electrodes are connected with the plurality of first pixel units P11 that are adjacent in the first direction Y1 and belong to different first pixel unit groups P10 in a one-to-one correspondence. That is, the first signal line DATA1 in one of the three first pixel units P1 (for example, the one located near the left side of a pixel unit P10) of the first pixel unit group P10 is connected with one transfer electrode (such as the first transfer electrode TS11). The first signal line DATA1 in another of the three first pixel units P11 (for example, the one located in the middle of a pixel unit P10) of the first pixel unit group P10 is connected with one transfer electrode (such as the third transfer electrode TS3). The first signal line DATA1 in yet another one of the three first pixel units P1 (for example, the one located near the right side of the pixel unit P10) of the first pixel unit group P10 is connected with one transfer electrode (such as the second transfer electrode TS12).

For example, as shown in FIG. 6 and FIG. 7A, the plurality of connection lines (such as the first connection lines LS11) are located on a side of the plurality of transfer electrodes (such as first transfer electrodes TS11 or second transfer electrodes TS12) away from the base substrate. As shown in FIG. 7A, the orthographic projections of the connection lines (such as the first connection lines LS11) on the base substrate 100 are partially overlapped with the orthographic projections of the transfer electrodes (such as the first transfer electrodes TS11 or the second transfer electrodes TS12) on the base substrate 100. For example, the orthographic projection of a part of each of the transfer electrodes (such as the first transfer electrodes TS11) extending along the first direction Y1 on the base substrate 100 is overlapped with the orthographic projection of the corresponding connection line (such as the first connection lines LS11) on the base substrate 100. For example, the orthographic projection of a part of each of the transfer electrodes (such as the first transfer electrodes TS11) extending along the first direction Y1 on the base substrate 100 fall in the orthographic projection of the corresponding connection line (such as the first connection lines LS11) on the base substrate 100, so that the connection lines are overlapped with the transfer electrodes and cover the transfer electrodes, the wiring space of the wiring lines is reduced, the aperture ratio and light transmittance of the first display area are improved, and the occurrence of optical interference between different wiring lines can be reduced, thereby allowing for example a sensor to be arranged in the first display area and on the second side S2 of the display substrate 1 for sensing (such as imaging), and improving the sensing effect (image quality) of the sensor.

For example, the at least one connection line includes a first connection line. As shown in FIG. 6, FIG. 7A and FIG. 9C, the first connection line LS11 extends along the first direction Y1, the first connection line LS11 is connected with the first power lines VDD1 respectively connected with the first pixel units P11 that are adjacent in the first direction Y1 and belong to different first pixel unit groups P10. The first connection line LS11 and the first power line VDD1 to which the first connection line LS11 is connected are basically located in the first direction Y1. As shown in the figure, a gap is provided between adjacent first pixel unit groups P10 in the first direction Y1, to allow light from the first side S1 of the display substrate 1 to pass through. One of the three first pixel units P1 (such as one pixel unit P1 in the middle) of the first pixel unit groups P10 adjacent in the first direction Y1 is connected with the first connection line LS11, to reduce the number of wiring lines, so that the aperture ratio and light transmittance of the first display area 10 are increased.

Figure 8:
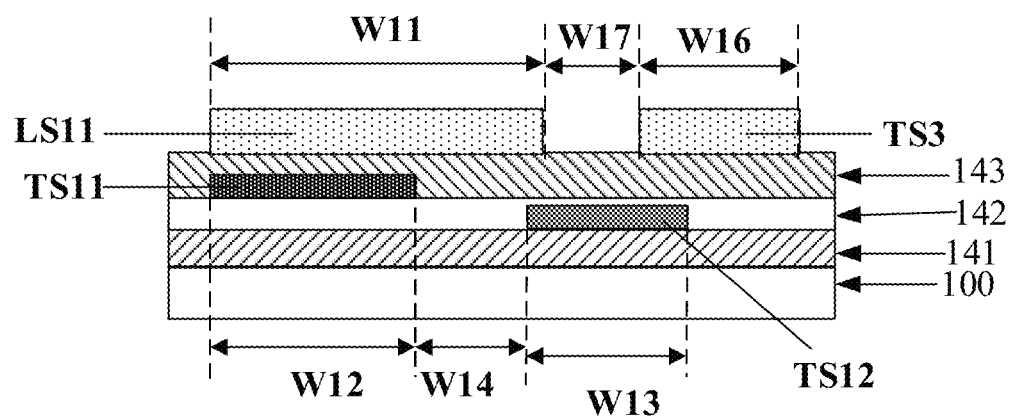
FIG. 8 is a schematic cross-sectional diagram along a line C11-C12 in FIG. 7A.

For example, the first connection lines and the first power lines are arranged in a same layer and are formed integrally. FIG. 8 is a schematic cross-sectional diagram along a line C11-C12 in FIG. 7A. The line C11-C12 pass through the first transfer electrode TS11, the first connection line LS11, the third transfer electrode TS3, and the second transfer electrode TS12 along the second direction X1. As shown in FIG. 8, each of the first connection lines LS11 is located on a side of the third insulating layer 143 away from the base substrate 100, the first power lines VDD1 and the first connection lines LS11 are arranged in a same layer and are formed integrally through a same patterning process. For example, as shown in FIG. 9C, the first connection lines LS11 and the first power lines VDD1 are located in the third conductive layer SD11.

For example, as shown in FIGS. 7A, 9A, and 9B, the plurality of transfer electrodes include a first transfer electrode TS11, a second transfer electrode TS12, and a third transfer electrode TS3. A part of the first transfer electrode TS11, a part of the second transfer electrode TS12, and a part of the third transfer electrode TS3 extending along the first direction Y1 are arranged in parallel. The third transfer electrode TS3 is located between the first transfer electrode TS11 and the second transfer electrode TS12. The three first pixel units P11 of each of the first pixel unit groups P10 are arranged in three parallel columns along the second direction Y1. The first transfer electrode TS11, the third transfer electrode TS3, and the second transfer electrode TS12 are respectively connected with the signal lines DATA1 respectively connected with the first pixel units P11 that are adjacent in the first direction Y1 and belong to different first pixel unit groups P10. That is, the three first pixel units P11 located in the three columns and belonging to the same first pixel unit group P10 are respectively connected with the first transfer electrode TS11, the third transfer electrode TS3, and the second transfer electrode TS12. The third transfer electrode TS3 extends along the first direction Y1. The first transfer electrode TS11 and the second transfer electrode TS12 first extend along the second direction X1 toward the first connection line LS11, then extend along the first direction Y1, and then extend along the second direction X1, to connect the first signal lines DATA1 of the adjacent first pixel units P11 belonging to different first pixel unit groups P10 in the first direction Y1. The part of the first transfer electrode TS11 and the part of the second transfer electrode TS12 extending along the second direction X1 are relatively short, and the main body part of the first transfer electrode TS11 and the main body part of the second transfer electrode TS12 extend along the first direction Y1. The third transfer electrode TS3 extends along the first direction Y1, and the third transfer electrode TS3 and the first signal line DATA1 connected with the third transfer electrode TS3 are basically located on a straight line (that is, both are located in the first direction Y1). The third transfer electrode TS3 may be integrally formed with the first signal line DATA1 connected with the third transfer electrode TS3.

For example, as shown in FIG. 9A, the second transfer electrode TS12 is a "concave" liked shape or a "]" liked shape opening to the right side in the figure (away from the first connection line LS11). As shown in FIG. 9B, the first transfer electrode TS11 is a "concave" liked shape or a "[" liked shape opening to the left side in the figure (away from the first connection line LS11). The directions of the second transfer electrode TS12 and the first transfer electrode TS11 are opposite, both of them are converge to the position where the first connection line LS11 is located, to overlap with the first connection line LS11. As shown in FIG. 9C, the third transfer electrode TS3 is located in the third conductive layer SD11 and is arranged in a same layer as the first signal line DATA1. The third transfer electrode TS3 and the first signal line DATA1 connected with the third transfer electrode are all located in the first direction Y1.

For example, with respect to the base substrate, the film layers where the plurality of transfer electrodes are respectively located are different. As shown in FIG. 8, with respect to the base substrate 100, the film layers where the first transfer electrode TS11, the second transfer electrode TS12 and the third transfer electrode TS3 are located are different. The first transfer electrode TS11 is located between the second insulating layer 142 and the third insulating layer 143. For example, as shown in FIG. 9B, the first transfer electrode TS11 is located in the second conductive layer GA12. The second transfer electrode TS12 is located between the first insulating layer 141 and the second insulating layer 142. For example, as shown in FIG. 5A, the second transfer electrode TS12 is located in the first conductive layer GA11. The second insulating layer 142 separates and insulates the first transfer electrode TS11 from the second transfer electrode TS12. The first transfer electrode TS11 and the second transfer electrode TS12 are located in different film layers, which can reduce the size of the spacing between the first transfer electrode TS11 and the second transfer electrode TS12, so that the space occupied by the first transfer electrode TS11 and the second transfer electrode TS12 is reduced.

For example, as shown in FIG. 9C, the third transfer electrode TS3 is located in the third conductive layer SD11, that is, a side of the third insulating layer 143 away from the base substrate 100, that is, the third transfer electrode TS3 is arranged in a same layer as the first connection line LS11, to reduce the wiring space. The first signal line DATA1 is located in the third conductive layer SD11. That is, the first signal line DATA1 is located on a side of the third insulating layer 143 away from the base substrate 100, the film layer where the first signal line DATA1 is located is different from the film layer where the first transfer electrode TS11 is located and the film layer where the second transfer electrode TS12 is located, but the film layer where the first signal line DATA1 is the same as the film layer where the third transfer electrode TS3 is located. The third transfer electrode TS3 is arranged in a same layer and is formed integrally with the first signal line DATA1 connected therewith.

For example, an orthographic projection of the third transfer electrode on the base substrate is at least partially overlapped with an orthographic projection of the first transfer electrode or the second transfer electrode on the base substrate. As shown in FIGS. 7A and 8, an orthographic projection of the third transfer electrode TS3 on the base substrate 100 is partially overlapped with an orthographic projection of the second transfer electrode TS12 on the base substrate 100, to reduce the wiring space.

For example, the orthographic projection of the first connection line on the base substrate is at least partially overlapped with the orthographic projection of at least one of the first transfer electrode and the second transfer electrode on the base substrate. As shown in FIGS. 7A and 8, the orthographic projection of the first connection line LS11 on the base substrate 100 is overlapped with the orthographic projection of the first transfer electrode TS11 (the part extending along the first direction Y1) on the base substrate 100. That is, the orthographic projection of the first connection line LS11 on the base substrate 100 covers the orthographic projection of the first transfer electrode TS11 (the part extending along the first direction Y1) on the base substrate 100, so that the first connection line LS11 shields the first transfer electrode TS11. In this way, the wiring space of the connection lines is reduced, the aperture ratio and light transmittance of the first display area are improved, and the occurrence of optical interference between different wiring lines can also be reduced.

The orthographic projection of the first connection line LS11 on the base substrate 100 is partially overlapped with the orthographic projection of the second transfer electrode TS21 (the part extending along the first direction Y1) on the base substrate 100, to reduce the wiring space. The orthographic projection of the second transfer electrode TS21 (the part extending along the first direction Y1) on the base substrate 100 is partially overlapped with both the orthographic projection of the first connection line LS11 and the orthographic projection of the third transfer electrode TS3 on the base substrate 100. That is, the second transfer electrode TS21 shields the gap between the first connection line LS11 and the third transfer electrode TS3, to prevent the occurrence of optical interference phenomenon.

For example, as shown in FIG. 8, a value range of the width W11 of the cross section of the first connection line LS11 along the second direction X1 is, for example, from about 5 microns to about 6 microns, the value of the width W1 is, for example, about 5.55 microns. A value range of the width W12 of the cross section of the first transfer electrode TS11 along the second direction X1 is, for example, from about 2 microns to about 3 microns, the value of the width W12 is, for example, about 2.5 microns. A value range of the width W13 of the cross section of the second transfer electrode TS12 along the second direction X1 is, for example, from about 3 microns to about 4 microns, the value of the width W13 is, for example, about 3.5 microns. A value range of the width W14 of the gap between the first transfer electrode TS1 and the second transfer electrode TS2 along the second direction X1 is, for example, from about 2 microns to about 3 microns, the value of the width W13 is, for example, about 2.65 microns. A value range of the width W16 of the cross-section of the third transfer electrode TS3 along the second direction X1 is, for example, from about 1.5 microns to about 2.5 microns, the value of the width W16 is, for example, about 2 microns. A value range of the width W17 of the gap between the first connection line LS11 and the third transfer electrode TS3 along the second direction X1 is, for example, from about 2 microns to about 3 microns, the value of the width W17 is, for example, about 2.7 microns.

For example, as shown in FIG. 7A, the first signal line DATA1 (located at the left side in the figure) is connected with the first transfer electrode TS11 through the first via hole GH11. The first signal line DATA1 (located at the right side in the figure) is connected with the second transfer electrode TS12 through the second via hole GH12. Referring to FIG. 4B and FIG. 4C, the first via hole GH11 and the first via hole GH1 are both via holes penetrating the third insulating layer 143, and the second via hole GH12 and the second via hole GH2 are both via holes passing through the third insulating layer 143 and the second insulating layer 142.

For example, as shown in FIG. 6 and FIG. 21, the three first pixel units P10 of each first pixel unit group P0 are arranged in a row along the first direction Y1, that is, on a same line, the first pixel unit group P10 includes three first pixel units P10. Each first pixel unit P1 of the first pixel unit group P10 includes a first pixel driving circuit 12 and a first light-emitting device 11, the first pixel driving circuit 12 is electrically connected with the first light-emitting device 11 and drives the first light-emitting device 11 to emit light. The first pixel driving circuit 12 includes a storage capacitor 13, and the storage capacitor 13 includes a first electrode plate CE1 and a second electrode plate CE2 arranged to overlap with (such as partially overlap with) the first electrode plate CE1. The first electrode plate CE1 is located on a side of the second insulating layer 142 away from the base substrate 100. The second electrode plate CE2 is located on a side of the first insulating layer 141 away from the base substrate 100. For example, as shown in FIG. 9B, the first electrode plate CE1 is located in the second conductive layer GA12.

For example, as shown in FIG. 6 and FIG. 20A, the plurality of first power lines VDD1 connected with each of the first pixel units P10 in a one-to-one correspondence are connected with the first electrode plates CE1 through the via holes VH9 and VH3 penetrating the third insulating layer 143. The first power lines VDD1 may also be connected with the first electrode plates CE1 through one of the via hole VH9 and the via hole VH3.

For example, as shown in FIG. 6 and FIG. 9B, the first electrode plates CE1 of the three first pixel units P11 located in a same row of the first pixel unit groups P10 are connected with each other and are integrally formed, to save the manufacturing process and reduce the cost. That is, the first power line VDD1 in each of the first pixel units P11 is connected with the corresponding first electrode plate CE1 of the corresponding storage capacitor 13 of the first pixel unit P11, to be electrically connected to the first pixel unit P11, and the first power lines VDD1 in the two first pixel units P11 are electrically connected by connecting the first electrode plates CE1 of the two first pixel units P11 in a same row of the first pixel unit group P10 with each other. As mentioned above, in a case that the first power lines VDD1 in the three first pixel units P11 belonging to one first pixel unit group P10 are electrically connected, the first power line VDD1 in one of the three first pixel units P11 can be connected by arranging one first connection line LS11, to reduce the number of wiring lines.

For example, as shown in FIG. 6 and FIG. 7B, the display substrate 1 further includes a fourth transfer electrode TS14, and the fourth transfer electrode TS14 extends along the second direction X1. The fourth transfer electrode TS14 is electrically connected with the first power lines VDD1 respectively connected with the first pixel units P1 that are adjacently arranged in the second direction X1 and belong to different first pixel unit groups P0. As shown in FIG. 2, the plurality of first pixel unit groups P10 (four first pixel unit groups P10 are shown in FIG. 6) are arranged in the form shown in FIG. 1C. That is, the plurality of first pixel unit groups P10 in two adjacent columns are located in a same row, to leave more gaps between the first pixel unit groups P10, so that the light from the first side S1 of the display substrate 1 is allowed to pass through.

For example, as shown in FIG. 6 and FIG. 9C, both ends of the fourth transfer electrode TS14 are respectively connected with first electrode plates CE1 of two first pixel units P11 arranged adjacently and belonging to different first pixel unit groups P10, to electrically connect the first power lines VDD1 located in different first pixel units P11. Because the two first pixel units P11 arranged adjacently and belonging to different first pixel unit groups P10 are located in a row along the second direction X1, the fourth transfer electrode TS14 extends along the first direction Y1.

For example, as shown in FIGS. 7B and 9B, the fourth transfer electrode TS14 is located in the second conductive layer GA12, and is connected with the first electrode plate CE1 of the first pixel unit P11 and can be integrally formed.

For example, as shown in FIG. 7B, a value range of the width W15 of the fourth transfer electrode TS14 (for example, the width in a direction perpendicular to the wiring line direction of the fourth transfer electrode TS14) is, for example, from about 14 microns to about 15 microns, the value of the width W15 is, for example, about 14.5 microns. The width W15 of the fourth transfer electrode TS14 is larger, so that other wiring lines (for example, light-emitting control signal lines, gate scanning signal lines, etc.) between the two first pixel units P11 that are adjacently arranged and belong to different first pixel unit groups P10 can be shielded, to reduce the generation of optical interference.

Figure 9D:
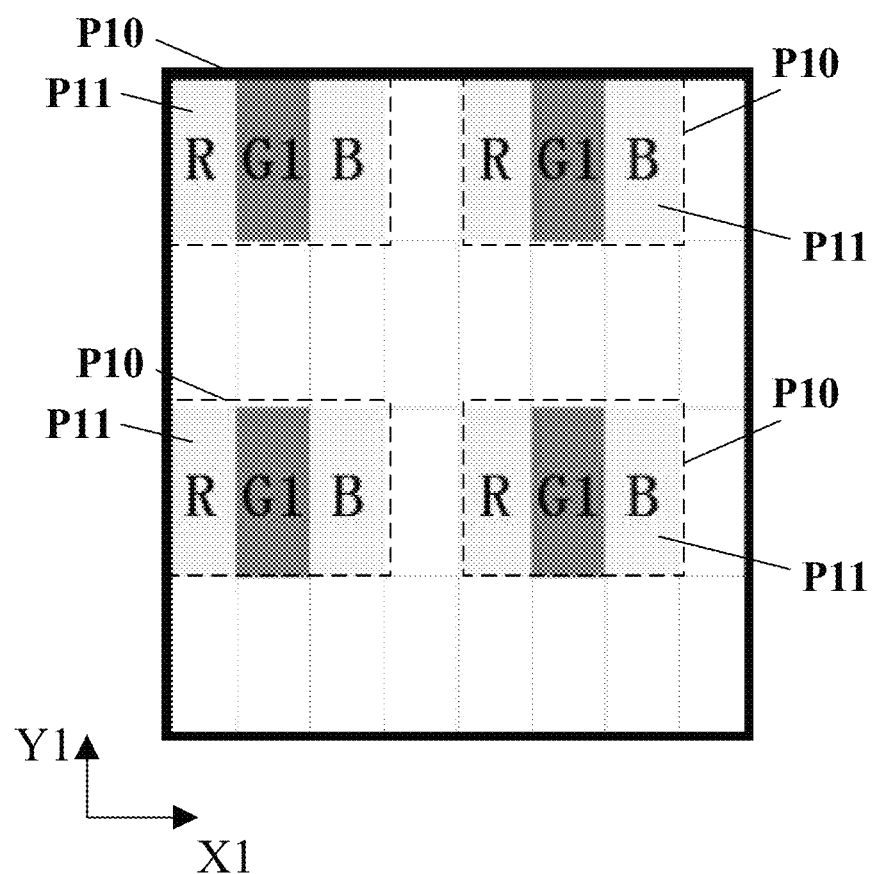
FIG. 9D is a schematic diagram of an arrangement of sub-pixels in the first display area shown in FIG. 6.

For example, FIG. 9D is a schematic diagram of an arrangement of sub-pixels in the first display area shown in FIG. 6. As shown in FIG. 9D, the three first pixel units P11 of each first pixel unit group P10 may include a red sub-pixel (R), a green sub-pixel (G1), and a blue sub-pixel (b), respectively, that is, the light-emitting device 11 of the first pixel unit P1 on the left side of the first pixel unit group P10 emits red light, and the light-emitting device 11 of the first pixel unit P1 in the middle of the first pixel unit group P10 emits green light, and the light-emitting device 11 of the first pixel unit P1 on the right side of the first pixel unit group P10 emits blue light to realize the image display. The luminous colors of the first pixel units P11 of the first pixel unit groups P10 can be selected according to the actual display needs, and the embodiment of the present disclosure is not limited thereto.

Figure 10:
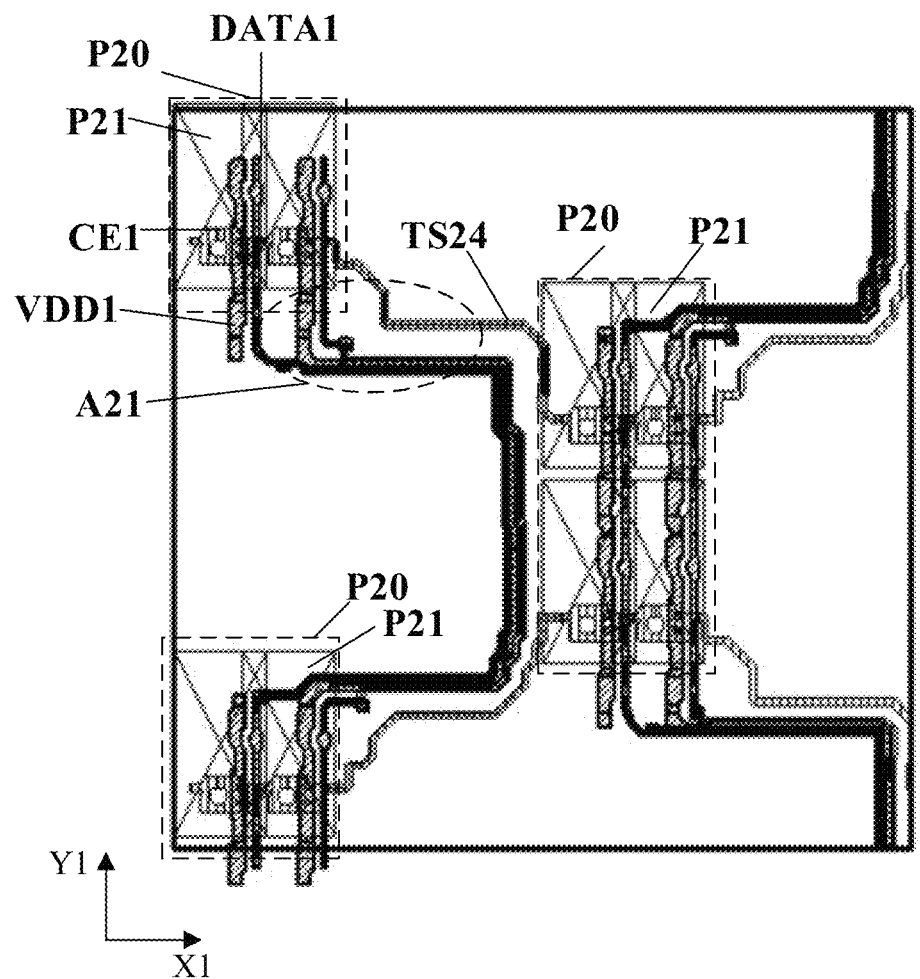
FIG. 10 is a schematic planar layout diagram of wiring lines in a first display area of a display substrate provided by at least another embodiment of the present disclosure.
Figure 11:
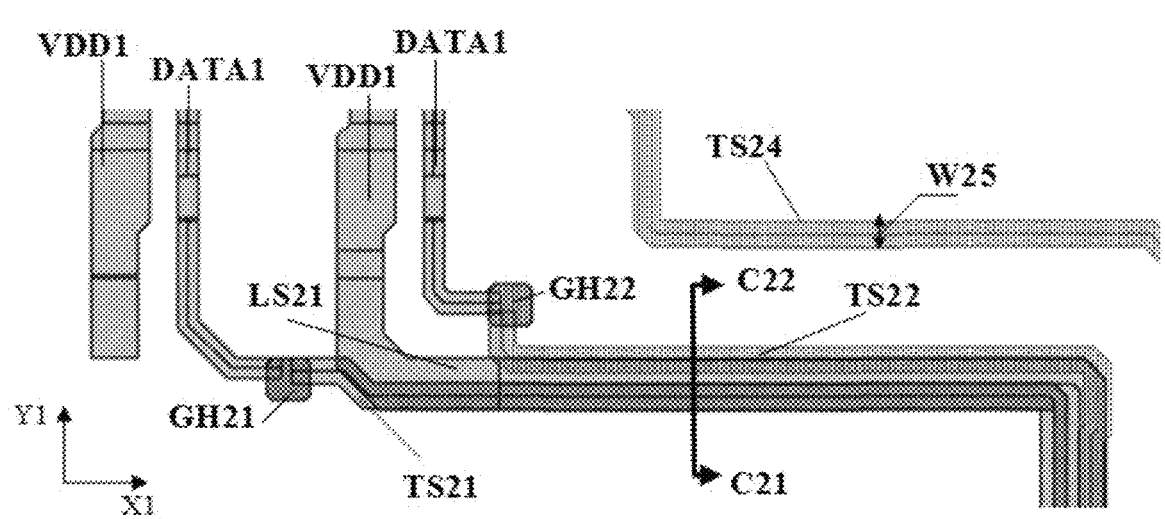
FIG. 11 is an enlarged diagram of an A21 area in FIG. 10.
Figure 13A:
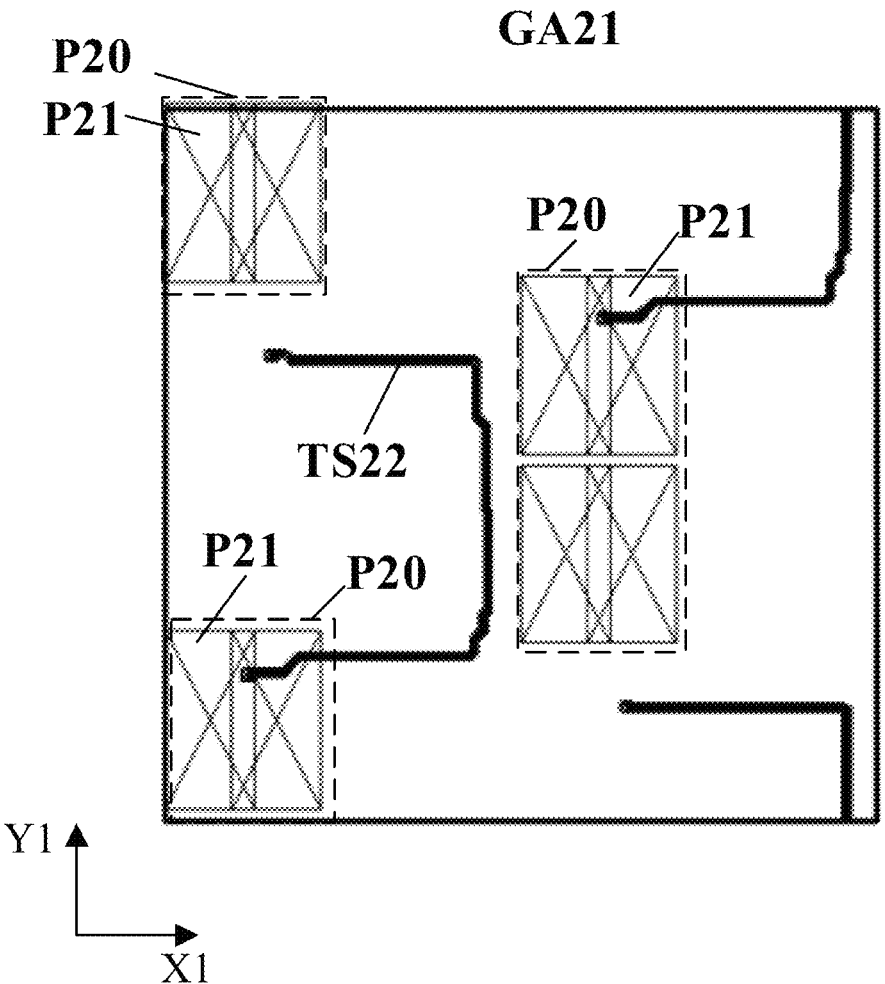
FIGS. 13A to 13C are schematic planar diagrams of each layer of wiring lines in the first display area shown in FIG. 10.
Figure 13B:
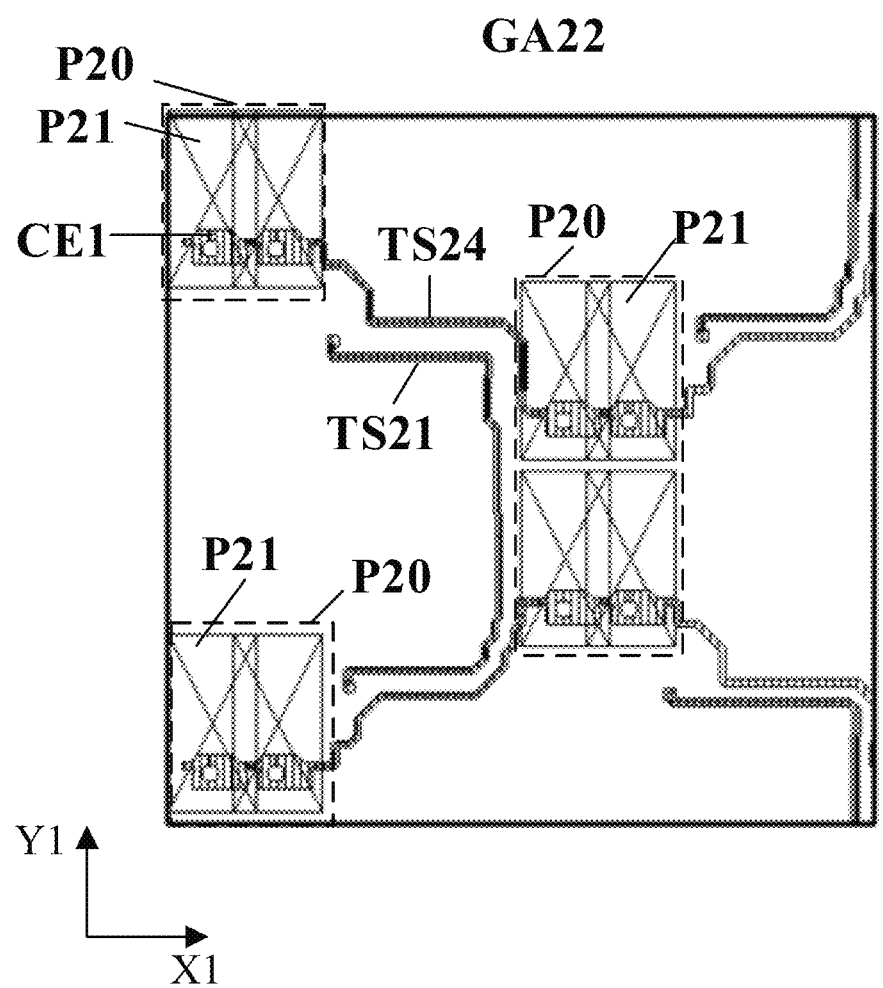
Figure 13C:
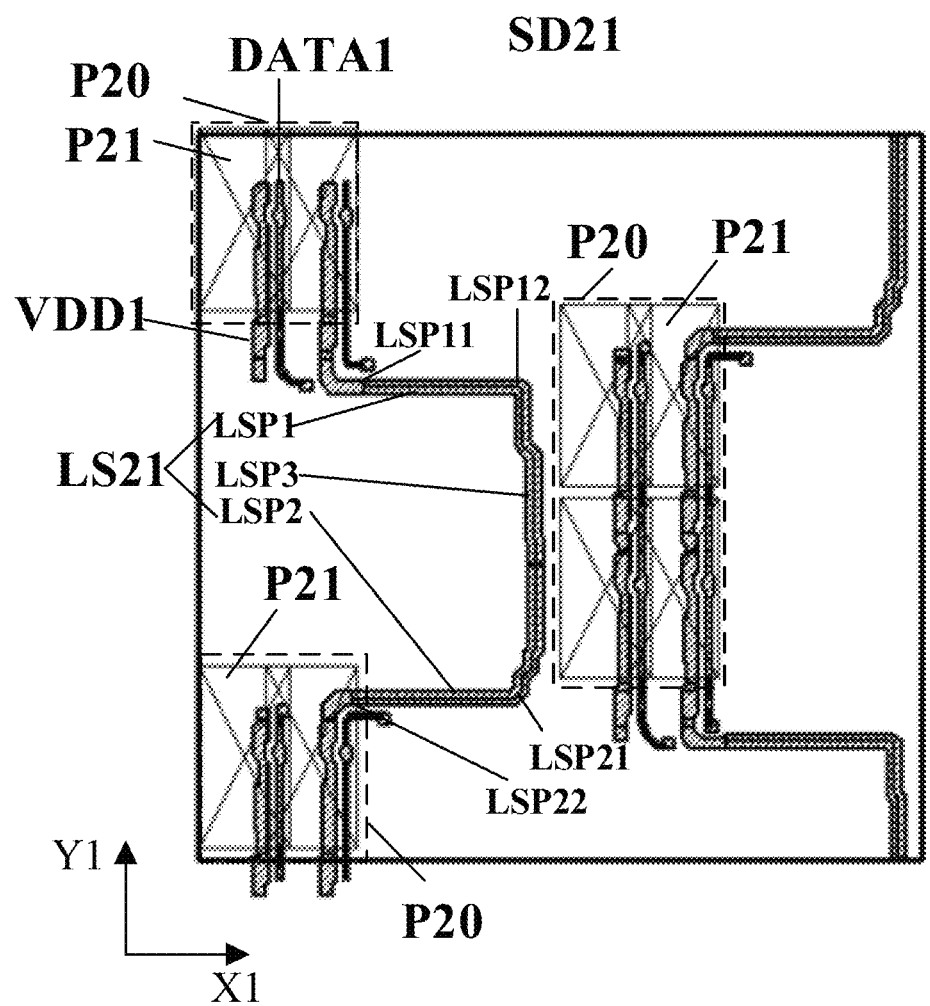

In another embodiment of the present disclosure, for example, FIG. 10 is a schematic planar layout diagram of wirings in a first display area of a display substrate provided by at least another embodiment of the present disclosure. FIG. 11 is a schematic enlarged diagram of an A21 area in FIG. 10. FIGS. 13A to 13C are schematic planar diagrams of each layer of wirings in the first display area shown in FIG. 10. FIG. 13A is a schematic plan view of wirings on a first conductive layer GA21 in the first display area shown in FIG. 10. FIG. 13B is a schematic plan view of wiring lines on a second conductive layer GA22 in the first display area shown in FIG. 10. FIG. 13C is a schematic plan view of wirings on a third conductive layer SD21 in the first display area shown in FIG. 10.

For example, as shown in FIG. 10 and FIG. 13C, the first display area 10 include a plurality of first pixel unit groups P20, a plurality of first signal lines DATA1, and a plurality of first power lines VDD1. The plurality of first pixel unit groups P20 are arranged in staggered rows and columns, that is, according to the arrangement shown in FIG. 1B, that is, the first pixel unit groups P20 in the first column and the first pixel unit groups P20 in the second column are staggered from each other. Each first pixel unit group P20 includes four first pixel units P21 arranged in two rows and two columns along the second direction X1 and the first direction Y1. The plurality of first signal lines DATA1 and the plurality of first power lines VDD1 extend along the first direction Y1. Each of the plurality of first signal lines DATA1 corresponds to and is electrically connected with the first pixel units P21 of the plurality of first pixel unit groups P20, respectively. Each of the plurality of first power lines VDD1 corresponds to and is electrically connected with a corresponding one of the first pixel units P21 of the plurality of first pixel unit groups P20, respectively. That is, each of the first pixel units P21 is connected with one of the first signal lines DATA1 and one of the first power lines VDD1. The first signal line DATA1 is configured to provide first display signal to the first pixel units P21. The first power lines VDD1 are configured to provide first power supply voltages for the plurality of first pixel units P21, respectively.

For example, in the same first pixel unit group P20 (for example, the first pixel unit group P20 on the right side in FIG. 13C), the first signal lines DATA1 connected with the first pixel units P21 in the same column are connected with each other and integrally formed, and the first power lines VDD1 connected with the first pixel units P21 in the same column are also connected with each other and integrally formed. It is to be noted that the two first pixel unit groups P20 on the left side in FIG. 13C only show two of the first pixel units P21. The complete structure of the two first pixel unit groups P20 on the left side is the same as that of the first pixel unit group P20 on the right side in FIG. 13C.

For example, as shown in FIG. 13C, the first power line VDD1 and the first signal line DATA1 located in the same first pixel unit P21 are arranged in parallel. The lower part (the part for connecting a transfer electrode) of the first signal line DATA1 on the left side in the same first pixel unit group P20 is bent toward the first power line VDD1 (for connecting with the connection line) on the right side. The lower part (the part for connecting the transfer electrode) of the first signal line DATA1 on the right side in the same first pixel unit group P20 is bent away from the first power line VDD1 (for connecting with the connection line) on the right side. The lower part (the part for connecting the wiring line) of the first power line VDD1 on the right side in the same first pixel unit group P20 is bent toward the right side (the same as the bending direction of the lower part of the first signal line DATA1 on the right side in the same first pixel unit group P20). In FIG. 13C, the upper part (the part for the transfer electrode) of the first signal line DATA1 on the right side in the same first pixel unit group P20 is bent toward the right side.

For example, the display substrate 1 further includes at least one connection line, at least part of the at least one connection line extends along the first direction and is connected with the first power lines respectively connected to the adjacent first pixel unit groups in the first direction. As shown in FIG. 10, FIG. 11 and FIG. 13C, the display substrate 1 further includes a plurality of connection lines (such as a plurality of first connection lines LS21), each of which includes a part extending along the first direction Y1 and a part extending along the second direction X1, and each of the connection lines is connected with the first power lines VDD1 respectively connected with the adjacent first pixel unit groups P20 in the first direction Y1. That is, the first power lines VDD1 in the two corresponding first pixel units P21 of the adjacent first pixel unit groups P20 in the first direction Y1 are connected to the connection line (for example, the first connection line LS21). For example, the first power lines VDD1 connected to the first pixel unit groups P20 adjacent to each other along the first direction Y1 are connected through a connection line (for example, the first connection line LS21). That is, the first power line VDD1 in one of the two first pixel units P21 of the first pixel unit group P20 is connected with the connection line (for example, the first connection line LS21) to reduce the number of the wiring lines, and increase the aperture ratio and light transmittance of the first display area 10.

For example, the display substrate 1 further includes at least one transfer electrode, and at least a part of the transfer electrode extends along the first direction and is connected with the first signal lines respectively connected with the adjacent first pixel unit groups in the first direction. As shown in FIGS. 10 and 11, the display substrate 1 further includes a plurality of transfer electrodes. For example, the transfer electrodes include a first transfer electrode TS21 and a second transfer electrode TS22. The main part of each of the plurality of transfer electrodes (for example, most of the transfer electrodes) extends along the first direction Y1 and is respectively connected with the first signal lines DATA1 connected to the adjacent first pixel unit groups P20 in the first direction Y1. That is, the first signal lines DATA1 in the two corresponding first pixel units p21 of the adjacent first pixel unit groups P20 in the first direction Y1 are connected to one of the plurality of transfer electrodes (the first transfer electrode TS21 or the second transfer electrode TS22). For example, the first signal lines DATA1 connected to two adjacent first pixel units P21 in the first direction Y1 are connected through a transfer electrode (the first transfer electrode TS21 or the second transfer electrode TS22). The plurality of transfer electrodes are connected one by one to a plurality of first pixel units P21 adjacent in the first direction Y1 and belonging to different first pixel unit groups P20. That is, the first signal line DATA1 in one of the two first pixel units P21 located in the same row of each of the first pixel unit groups P20 (for example, the one located near the left side of the first pixel unit groups P20) is connected to a transfer electrode (for example, the first transfer electrode TS21). The first signal line DATA1 in the other one of the two first pixel units P21 located in the same row of the first pixel unit groups P20 (for example, the one located near the right side of the first pixel unit groups P20) is connected with a transfer electrode (for example, the second transfer electrode TS22).

For example, a plurality of connection lines (such as the first connection line LS21) are located on a side of the plurality of transfer electrodes (for example, the first transfer electrode TS21 or the second transfer electrode TS22) away from the base substrate. As shown in FIG. 11, an orthographic projection of one of the connection lines (for example, the first connection line LS21) on the base substrate 100 overlaps with orthographic projections of the transfer electrodes (for example, the first transfer electrode TS21 and the second transfer electrode TS22) on the base substrate 100, for example, orthographic projections of the transfer electrodes (for example, the first transfer electrode TS21 and the second transfer electrode TS22) on the base substrate 100 overlap with an orthographic projection of the connection line (for example, the first connection line LS21) on the base substrate 100. For example, orthographic projections of the parts of the transfer electrodes (for example, the first transfer electrode TS21 and the second transfer electrode TS22) extending along the first direction Y1 on the base substrate 100 fall in the orthographic projection of the connection line (such as the first connection line LS21) on the base substrate, so that the connection line overlaps with the transfer electrodes and shields the transfer electrodes, so as to reduce the wiring space of the transfer electrodes and improve the aperture ratio and light transmittance of the first display area. It is also possible to reduce the occurrence of light interference between different wiring lines, thereby allowing, for example, a sensor to be set in the first display area and on the second side S2 of the display substrate 1 for sensing (for example, imaging), and improving the sensing effect (imaging quality) of the sensor.

For example, as shown in FIGS. 10 and 13C, a gap allowing light transmission is provided between adjacent first pixel unit groups P20 in the first direction Y1 and the second direction X1. The part of the connection line (for example, the first connection line LS21) and the part of the transfer electrode (for example, the first transfer electrode TS21 and the second transfer electrode TS22) extend along the second direction X1 and bypasses the gap allowing light transmission. As shown in FIG. 10, the connection line (for example, the first connection line LS21) and the transfer electrode (for example, the first transfer electrode TS21 and the second transfer electrode TS22) first extend toward the direction close to the right first pixel unit group P20 along the second direction X1, then extend in the first direction Y1, and then extend away from the right first pixel unit group P20, thus, the connection line (for example, the first connection line LS21) and the transfer electrode (for example, the first transfer electrode TS21 and the second transfer electrode TS22) are connected to two adjacent first pixel unit groups P20 in the first direction Y1. That is, the connection line (for example, the first connection line LS21) and the transfer electrode (for example, the first transfer electrode TS21 and the second transfer electrode TS22) are "three-segment bending line" to leave a large gap between the first pixel unit groups P20, so as to prevent light interference.

For example, at least one connection line includes a first connection line. As shown in FIG. 13C, the first connection line LS21 is a bending line and includes a first part LSP1, a second part LSP2, and a third part LSP3. The first part LSP1 and the second part LSP2 extend along the second direction X1, and the third part LSP3 extends along the first direction Y1. The first end LSP11 of the first part LSP1 and the first end LSP21 of the second part LSP2 are respectively connected with two ends of the third part LSP3, so that the first connection line LS21 is designed as a three-segment bending line. The second end LSP12 of the first part LSP1 and the second end LSP22 of the second part LSP2 are respectively connected with the first power line VDD1 connected to the adjacent first pixel units P21 in the first direction Y1. That is, the first connection line LS21 is connected to the first power line VDD1 connected to the first pixel units P21 which are adjacent to the first direction Y1 and respectively belonging to different first pixel unit groups P20. As shown in the figure, a gap is provided between the adjacent first pixel unit groups P20 in the first direction Y1 to allow light from the first side S1 of the display substrate 1 to pass through. One of the two first pixel units P21 of the adjacent first pixel unit groups P20 in the first direction Y1 (for example, the one of the pixel units P31 in the middle) is connected with the first connection line LS21 to reduce the number of wiring lines and increase the aperture ratio and light transmittance of the first display area 10.

Figure 12:
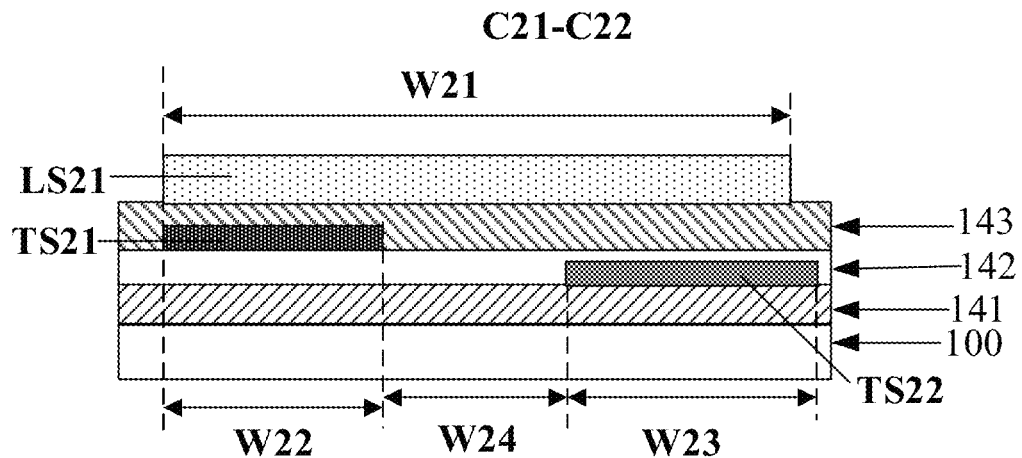
FIG. 12 is a schematic cross-sectional diagram along a line C21-C22 in FIG. 11.

For example, the first connection line is arranged in the same layer as the first power line and integrally formed. FIG. 12 is a schematic cross-sectional diagram along a line C21-C22 in FIG. 11. The line C11-C12 passes through the first transfer electrode TS21, the first connection line LS21, and the second transfer electrode TS22 along the second direction Y1. As shown in FIG. 12, the first connection line LS21 is located on the side of the third insulating layer 143 away from the substrate 100, and the first power line VDD1 is arranged in the same layer as the first connection line LS21 and formed integrally by the same patterning process. For example, as shown in FIG. 13C, the first connection line LS21 and the first power line VDD1 are located in the third conductive layer SD21.

For example, as shown in FIG. 11, FIG. 13A, and FIG. 13B, the plurality of transfer electrodes include a first transfer electrode TS21 and a second transfer electrode TS12. A shape of the first transfer electrode TS21 and a shape of the second transfer electrode TS22 are the same as that of the first connection line LS21, that is, a bending line formed by the three-segment wiring line. The first transfer electrode TS21 and the second transfer electrode TS12 are arranged in parallel, and first extend along the second direction X1 toward the direction close to the right first pixel unit group P20, then extend along the first direction Y1, and then extend away from the right first pixel unit group P20, so as to leave a large gap between the first pixel unit groups P20, so as to prevent light interference.

For example, the orthographic projection of the first transfer electrode on the base substrate and the orthographic projection of the second transfer electrode on the base substrate overlap with the orthographic projection of at least one of the first part, the second part and the third part of the first connection line on the base substrate. As shown in FIG. 11 and FIG. 12, the orthographic projections of the first transfer electrode TS21 and the second transfer electrode TS22 on the base substrate overlap with all of the orthographic projections of the first part LSP1, the second part LSP2, and the third part LSP3 of the first connection line LS21 on the base substrate (for example, partially overlap). For example, the orthographic projection of the first transfer electrode TS21 on the base substrate 100 is located in the orthographic projections of the first part LSP1, the second part LSP2, and the third part LSP3 of the first connection line LS21 on the base substrate 100, that is, the first transfer electrode TS2 is completely shielded by the first connection line LS21. The orthographic projection of the second transfer electrode TS22 on the base substrate 100 is not completely located in the orthographic projection of the first part LSP1, the second part LSP2 and the third part LSP3 of the first connection line LS21 on the base substrate 100. The orthographic projection of the part of the second transfer electrode TS22 along the second direction X1 on the base substrate 100 overlaps with the orthographic projection of the first part LSP1 of the first connection line LS21 on the base substrate 100. For example, by increasing the width of the first connection line LS21, the first connection line LS21 can completely cover the part of the second transfer electrode TS22 along the second direction X1. In the above case, the space occupied by the first transfer electrode TS11 and the second transfer electrode TS12 can be reduced, the aperture ratio and light transmittance of the first display area can be improved, and the occurrence of light interference between different routes can be reduced.

For example, as shown in FIGS. 13A and 13B, the first transfer electrode TS21 and the second transfer electrode TS22 are connected with the first signal line DATA1 respectively connected to the first pixel units P21 adjacent to the first direction Y1 and belonging to different first pixel unit groups P20. That is, the two first pixel units P21 belong to the same first pixel unit group P20 located in two columns are respectively connected with the first transfer electrode TS2 and the second transfer electrode TS22. The portions of the first transfer electrode TS11 and the second transfer electrode TS12 extending along the first direction Y1 are near the first pixel unit group P20 on the right side of the figure to reduce light interference.

For example, as shown in FIG. 13A, the second transfer electrode TS22 has a "concave" liked shape with an opening to the right side (away from the first connection line LS21) in the figure. As shown in FIG. 13B, the first transfer electrode TS21 is in a "concave" liked shape with an opening to the left side (away from the first connection line LS21) in the figure. The direction of the second transfer electrode TS22 is opposite to the direction of the second transfer electrode TS21, and both of them converge to the position of the first connection line LS21 to overlap with the first connection line LS21.

For example, relative to the base substrate, the film layers where the plurality of transfer electrodes are located are different. As shown in FIG. 12, relative to the base substrate 100, the film layers where the first transfer electrode TS21 and the second transfer electrode TS22 are located are different. The first transfer electrode TS21 is located between the second insulating layer 142 and the third insulating layer 143. For example, as shown in FIG. 13B, the first transfer electrode TS21 is located in the second conductive layer GA22. The second transfer electrode TS22 is located between the first insulating layer 141 and the second insulating layer 142. For example, as shown in FIG. 13A, the second transfer electrode TS22 is located in the first conductive layer GA21. The second insulating layer 142 separates and insulates the first transfer electrode TS21 from the second transfer electrode TS22. The first transfer electrode TS21 and the second transfer electrode TS22 are located in different film layers, which can reduce the size of the spacing between the first transfer electrode TS21 and the second transfer electrode TS22, so as to reduce the space occupied by the first transfer electrode TS21 and the second transfer electrode TS22.

For example, as shown in FIG. 12, a value range of a width W21 of the section of the first connection line LS21 along the second direction X1 is, for example, about 4.5 to 5.5 microns, and the value of the width W21 is, for example, about 5 microns. The value range of a width W22 of the section of the first transfer electrode TS21 along the second direction Y1 is, for example, about 2 to 3 microns, and the value of the width W22 is, for example, about 2.5 microns. The value range of a width W23 of the section of the second transfer electrode TS22 along the second direction Y1 is, for example, about 2 to 3 microns, and the value of the width W23 is, for example, about 2.5 microns. The value range of the width W24 of the gap between the first transfer electrode TS21 and the second transfer electrode TS22 in the second direction Y1 is, for example, about 1 to 2 microns, and the value of the width W3 is, for example, about 0.8 microns.

For example, as shown in FIG. 11, the first signal line DATA1 (located at the left side in the figure) is connected with the first transfer electrode TS21 through the first via hole GH21. The first signal line DATA1 (located at the right side in the figure) is connected with the second transfer electrode TS22 through the second via hole TS22. Referring to FIGS. 3A, 4B, and 4C, the first via hole GH21 and the first via hole GH1 are via holes passing through the third insulating layer 143, and the second via hole GH22 and the second via hole GH2 are the via holes passing through the third insulating layer 143 and the second insulating layer 142.

For example, as shown in FIGS. 10 and 21, the four first pixel units P20 of the first pixel unit group P20 are arranged in two rows and two columns, that is, in the same row, the first pixel unit group P10 includes two first pixel units P20. Each of the first pixel units P21 of the first pixel unit groups P20 includes a first pixel driving circuit 12 and a first light-emitting device 11. The first pixel driving circuit 12 is electrically connected with the first light-emitting device 11 and drives the first light-emitting device 11 to emit light. The first pixel driving circuit 12 includes a storage capacitor 13, which includes a first electrode plate CE1 and a second electrode plate CE2 overlapped (for example, partially overlapped) with the first electrode plate CE1. The first electrode plate CE1 is located at the side of the second insulating layer 142 away from the base substrate 100. The second electrode plate CE2 is located on the side of the first insulating layer 141 away from the base substrate 100. For example, as shown in FIG. 13B, the first electrode plate CE1 is located in the second conductive layer GA22.

For example, as shown in FIGS. 10 and 20A, the plurality of first power lines VDD1 connected one-to-one corresponding to each of the first pixel units P20 are connected to the first electrode plate CE1 through the via holes VH9 and VH3 both penetrating the third insulating layer 143. The first power line VDD1 can also be connected to the first electrode plate CE1 through one of the via hole VH9 and the via hole VH3.

For example, as shown in FIG. 10 and FIG. 13B, the first electrode plates CE1 of the two first pixel units P11 located in the same row of each first pixel unit group P20 are connected with each other and integrally formed, so as to save the preparation process and reduce the cost. That is, the first power line VDD1 in each of the first pixel units P21 is electrically connected with the first electrode plate CE1 of the storage capacitor 13 of the corresponding first pixel unit P11 so as to electrically connect with the first pixel unit P21. The first power lines VDD1 in the two first pixel units P21 are electrically connected by connecting the first electrode plates CE1 of the two first pixel units P11 located in the same row of the first pixel unit group P20. The first power lines VDD1 located in different rows are correspondingly connected with each other and integrally formed. As mentioned above, when the first power lines VDD1 in the two first pixel units P21 belonging to the same row of a first pixel unit group P20 are electrically connected, the first power lines VDD1 in one of the two first pixel units P21 can be connected by providing a first connection line LS21 to reduce the number of the wiring lines.

For example, as shown in FIG. 10 and FIG. 13B, the display substrate 1 further includes a fourth transfer electrode TS24, which extends along the second direction X1. The fourth transfer electrode TS24 is electrically connected to the first power lines VDD1 connected to the first pixel units P21 which belong to different first pixel unit groups P20 and are arranged adjacently along the second direction X1. As shown in FIG. 10, a plurality of first pixel unit groups P20 (three first pixel unit groups P20 are shown in FIG. 6) are arranged in the form shown in FIG. 1B. That is, the plurality of first pixel unit groups P10 in two adjacent columns are located in different rows to leave more gaps between the first pixel unit groups P20, thereby allowing light from the first side S1 of the display substrate 1 to pass through.

For example, as shown in FIG. 10 and FIG. 13B, both ends of the fourth transfer electrode ts24 are respectively connected with the first plates CE1 of two adjacent first pixel units p21 belonging to different first pixel unit groups P20 to electrically connect the first power lines VDD1 located in different first pixel units p21. Because the two first pixel units P21 arranged adjacent and belonging to different first pixel unit groups P20 are located in different rows along the second direction X1, the fourth transfer electrode TS24 includes a portion extending along the first direction Y1.

For example, as shown in FIG. 13B, the fourth transfer electrode TS24 is located in the second conductive layer GA22 and is connected with the first electrode CE1 of the first pixel unit P21, and can be integrally formed.

For example, as shown in FIG. 13B, when the four first pixel units P20 of each first pixel unit group P20 are arranged in two rows and two columns, the first pixel unit P21 in the first row and the first pixel unit P21 in the second row of the first pixel unit group P20 are connected with different fourth transfer electrodes TS24. For example, for the first pixel unit group P20 on the right side in FIG. 13B (as shown in the figure, four first pixel units P21 are shown), the first electrode plate CE1 of the first pixel unit P21 in the first column of the first row (i.e., the left side) of the first pixel unit group P20 is connected with the fourth transfer electrode TS24 at the upper left, the fourth transfer electrode TS24 at the upper left is also connected with the first electrode plate CE1 of the first pixel unit P21 in the second column of the second row (i.e., the right side) of the first pixel unit group P20 at the upper left. The first electrode plate CE1 of the first pixel unit P21 in the second column of the first row (i.e., the right side) of the first pixel unit group P20 is connected with the fourth transfer electrode TS24 in the upper right, and the fourth transfer electrode TS24 in the upper right is also connected with the first electrode plate CE1 (not shown) of the first pixel unit P21 in the first column of the second row (i.e., the left side) of the first pixel unit group P20 in the upper right. The first electrode plate CE1 of the first pixel unit P21 in the first column of the second row (i.e., the left side) of the first pixel unit group P20 is connected with the fourth transfer electrode TS24 at the lower left, and the fourth transfer electrode TS24 at the lower left is also connected with the first electrode plate CE1 of the first pixel unit P21 in the second column of the first row (i.e., the right side) of the first pixel unit group P20 at the lower left. The first electrode plate CE1 of the first pixel unit P21 in the second column of the second row (i.e., the right side) of the first pixel unit group P20 is connected with the fourth transfer electrode TS24 at the lower right, and the fourth transfer electrode TS24 at the upper right is also connected with the first electrode plate CE1 (not shown) of the first pixel unit P21 in the first column of the first row (i.e., the left side) of the first pixel unit group P20 at the lower right.

For example, as shown in FIG. 11, a value range of a width W25 of the fourth transfer electrode TS24 (for example, the width in a direction perpendicular to the wiring direction of the fourth transfer electrode TS24) is about 2 to 3 microns, for example, and the value of the width W15 is about 2.5 microns, for example.

Figure 13D:
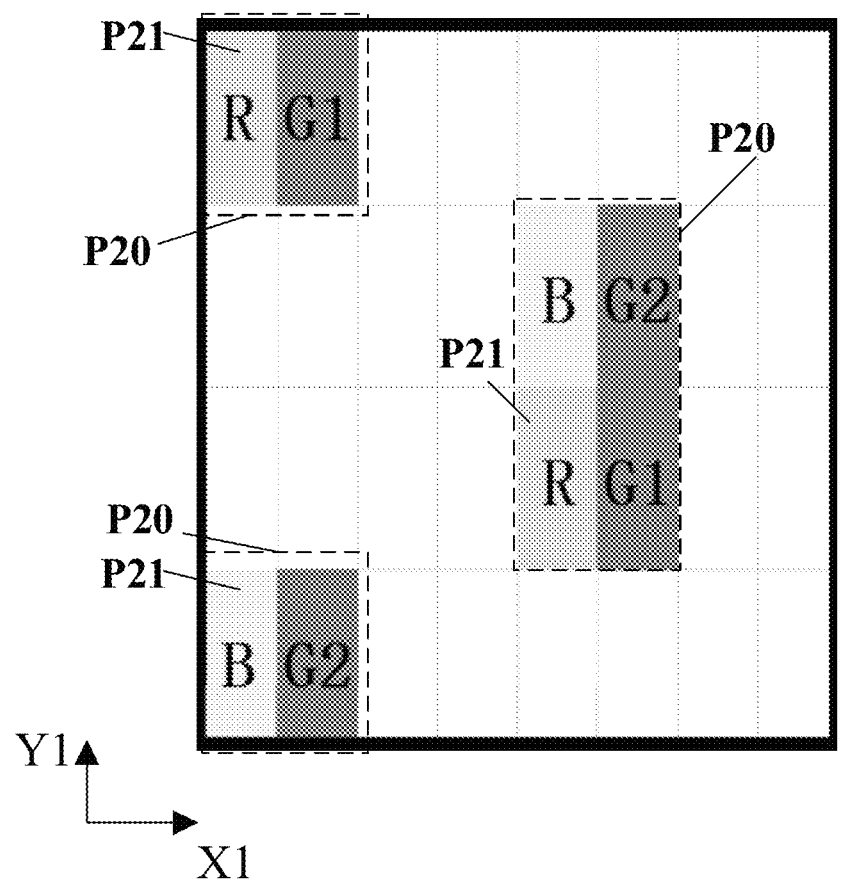
FIG. 13D is a schematic diagram of an arrangement of sub-pixels in the first display area shown in FIG. 10.

For example, FIG. 13D is a schematic diagram of an arrangement of sub-pixels in the first display area shown in FIG. 10. As shown in FIG. 13D, the four first pixel units P21 arranged in two rows and two columns of each first pixel unit group P20 may include red sub-pixels (R), blue sub-pixels (B), green sub-pixels (G1), and green sub-pixels (G2) (that is, two green sub-pixels). That is, in a first pixel unit group P20 (for example, the four first pixel units P21 on the right side of the figure), the two first pixel units P21 in the first row include a blue sub-pixel (B) and a green sub-pixel (G2), and the two first pixel units P21 in the second row include a red sub-pixel (R) and a green sub-pixel (G1). That is, in a first pixel unit group P20 (For example, the four first pixel units P21 on the right side of the figure), the light-emitting device 11 of the first pixel unit P21 in the first column of the first row (i.e., the upper left corner) emits blue light, the light-emitting device 11 of the first pixel unit P21 in the second column of the first row (i.e., the upper right corner) emits green light, and the light-emitting device 11 of the first pixel unit P21 in the first column of the second row (i.e., the lower left corner) emits red light, the light emitting device 11 of the first pixel unit P21 in the second column of the second row (i.e., the lower right corner) emits green light to realize the image display. The luminous colors of the first pixel units P21 of the first pixel unit group P20 can be selected according to the actual display needs, and the embodiments of the present disclosure is not limited thereto.

Figure 14:
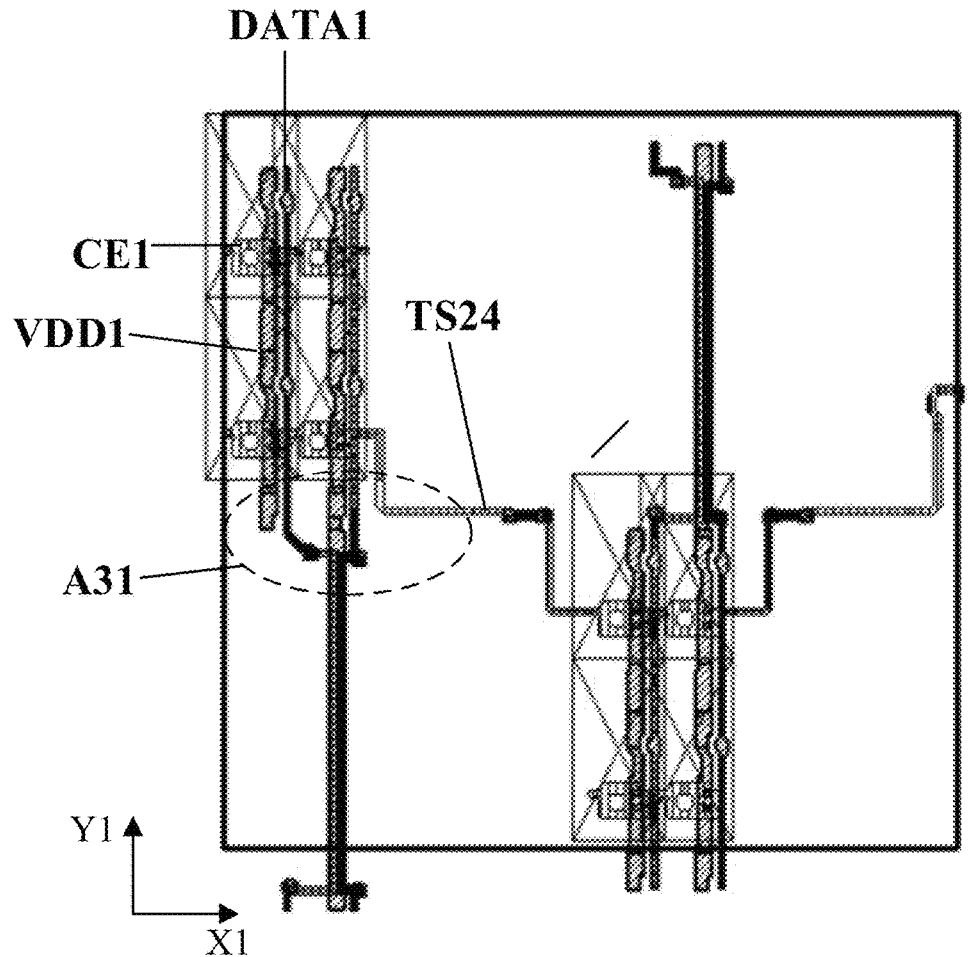
FIG. 14 is a schematic planar layout diagram of wiring lines in a first display area of a display substrate provided by at least another embodiment of the present disclosure.
Figure 15:
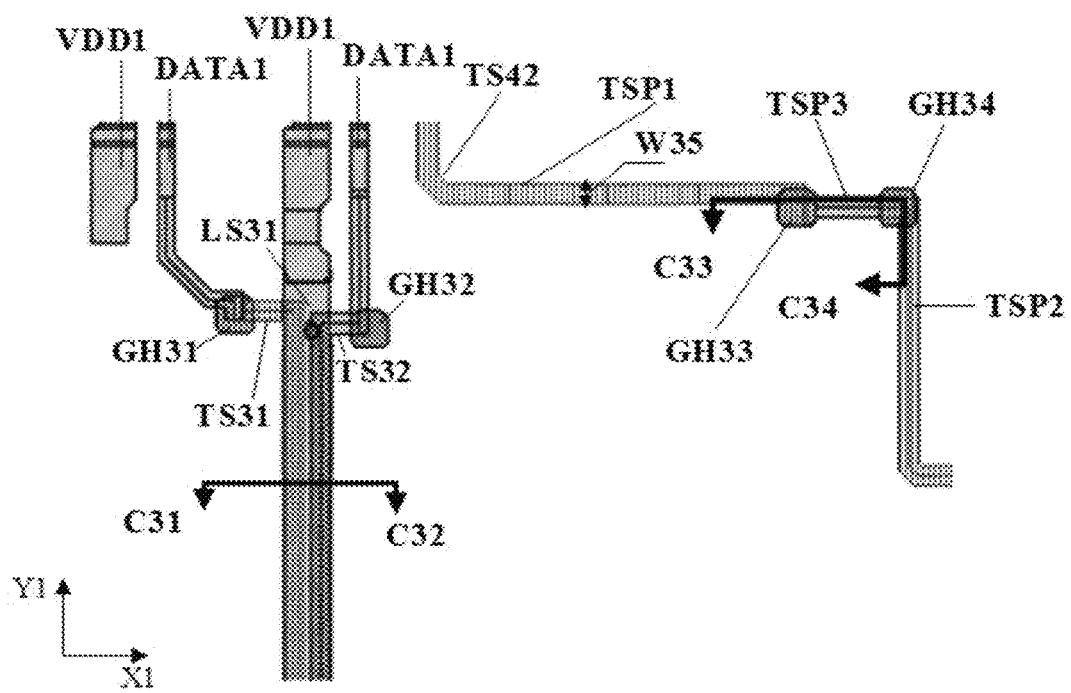
FIG. 15 is an enlarged diagram of an A31 area in FIG. 14.
Figure 17A:
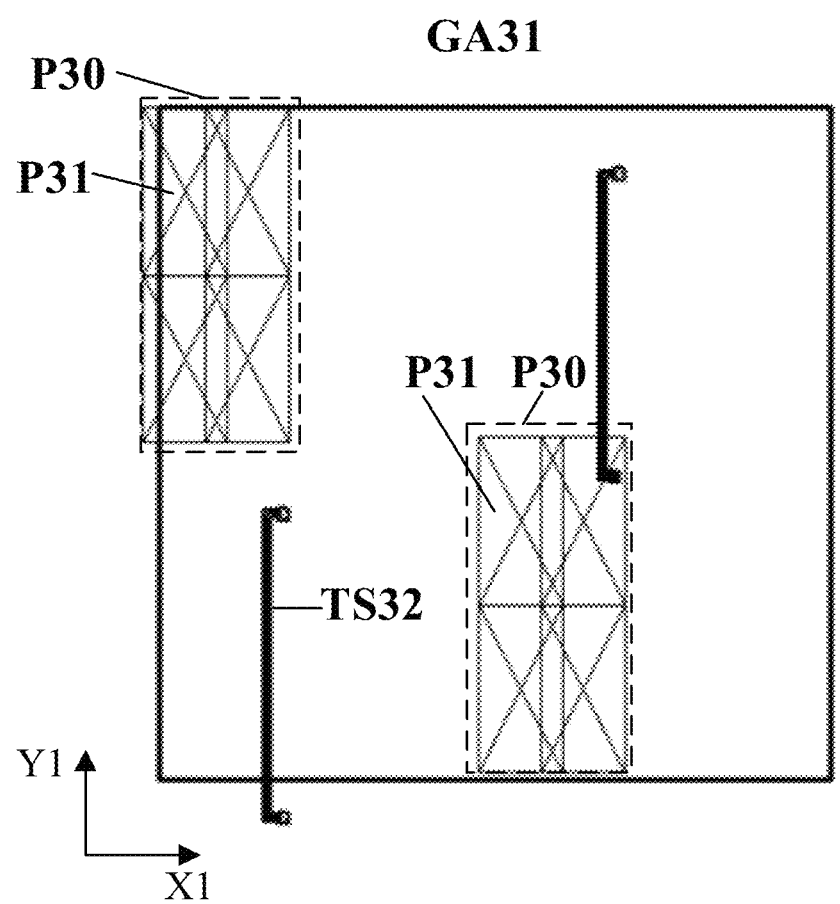
FIGS. 17A to 17C are schematic planar diagrams of each layer of wiring lines in the first display area shown in FIG. 14.
Figure 17B:
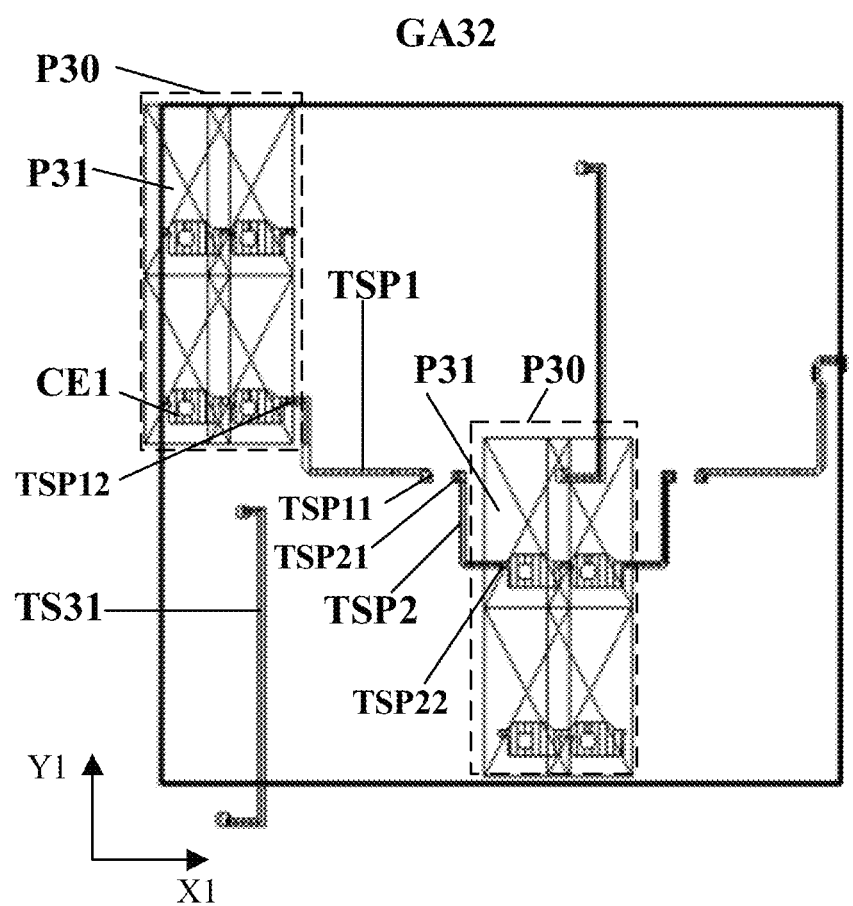
Figure 17C:
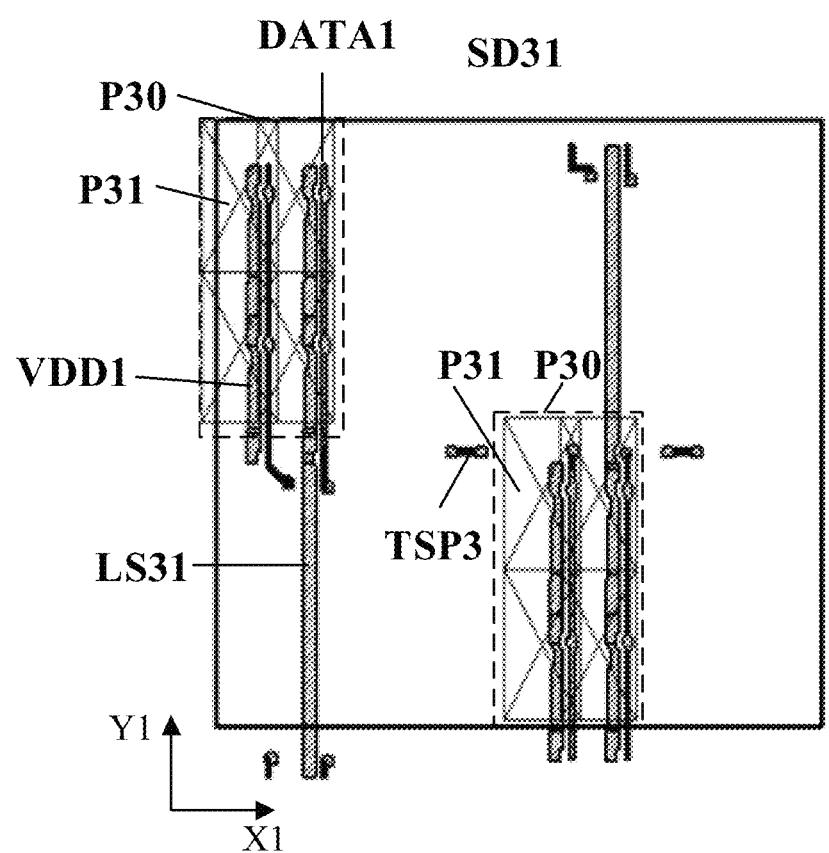

In another embodiment of the present disclosure, for example, FIG. 14 is a schematic planar layout diagram of wiring lines in a first display area of a display substrate provided by at least another embodiment of the present disclosure. FIG. 15 is a schematic enlarged diagram of an A31 area in FIG. 14. FIGS. 17A to 17C are schematic planar diagrams of each layer of wiring lines in the first display area shown in FIG. 14. FIG. 17A is a schematic plan view of the first conductive layer GA31 in the first display area shown in FIG. 14. FIG. 17B is a schematic plan view of wiring lines in the second conductive layer GA32 in the first display area shown in FIG. 14. FIG. 17C is a schematic plan view of wiring lines in the third conductive layer SD31 in the first display area shown in FIG. 14.

For example, as shown in FIGS. 14 and 17C, the first display area 10 includes a plurality of first pixel unit groups P30, a plurality of first signal lines DATA1, and a plurality of first power lines VDD1. The plurality of first pixel unit groups P30 are arranged in staggered rows and columns, that is, according to the arrangement mode shown in FIG. 1B, that is, the first pixel unit groups P30 of the first column and the first pixel unit groups P30 of the second column are staggered from each other (for example, they are located in two adjacent rows). Each first pixel unit group P30 includes four first pixel units P31 arranged in two rows and two columns along the second direction X1 and the first direction Y1. The plurality of first signal lines DATA1 and the plurality of first power lines VDD1 extend along the first direction Y1. Each of the plurality of first signal lines DATA1 corresponds to and is electrically connected with a corresponding first pixel unit P31 of the plurality of first pixel unit groups P30. Each of the plurality of first power lines VDD1 corresponds to and is electrically connected with the corresponding first pixel unit P31 of the plurality of first pixel unit groups P30. That is, each of the first pixel units P31 is connected with one first signal line DATA1 and one first power line VDD1. The first signal line DATA1 is configured to provide first display signals to the first pixel unit P31. The first power line VDD1 is configured to provide first power supply voltages to the plurality of first pixel units P31.

For example, in the same first pixel unit group P30, the first signal lines DATA1 connected with the first pixel units P31 in the same column are connected with each other and integrally formed, and the first power lines VDD1 connected with the first pixel units P31 in the same column are also connected with each other and integrally formed. It is to be noted that only two first pixel unit groups P30 are shown in FIG. 14.

For example, as shown in FIG. 17C, the first power line VDD1 and the first first signal line DATA1 located in a same first pixel unit P31 are arranged in parallel. The lower part of the first signal line DATA1 at the left side in the same first pixel unit group P30 (the part for connecting the transfer electrode) is bent toward the right (for example, bent to close to the first power line VDD1 connected to the connection line).

For example, the display substrate 1 further includes at least one connection line, at least part of the at least one connection line extends along the first direction and is connected with the first power lines respectively connected to the adjacent first pixel unit groups in the first direction. As shown in FIG. 14, FIG. 15, and FIG. 17C, the display substrate 1 further includes a plurality of connection lines (such as a plurality of first connection lines LS31), each of the connection lines extends along the first direction Y1 and is connected with the first power lines VDD1 respectively connected to the adjacent first pixel unit groups P30 in the first direction Y1. That is, the first power lines VDD1 in the two corresponding first pixel units P31 of the adjacent first pixel unit groups P30 in the first direction Y1 are connected to the connection line (for example, the first connection line LS31). For example, the first power lines VDD1 connected to the adjacent first pixel unit groups P30 in the first direction Y1 is connected through a connection line (for example, the first connection line LS31). That is, the first power line VDD1 in one of the two first pixel units P31 of the first pixel unit groups P30 is connected with the connection line (for example, the first connection line LS31) to reduce the number of wiring lines and increase the aperture ratio and light transmittance of the first display area 10.

For example, the display substrate 1 further includes at least one transfer electrode, and at least part of the transfer electrode extends along the first direction and is connected with the first signal lines respectively connected with the adjacent first pixel unit groups in the first direction. As shown in FIGS. 14 and 15, the display substrate 1 further includes a plurality of transfer electrodes. For example, the transfer electrodes include a first transfer electrode TS31 and a second transfer electrode TS32. The main part of each of the plurality of transfer electrodes (that is, most part of the transfer electrodes) extends along the first direction Y1 and is respectively connected with the first signal lines DATA1 connected to the adjacent first pixel unit groups P30 in the first direction Y1. That is, the first signal lines DATA1 in two corresponding first pixel units P31 of the adjacent first pixel unit groups P30 in the first direction Y1 are connected to one of the plurality of transfer electrodes (the first transfer electrode TS31 or the second transfer electrode TS32). For example, the first signal lines DATA1 connected to the two adjacent first pixel units P31 in the first direction Y1 are connected through a transfer electrode (the first transfer electrode TS31 or the second transfer electrode TS32). The plurality of transfer electrodes are connected one by one to a plurality of first pixel units P31 adjacent in the first direction Y1 and belonging to different first pixel unit groups P30. That is, the first signal line DATA1 in one of the two first pixel units P31 located in the same row of the first pixel unit groups P30 (for example, the one located near the left side of one of the pixel units P30) is connected to a transfer electrode (for example, the first transfer electrode TS31). The first signal line DATA1 in the other one of the two first pixel units P31 located in the same row of the first pixel unit groups P30 (for example, the one located near the right side of one of the pixel units P30) is connected to a transfer electrode (for example, the second transfer electrode TS32).

For example, as shown in FIG. 14 and FIG. 15, the plurality of connection lines (such as the first connection line LS31) are located on a side of the plurality of transfer electrodes (such as the first transfer electrode TS31 or the second transfer electrode TS32) away from the base substrate. As shown in FIG. 15, the orthographic projection of the connection lines (such as the first connection line LS31) on the base substrate 100 overlaps with the orthographic projection of the transfer electrodes (such as the first transfer electrode TS31 and the second transfer electrode TS32) on the base substrate 100. For example, the orthographic projection of the transfer electrode (such as the first transfer electrode TS31 and the second transfer electrode TS32) on the base substrate 100 overlaps with the orthographic projection of the connection lines (such as the first connection line LS31) on the base substrate 100. For example, the orthographic projection of the part of the transfer electrode (such as the first transfer electrode TS31 and the second transfer electrode TS32) extending along the first direction Y1 on the base substrate 100 falls in the orthographic projection of the connection line (such as the first connection line LS31) on the base substrate 100, so that the connection line overlaps with the transfer electrodes and shields the transfer electrodes, the wiring space of the transfer electrodes is reduced and the aperture ratio and light transmittance of the first display area is improved, and the occurrence of light interference between different wiring lines can be reduced, thereby allowing, for example, a sensor to be arranged in the first display area and on the second side S2 of the display substrate 1 for sensing (for example, imaging), and the sensing effect (imaging quality) of the sensor is improved.

For example, the at least one connection line includes a first connection line. As shown in FIG. 17C, the first connection lines LS31 are respectively connected with the first power lines VDD1 respectively connected with the adjacent first pixel units P31 (that is, the first pixel units P31 located in the second column (that is, the right side) of the adjacent first pixel unit groups P30 in the first direction Y1) in the first direction Y1. That is, the first connection line LS31 is connected with the first power lines VDD1 respectively connected with the first pixel units P31 that are adjacent in the first direction Y1 and belong to different first pixel unit groups P30. As shown in the figure, gaps are provided between adjacent first pixel unit groups P30 in the first direction Y1, to allow light from the first side S1 of the display substrate 1 to pass therethrough. One (for example, the one pixel unit P31 in the middle) of the two first pixel units P31 of the adjacent first pixel unit groups P30 in the first direction Y1 is connected with the first connection line LS31, so that the number of wiring lines is reduced, and the aperture ratio and light transmittance of the first display area 10 are increased.

Figure 16A:
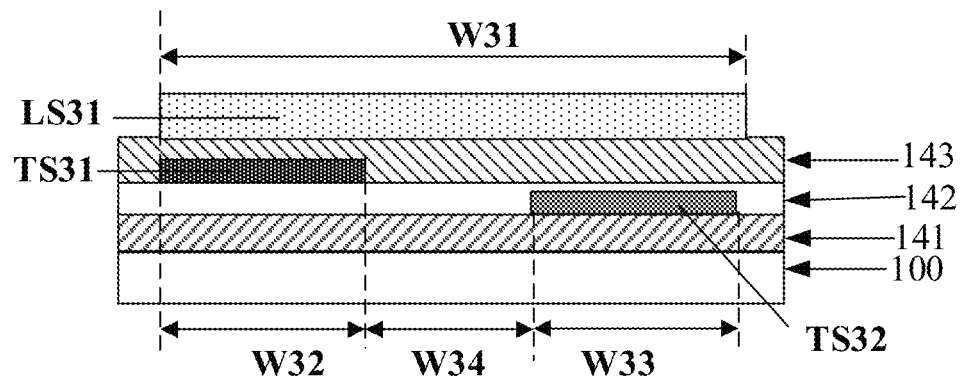
FIG. 16A is a schematic cross-sectional diagram along a line C31-C32 in FIG. 15.

For example, the first connection line and the first power line are arranged in a same layer and are formed integrally. FIG. 16A is a schematic cross-sectional diagram along a line C31-C32 in FIG. 15. The line C31-C32 passes through the first transfer electrode TS31, the first connection line LS31, and the second transfer electrode TS32 along the second direction X1. As shown in FIG. 16A, the first connection line LS31 is located on a side of the third insulating layer 143 away from the base substrate 100, the first power line VDD1 and the first connection line LS21 are arranged in a same layer and are formed integrally by a same patterning process. For example, as shown in FIG. 17C, the first connection line LS31 and the first power line VDD1 are located in the third conductive layer SD31. The first connection line LS31 and the first power line VDD1 connected with the first connection line LS31 are located in the first direction Y1.

For example, as shown in FIGS. 17A and 17B, the plurality of transfer electrodes include a first transfer electrode TS31 and a second transfer electrode TS32, The parts of the first transfer electrodes TS31 and the second transfer electrodes TS32 extending in the first direction YS are arranged in parallel. The first transfer electrodes TS31 and the second transfer electrodes TS32 are connected with the first signal lines DATA1 respectively connected with the first pixel units P31 that are adjacent in the first direction Y1 and belong to different first pixel unit groups P30. That is, the two first pixel units P31 located in the two columns and belonging to a same first pixel unit group P30 are respectively connected with the first transfer electrode TS31 and the second transfer electrode TS32. That is, the two first pixel units P31 of the first pixel unit groups P30 located in the two columns are respectively connected with the first transfer electrode TS31 and the second transfer electrode TS32. The first transfer electrode TS31 and the second transfer electrode TS32 first extend along the second direction X1 toward the first transfer electrode LS31, and then extend along the first direction Y1. The parts of the first transfer electrode TS31 and the second transfer electrode TS32 extending along the second direction X1 are shorter, and the main body parts of the first transfer electrodes TS31 and the second transfer electrodes TS32 extend along the first direction Y1.

For example, as shown in FIG. 17A, the second transfer electrode TS32 has a "concave" liked shape or "]" liked shape opening to the right side in the figure (away from the first connection line LS21). And as shown in FIG. 17B, the first transfer electrode TS31 has a "concave" liked shape or "[" liked shape opening to the left side in the figure (away from the first connection line LS21). The directions of the second transfer electrode TS32 and the second transfer electrodes TS31 are opposite, they are all converge to the position where the first connection lines LS31 are located, to be overlapped with the first connection line LS31.

For example, with respect to the base substrate, the film layers where the plurality of transfer electrodes are respectively located are different. As shown in FIG. 16A, with respect to the base substrate 100, the film layers where the first transfer electrode TS31 and the second transfer electrode TS32 are located are different. The first transfer electrode TS31 is located between the second insulating layer 142 and the third insulating layer 143. For example, as shown in FIG. 17B, the first transfer electrode TS31 is located in the second conductive layer GA32. The second transfer electrode TS32 is located between the first insulating layer 141 and the second insulating layer 142. For example, as shown in FIG. 17A, the second transfer electrode TS32 is located in the first conductive layer GA31. The second insulating layer 142 separates and insulates the first transfer electrode TS31 from the second transfer electrode TS32. The first transfer electrode TS31 and the second transfer electrode TS32 are located in different film layers, which can reduce the size of the spacing between the first transfer electrode TS31 and the second transfer electrode TS32, so that the space occupied by the first transfer electrode TS31 and the second transfer electrode TS32 is reduced.

For example, as shown in FIG. 16A, a value range of the width W31 of the cross section of the first connection line LS31 along the second direction X1 is, for example, from about 5 microns to about 6 microns, the value of the width W31 is, for example, about 5.5 microns. A value range of the width W32 of the cross section of the first transfer electrode TS31 along the second direction X1 is, for example, from about 2 microns to about 3 microns, the value of the width W32 is, for example, about 2.5 microns. A value range of the width W33 of the cross section of the second transfer electrode TS32 along the second direction X1 is, for example, from about 2 microns to about 3 microns, the value of the width W33 is, for example, about 2.5 microns. The value range of the width W34 of the gap between the first transfer electrode TS31 and the second transfer electrode TS32 along the second direction X1 is, for example, from about 0.2 microns to about 1.5 microns, the value of the width W34 is, for example, about 0.5 microns.

For example, as shown in FIG. 15, the first signal line DATA1 (located at the left side in the figure) is connected with the first transfer electrode TS31 through the first via hole GH31. The first signal line DATA1 (located at the right side in the figure) is connected with the second transfer electrode TS32 through the second via hole GH32. Referring to FIG. 3A, FIG. 4B, and FIG. 4C, the first via hole GH31 and the first via hole GH1 are both via holes penetrating the third insulating layer 143, the second via hole GH32 and the second via hole GH2 are both via holes passing through the third insulating layer 143 and the second insulating layer 142.

For example, as shown in FIG. 14 and FIG. 21, the four first pixel units P30 of the first pixel unit group P30 are arranged in two rows and two columns, that is, in a same row, each first pixel unit group P30 includes two first pixel units P30. Each first pixel unit P31 of the first pixel unit group P30 includes a first pixel driving circuit 12 and a first light emitting device 11, the first pixel driving circuit 12 is electrically connected with the first light-emitting device 11 and drives the first light emitting device 11 to emit light. The first pixel driving circuit 12 includes a storage capacitor 13, and the storage capacitor 13 includes a first electrode plate CE1 and a second electrode plate CE2 arranged to be overlapped with (e.g., partially overlapped with) the first electrode plate CE1. The first electrode plate CE1 is located on a side of the second insulating layer 142 away from the base substrate 100. The second electrode plate CE2 is located on a side of the first insulating layer 141 away from the base substrate 100. For example, as shown in FIG. 17B, the first electrode plate CE1 is located in the second conductive layer GA22.

For example, as shown in FIG. 14 and FIG. 20A, the plurality of first power lines VDD1 connected with each of the first pixel units P30 in a one-to-one correspondence are connected with the first electrode plates CE1 through the via holes VH9 and VH3 penetrating the third insulating layer 143. The first power lines VDD1 may also be connected with the first electrode plates CE1 through one of the via hole VH9 and the via hole VH3.

For example, as shown in FIG. 14 and FIG. 17B, the first electrode plates CE1 of the two first pixel units P31 located in the same row of each first pixel unit group P30 are connected with each other and are formed integrally, so that the manufacturing process is saved, and the cost is reduced. That is, the first power line VDD1 in each first pixel unit P31 is connected with the first electrode plate CE1 of the storage capacitor 13 of the corresponding first pixel unit P31, so as to be electrically connected with the first pixel unit P31, and the first power lines VDD1 in the two first pixel units P31 are electrically connected by connecting the first electrode plates CE1 of the two first pixel units P31 in the same row of the first pixel unit group P30 with each other. The first power lines VDD1 located in different rows are connected with each other correspondingly and are integrally formed. As described above, in a case that the first power lines VDD1 in the two first pixel units P31 belonging to the same row of one first pixel unit group P30 are electrically connected, the first power line VDD1 in one of the two first pixel units P31 can be connected by providing a first connection line LS31, to reduce the number of wiring lines.

For example, as shown in FIG. 10 and FIG. 13B, the display substrate 1 further includes a fourth transfer electrode TS34, and the fourth transfer electrode TS24 (e.g., most part of the fourth transfer electrode TS24) extends along the second direction X1. The fourth transfer electrode TS34 is electrically connected with the first power lines VDD1 respectively connected with the first pixel units P31 that are adjacently arranged in the second direction X1 and belong to different first pixel unit groups P30. As shown in FIG. 14, the plurality of first pixel unit groups P30 (two first pixel unit groups P30 are shown in FIG. 6) are arranged in the form shown in FIG. 1B. That is, the plurality of first pixel unit groups P30 in two adjacent columns are located in different rows, to leave more gaps among the first pixel unit groups P30, so that the light from the first side S1 of the display substrate 1 is allowed to pass through.

For example, as shown in FIG. 14 and FIG. 17B, both ends of the fourth transfer electrode TS34 are respectively connected with the first electrode plates CE1 of the two first pixel units P31 arranged adjacent to each other and belonging to different first pixel unit groups P30, to electrically connect the first power lines VDD1 located in different first pixel units P31. Because the two first pixel units P11 arranged adjacent to each other and belonging to different first pixel unit groups P30 are misaligned with each other, the fourth transfer electrode TS24 also includes a portion extending along the first direction Y1. That is, the fourth transfer electrode TS34 first extends along the first direction Y1, then extends along the second direction X1, and then extends along the first direction Y1.

As shown in FIG. 15, FIG. 17B, and FIG. 17C, the fourth transfer electrode TS34 includes a first transfer sub-electrode TSP1, a second transfer sub-electrode TSP2 and a third transfer sub-electrode TSP3. The first transfer sub-electrode TSP1 is connected with the first pixel unit group P30 at the left side in the figure, and is an "L" shape. The second transfer sub-electrode TSP2 is connected with the first pixel unit group P30 at the right side in the figure, and is an "L" shape. A first end TSP11 of the first transfer sub-electrode TSP1 and a first end TSP21 of the second transfer sub-electrode TSP2 are respectively connected with two ends of the third transfer sub-electrode TSP3. The third transfer sub-electrode TSP3 extends along the second direction X1. The second end TSP2 of the first transfer sub-electrode TSP1 and the second end TSP21 of the second transfer sub-electrode TSP2 are respectively connected with the first electrode plates CE1 of the two first pixel units P31 that are arranged adjacently and belong to different first pixel unit groups P30. The arrangement of the third transfer sub-electrode TSP3 can reduce the interference of the electrical signals of other wiring lines to the fourth transfer electrode TS34.

Figure 16B:
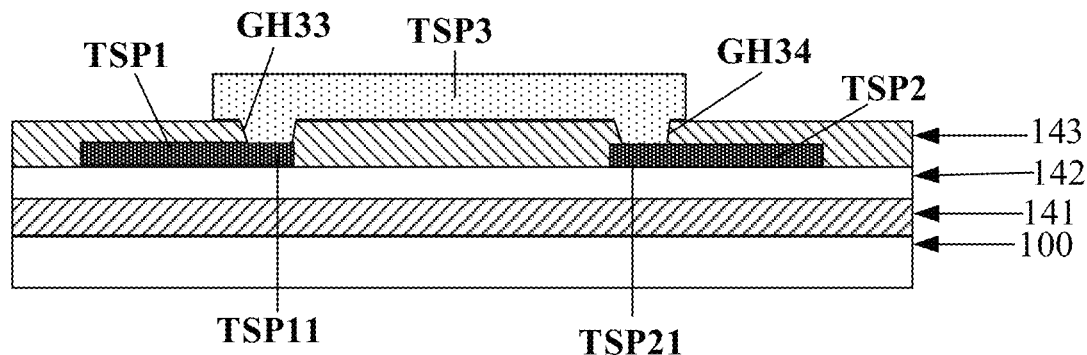
FIG. 16B is a schematic cross-sectional diagram along a line C33-C34 in FIG. 15.

For example, FIG. 16B is a schematic cross-sectional diagram along a line C33-C34 in FIG. 15. The Line C33-C34 pass through the first transfer sub-electrode TSP1, the second transfer sub-electrode TSP2, and the third transfer sub-electrode TSP3. As shown in FIG. 16B and FIG. 17B, the first transfer sub-electrode TSP1 and the second transfer sub-electrode TSP2 are located between the second insulating layer 142 and the third insulating layer 143, that is, the first transfer sub-electrode TSP1 and the second transfer sub-electrode TSP2 are located in the second conductive layer GA32. The first transfer sub-electrode TSP1 and the second transfer sub-electrode TSP2 are connected with the first electrode plates CE1 of the first pixel units P31 arranged adjacently and belonging to different first pixel unit groups P30 and may be integrally formed.

For example, as shown in FIGS. 16B and 17C, the third transfer sub-electrode TSP3 is located on a side of the third insulating layer 143 away from the base substrate 100, that is, located in the third conductive layer SD31. The fourth via hole GH33 is a via hole penetrating the third insulating layer, and the fifth via hole GH34 is also a via hole penetrating the third insulating layer. The third transfer sub-electrode TSP3 is connected with the first end TSP11 of the first transfer sub-electrode TSP1 through the fourth via hole GH33, and the third transfer sub-electrode TSP3 is connected with the first end TSP21 of the second transfer sub-electrode TSP2 through the fifth via hole GH34.

For example, as shown in FIG. 14, in a case that the four first pixel units P20 of the first pixel unit groups P30 are arranged in two rows and two columns, the first pixel units P21 in the first row of the first pixel unit group P30 are connected with different fourth transfer electrodes TS24. For example, for the first pixel unit group P30 (four first pixel units P31 are shown in the figure) at the right side of FIG. 14, the first electrode plate CE1 of the first pixel unit P31 in the first column (that is, the left side) of the first row of the first pixel unit group P30 is connected with the fourth transfer electrode TS34 at the upper left, the fourth transfer electrode TS34 at the upper left is also connected with the first electrode plate CE1 of the first pixel unit P31 in the second column (that is, the right side) of the second row of the first pixel unit group P30 located at the upper left. The first electrode plate CE1 of the first pixel unit P31 in the second column (that is, the right side) of the first row of the first pixel unit group P30 is connected with the fourth transfer electrode TS34 at the upper right, the fourth transfer electrode TS34 at the upper right is also connected with the first electrode plate CE1 (not shown in the figure) of the first pixel unit P21 in the first column (that is, the left side) of the second row of the first pixel unit group P30 at the upper right.

In other embodiments, the first electrode plate CE1 of the first pixel unit P31 in the first column (that is, the left side) of the second row of the first pixel unit group P30 may also be connected with the fourth transfer electrode TS34 at the lower left. The fourth transfer electrode TS34 at the lower left is also connected with the first electrode plate CE1 of the first pixel unit P31 in the second column (that is, the right side) of the first row of the first pixel unit group P30 at the lower left. The first electrode plate CE1 of the first pixel unit P31 in the second column (that is the right side) of the second row of the first pixel unit group P30 is connected with the fourth transfer electrode TS34 at the lower right, and the fourth transfer electrode TS34 at the upper right is also connected with the first electrode plate CE1 (not shown in the figure) of the first pixel unit P31 in the first column (that is, the left side) of the first row of the first pixel unit group P30 at the lower right.

For example, as shown in FIG. 15, a value range of the width W35 of the fourth transfer electrode TS34 (for example, the width in a direction perpendicular to the wiring direction of the fourth transfer electrode TS34) is, for example, from about 2 microns to about 3 microns, the value of the width W35 is, for example, about 2.5 microns.

Figure 17D:
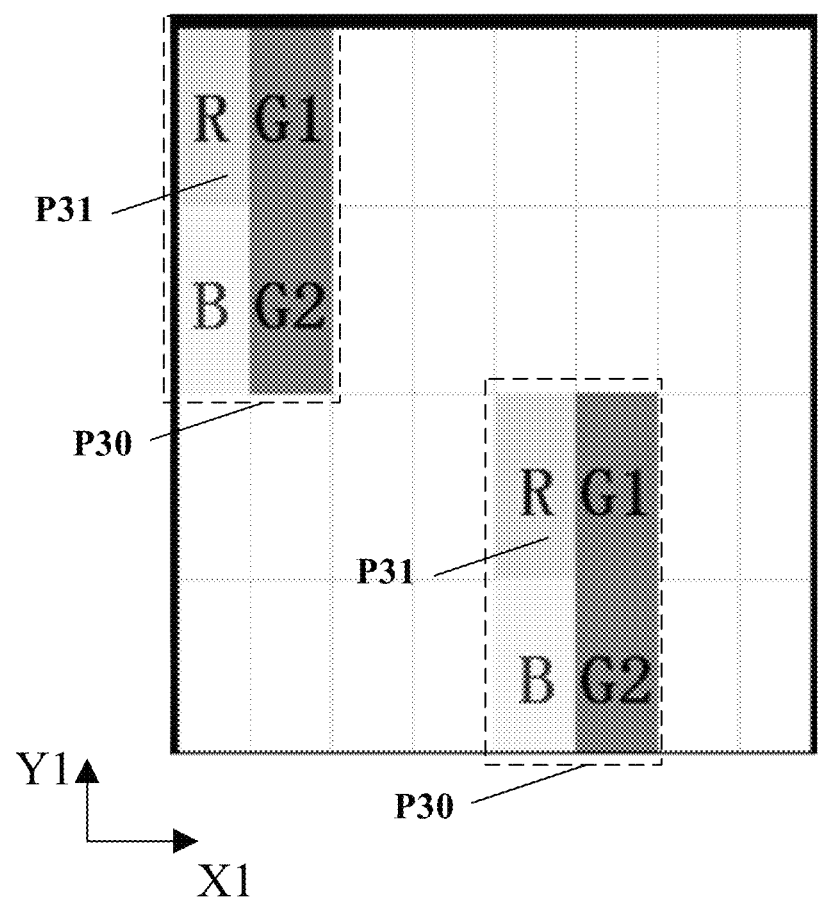
FIG. 17D is a schematic diagram of an arrangement of sub-pixels in the first display area shown in FIG. 14.

For example, FIG. 17D is a schematic diagram of an arrangement of sub-pixels in the first display area shown in FIG. 14. As shown in FIG. 17D, the four first pixel units P31 of the first pixel unit group P30 arranged in two rows and two columns may respectively include a red sub-pixel (R), a blue sub-pixel (B), a green sub-pixel (G1), and a green sub-pixel (G2) (that is, two green sub-pixels), that is, in one first pixel unit group P30, the two first pixel units P31 located in the first row include a red sub-pixel (R) and a green sub-pixel (G1), the two first pixel units P31 located in the second row include a blue sub-pixel (B) and a green sub-pixel (G2), that is, in a first pixel unit group P30, the light emitting device 11 of the first pixel unit P31 in the first column (i.e., the upper left corner) of the first row emits red light, the light emitting device 11 of the first pixel unit P31 in the second column of the first row (that is, the upper right corner) emits green light, the light emitting device 11 of the first pixel unit P31 in the first column (that is, the lower left corner) of the second row emits blue light, the light emitting device 11 of the first pixel unit P31 in the second column (that is, the lower right corner) of the second row emits green light, so as to realize the image display. The light emitting colors of the first pixel units P31 of each of the first pixel unit groups P30 may be selected according to actual display requirements, which are not limited in the embodiment of the present disclosure.

For example, the arrangements of the first pixel units and the wiring lines in the first display area of the display substrate shown in FIG. 2, FIG. 6, FIG. 10, and FIG. 14 are different. In terms of light transmittance of the first display area 10, the light transmittance of the first display area 10 in the embodiment shown in FIG. 10 is smaller than that of the embodiment shown in FIG. 6, is smaller than that of the embodiment shown in FIG. 14, and is smaller than that of the embodiment shown in FIG. 2. In terms of the display effect of the first display area 10, the display effect of the display area 10 in the embodiment shown in FIG. 2 is smaller than that of the embodiment shown in FIG. 6, and is smaller than that of the embodiment shown in FIG. 10, and the display effect of the display area 10 in the embodiment shown in FIG. 10 is equivalent to that of the embodiment shown in FIG. 14. The arrangement of the first pixel units and the wiring lines in the first display area can be flexibly selected according to the requirements of the product in terms of light transmittance and display effect in the first display area 10.

For example, as shown in FIG. 1B and FIG. 1C, the first signal lines DATA1 and the first power lines VDD1 connected with the first pixel units of the first pixel unit groups P0 (P10/P20/P30) near the second display area 20 extend to the second display area 20, to connect the second pixel units C located in the first direction Y1 with respect to the first pixel units P0 (P10/P20/P30). That is, in the first display area 10 in the figure, a row of first pixel units located closest to the second display area 20 (for example, the lowermost or uppermost of the first display area 10), the first signal line DATA1 and the first power line VDD1 connected with the first pixel units, can extend to the second display area 20, so as to be connected with the second pixel units C in the second display area 20. In this way, with respect to the first pixel units in the first display area 10, the second pixel units C in the first direction Y1 (that is, in the same column as the first pixel units in the first display area 10) are connected by one first signal line DATA1 and one first power line VDD1 to provide a same display signal and a same first power voltage.

Figure 18:
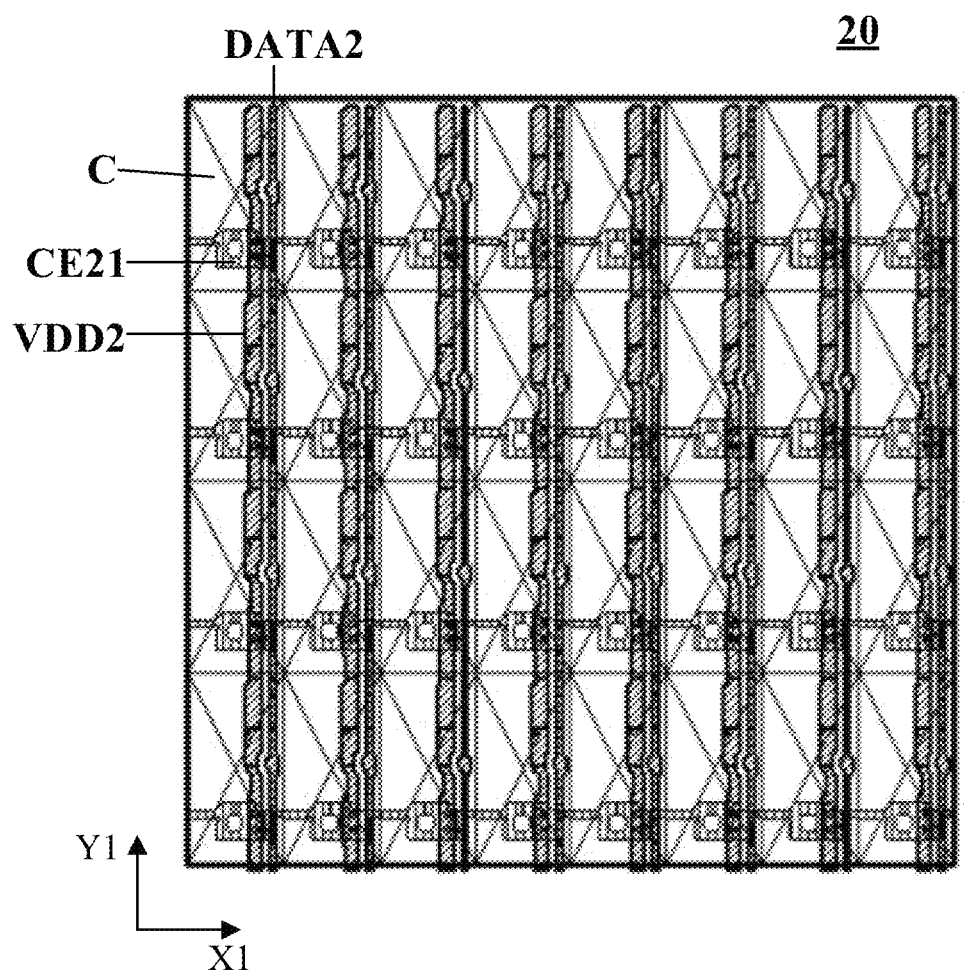
FIG. 18 is a schematic planar layout diagram of wiring lines in a second display area of a display substrate provided by at least one embodiment of the present disclosure.

For example, FIG. 18 is a schematic planar layout diagram of wiring lines in a second display area of a display substrate provided by at least one embodiment of the present disclosure. As shown in FIG. 18, the display substrate further includes a plurality of second signal lines DATA2 and a plurality of second power lines VDD2 located in the second display area 20. The plurality of second pixel units C in the second display area 20 are arranged in multiple columns parallel in the second direction X1, that is, the second pixel units C are arranged in multiple rows and multiple columns in an array, and no gap is provided between adjacent rows and adjacent columns arranged by the plurality of second pixel units C. The pixel density of the second display area 20 is greater than the pixel density of the first display area 10.

The second signal lines DATA2 extend along the first direction Y1, each of the plurality of second signal lines DATA2 passes through the plurality of second pixel units C arranged in a column in the first direction Y1, and is electrically connected with the plurality of second pixel units C arranged in a row, so as to provide a second display signal to the plurality of second pixel units C. The second power lines VDD2 extend along the first direction Y1, each of the plurality of second power lines VDD2 passes through the plurality of second pixel units C arranged in a column in the first direction Y1, and is electrically connected with the plurality of second pixel units C arranged in a row, to provide the second power voltage to the plurality of second pixel units C.

For example, the structures of the second pixel driving circuits of the second pixel units C may be the same as that the structures of the first pixel driving circuits of the first pixel units P1 (P11/P21/P31), for example, the structure shown in FIG. 20A is selected. The electrical connections between the second power lines VDD2 and the second pixel units C, can be the same as the electrical connections between the second power lines VDD1 and the first pixel units P1 (P11/P21/P31), that is, the second power lines VDD2 are connected with the first electrode plate CE21 of the storage capacitors of the second pixel driving circuits of the second pixel units C. The first electrode plates CE0 of the second pixel units C in the same row are connected with each other and are formed integrally, so that the second power voltages of the plurality of second pixel units C in the second display area 20 are the same.

It is to be noted that the second pixel driving circuits of the second pixel units C can select a same circuit structure as the first pixel driving circuits of the first pixel units P1 (P11/P21/P31), for the sake of conciseness, the structures of the first pixel driving circuits by using the 7T1C type circuit as an example will be described in detail, and the first pixel driving circuits will not be repeated herein.

Figure 19:
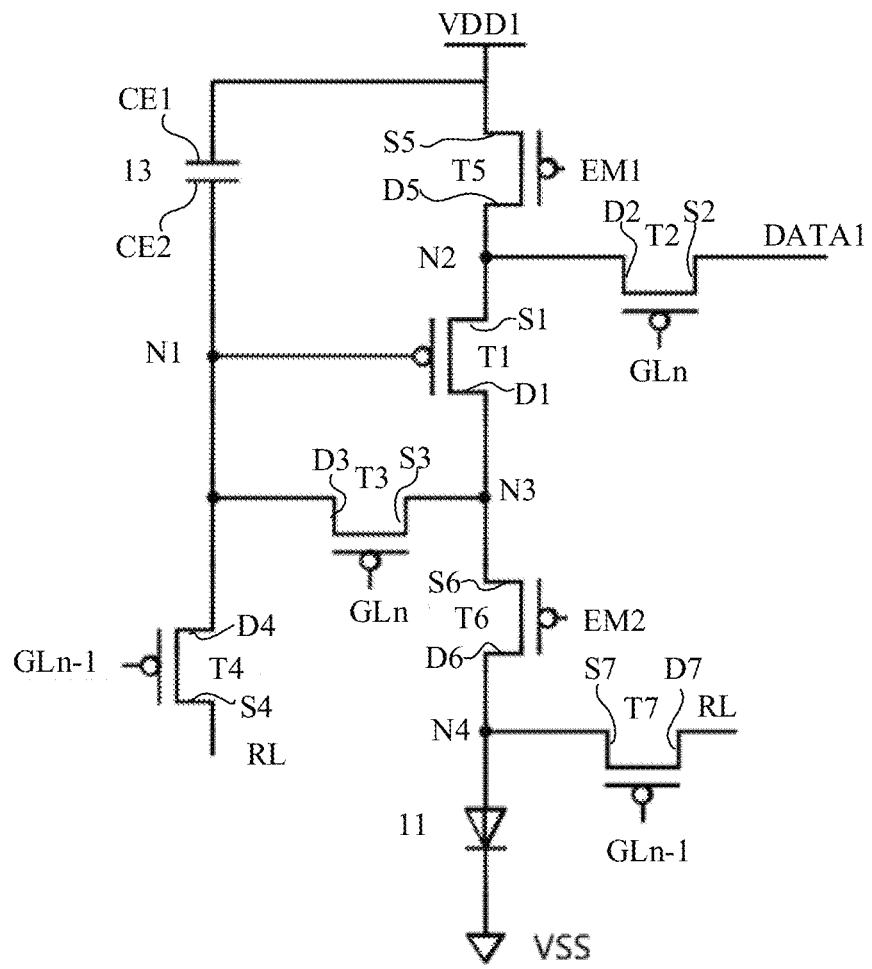
FIG. 19 is an equivalent circuit diagram of a first pixel driving circuit in a first display area of a display substrate provided by at least one embodiment of the present disclosure.

FIG. 19 is an equivalent circuit diagram of first pixel driving circuits in a first display area of a display substrate provided by at least one embodiment of the present disclosure. FIGS. 20B to 20E are schematic diagrams of each layers of first pixel driving circuits in a first display area of a display substrate provided by at least one embodiment of the present disclosure.

For example, as shown in FIG. 19, the first pixel driving circuit includes a plurality of thin film transistors, such as a first transistor T1, a second transistor T2, a third transistor T3, a fourth transistor T4, a fifth transistor T5, a sixth transistor T6, and a seventh transistor T7, a plurality of signal lines connected with the plurality of thin film transistors T1, T2, T3, T4, T5, T6, and T7, and storage capacitors 13, that is, the pixel circuit in this embodiment is a 7T1C structure. Correspondingly, the plurality of signal lines include gate lines GLn/GLn−1 (that is, scan signal lines), light-emitting control lines EM, initialization lines RL, first signal lines DATA1, and first power lines VDD1. The gate lines GLn/GLn−1 may include a first gate line GLn and a second gate line GLn−1. For example, the first gate line GLn is used to transmit gate scan signals, the second gate line GLn−1 is used to transmit a reset voltage signal, and the light-emitting control line EM is used to transmit a light-emitting control signal, for example, thin film transistors are connected with the first light-emitting control terminal EM1 and the second light-emitting control terminal EM2. The gate electrode of the fifth transistor T5 is connected with the first light-emitting control terminal EM1, or as the first light-emitting control terminal EM1 to receive the first light-emitting control signal; the gate of the sixth transistor T6 is connected with the second light-emitting control terminal EM2, or as the second light-emitting control terminal EM2 to receive the second light-emitting control signal.

It is to be noted that the embodiments of the present disclosure include, but are not limited to, the pixel circuits of the above-mentioned 7T1C structure. The pixel circuit can also adopt other types of circuit structures, for example, a 7T2C structure or a 9T2C structure, which are not limited in this embodiment of the present disclosure.

For example, as shown in FIG. 19, the first gate electrode of the first thin film transistor T1 is electrically connected with the third drain electrode D3 of the third thin film transistor T3 and the fourth drain D4 of the fourth thin film transistor T4. The first source electrode S1 of the first thin film transistor T1 is electrically connected with the second drain electrode D2 of the second thin film transistor T2 and the fifth drain electrode D5 of the fifth thin film transistor T5. The first drain electrode D1 of the first thin film transistor T1 is electrically connected with the third source electrode S3 of the third thin film transistor T3 and the sixth source electrode S6 of the sixth thin film transistor T6.

For example, as shown in FIG. 19, the second gate electrode of the second thin film transistor T2 is configured to be electrically connected with the first gate line GLn, to receive the gate scan signal; the second source electrode S2 of the second thin film transistor T2 is configured to be electrically connected to the first signal line DATA1, to receive a data signal. The second drain electrode D2 of the second thin film transistor T2 is electrically connected with the first source electrode S1 of the first thin film transistor T1.

For example, as shown in FIG. 19, the third gate electrode of the third thin film transistor T3 is configured to be electrically connected with the first gate line GLn, the third source electrode S3 of the third thin film transistor T3 is electrically connected with the first drain electrode D1 of the first thin film transistor T1, and the third drain electrode D3 of the third thin film transistor T3 is electrically connected with the first gate electrode of the first thin film transistor T1.

For example, as shown in FIG. 19, the fourth gate electrode of the fourth thin film transistor T4 is configured to be electrically connected with the second gate line GLn−1 to receive the reset voltage signal, the fourth source electrode S4 of the fourth thin film transistor T4 is configured to be electrically connected with the initialization line RL to receive the initialization voltage signal, and the fourth drain electrode D4 of the fourth thin film transistor T4 is electrically connected with the first gate electrode of the first thin film transistor T1.

For example, as shown in FIG. 19, the fifth gate electrode of the fifth thin film transistor T5 is configured to be electrically connected with the light-emitting control line EM to receive the light-emitting control signal, the fifth source electrode S5 of the fifth thin film transistor T5 is configured to be electrically connected with the first power line VDD1 to receive the first power signal, and the fifth drain electrode D5 of the fifth thin film transistor T5 is electrically connected with the first source electrode S1 of the first thin film transistor T1.

Figure 22:
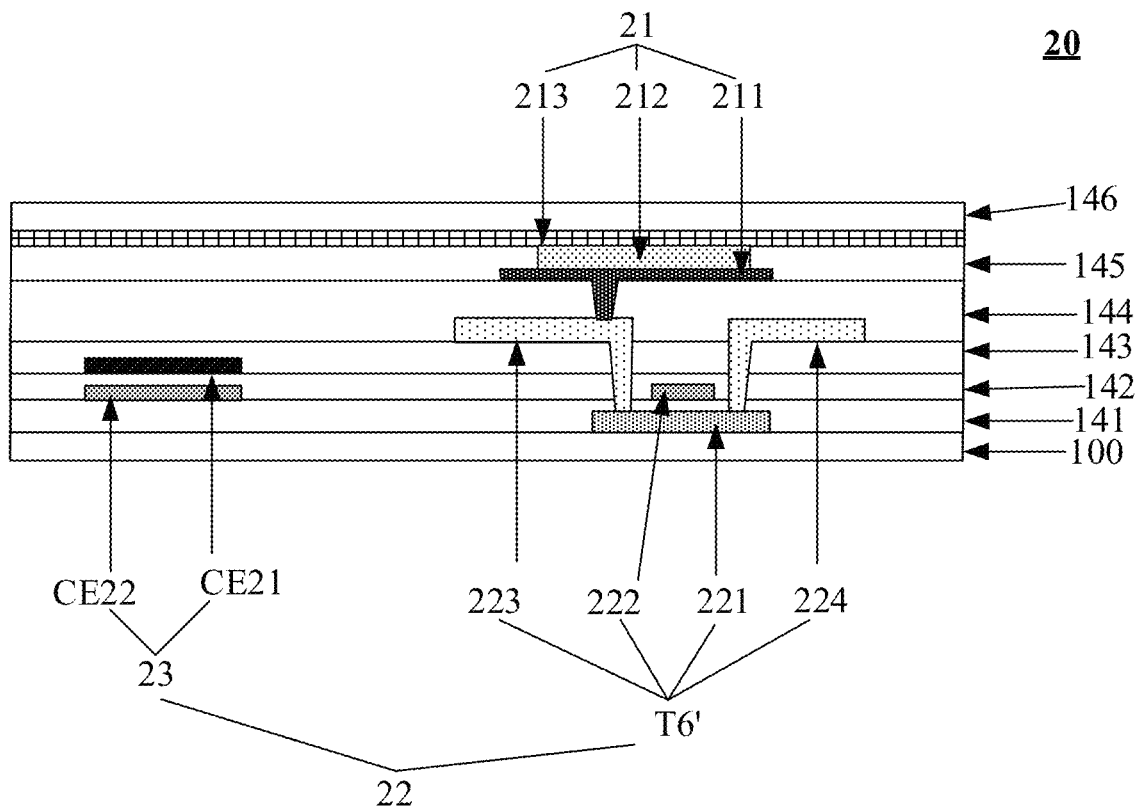
FIG. 22 is a schematic cross-sectional diagram of a second display area in a display substrate provided by at least one embodiment of the present disclosure.

For example, as shown in FIG. 19, the sixth gate electrode of the sixth thin film transistor T6 is configured to be electrically connected with the light-emitting control line EM to receive the light-emitting control signal, the sixth source electrode S6 of the sixth thin film transistor T6 is electrically connected with the first drain electrode D1 of the first thin film transistor T1, and the sixth drain electrode D6 of the sixth thin film transistor T6 is electrically connected with the first electrode (such as the anode 211) of the light-emitting element 11. The thin film transistor T6 in FIG. 22 is the sixth thin film transistor T6.

For example, as shown in FIG. 19, the seventh gate electrode of the seventh thin film transistor T7 is configured to be electrically connected with the second gate line GLn−1 to receive the reset voltage signal, the seventh source electrode S7 of the seventh thin film transistor T7 is electrically connected with the first electrode (such as the anode 111) of the light-emitting element 11, and the seventh drain electrode D7 of the seventh thin film transistor T7 is configured to be electrically connected with the initialization line RL to receive the initialization voltage signal. For example, the seventh drain electrode D7 of the seventh thin film transistor T7 may be electrically connected with the initialization line RL by being connected with the fourth source electrode S4 of the fourth thin film transistor T4.

For example, as shown in FIG. 19 and FIG. 20A, the storage capacitor 13 includes a first electrode plate CE1 and a second electrode plate CE2. The first electrode plate CE1 is electrically connected with the first power line VDD1, the second electrode plate CE2 is electrically connected with the first gate electrode of the first thin film transistor T1 and the third drain electrode D3 of the third thin film transistor T3. For example, the first power line VDD1 is connected with the first plate CE1 of the storage capacitor 13 through the third via hole VH3 and the ninth via hole VH9, the first electrode plate CE1 of the storage capacitor 13 is connected with the adjacent first electrode plate CE1 in the second direction X1 through the first sub-wiring line 2422.

For example, as shown in FIG. 19, the second electrode (such as the cathode 113) of the light-emitting element 11 is electrically connected with the second power line VSS.

For example, the first power line VDD1 provides a high voltage power line for the first pixel driving circuit, and the second power line VSS provides a low voltage (lower than the aforementioned high voltage) power line for the first pixel driving circuit. In the embodiment shown in FIG. 19, the first power line VDD1 provides a constant first power voltage, the first power voltage is a positive voltage; the second power line VSS provides a constant second power voltage, and the second power voltage may be a negative voltage. For example, in some examples, the second supply voltage may be a ground voltage.

It is to be noted that the above-mentioned reset voltage signal and the above-mentioned initialization voltage signal may be a same signal.

It is to be noted that the transistors used in the embodiments of the present disclosure may be thin film transistors or field effect transistors or other switching devices with the same characteristics. The thin film transistor may include an oxide semiconductor thin film transistor, an amorphous silicon thin film transistor, or a polysilicon thin film transistor. The source and drain electrodes of the transistors can be symmetrical in structure, thus their source and drain electrodes can be indistinguishable in physical structure. The source and drain electrodes of all or part of the transistors in the embodiments of the present disclosure can be interchanged as required.

In some embodiments, as shown in 20A, the pixel circuit includes the above-mentioned thin film transistors T1, T2, T3, T4, T5, T6, and T7, a storage capacitor 13, and a first gate line GLn, a second gate line GLn-1, a light-emitting control line EM, an initialization line RL, a first signal line DATA1 and a first power line VDD1 that are connected with the plurality of thin film transistors T1, T2, T3, T4, T5, T6, and T7.

In the following, the structure of the pixel circuit will be described with reference to FIG. 19 and FIGS. 20A to 20E.

For example, FIG. 20A is a schematic layout diagram of a stacked positional relationship of the semiconductor layer, the first conductive layer, the second conductive layer, and the third conductive layer of the pixel circuit.

Figure 20B:
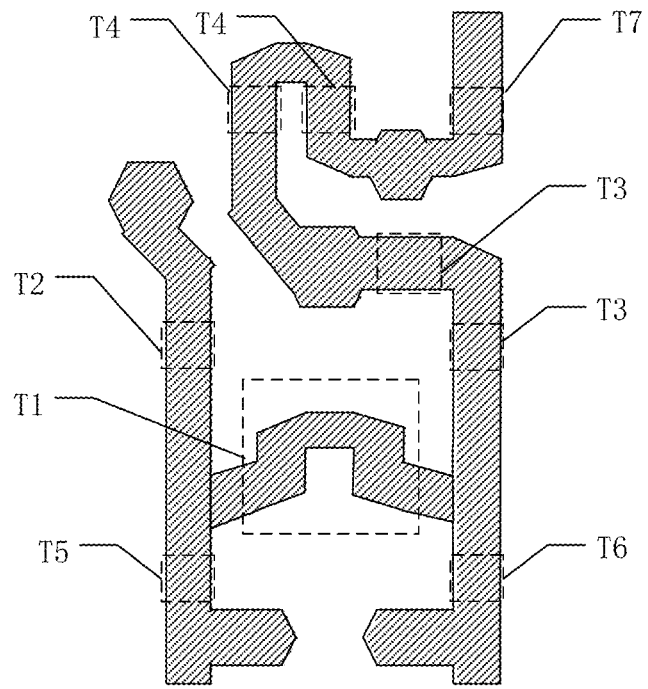
FIGS. 20B to 20E are schematic diagrams of each layer of the first pixel driving circuits in a first display area of a display substrate provided by at least one embodiment of the present disclosure.

FIG. 20B shows a semiconductor layer of the pixel circuit. For example, the semiconductor layer shown in FIG. 20B includes an active layer 121 shown in FIG. 21, the active layer 121 is, for example, an active layer of the sixth thin film transistor T6. As shown in FIG. 20B, the semiconductor layer may be formed by a patterning process using a semiconductor material layer. The semiconductor layer can be used to form the active layers of the above-mentioned first thin film transistor T1, second thin film transistor T2, third thin film transistor T3, fourth thin film transistor T4, fifth thin film transistor T5, sixth thin film transistor T6, and seventh thin film transistor T7, each of the active layers may include a source area, a drain area, and a channel area between the source and drain areas. For example, the semiconductor layer may be formed by using amorphous silicon, polycrystalline silicon, and oxide semiconductor materials (such as indium gallium tin oxide (IGZO)). It is to be noted that, the above-mentioned source and drain areas may be areas doped with n-type impurities or p-type impurities.

In the display substrates provided by some embodiments of the present disclosure, one or more other insulating layers are formed on the above-mentioned semiconductor layer, the insulating layer includes the first insulating layer 141 shown in FIG. 21; for clarity, the insulating layer is not shown in FIGS. 20A to 20E, but it is shown in the following FIG. 21 and FIG. 22, and the insulating layer will be described in detail later.

Figure 20C:
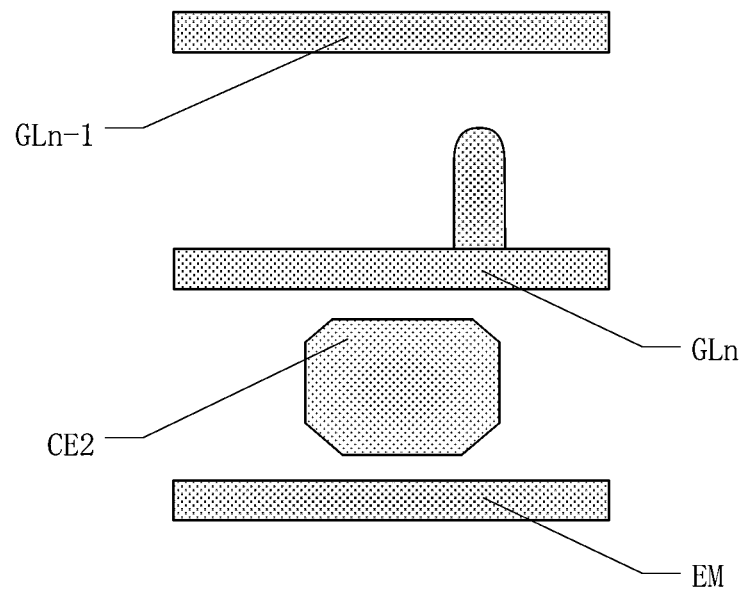

FIG. 20C shows a first conductive layer of the first pixel driving circuit. For example, as shown in FIG. 20C, the first conductive layer may include the second electrode plate CE2 of the storage capacitor 13, the first gate line GLn, the second gate line GLn-1, the light-emitting control line EM, and the gate electrodes of the first thin film transistor T1, the second thin film transistor T2, the third thin film transistor T3, the fourth thin film transistor T4, the fifth thin film transistor T5, the sixth thin film transistor T6, and the seventh thin film transistor T7.

As shown in FIG. 20B, the gate electrodes of the second thin film transistor T2, the fourth thin film transistor T4, the fifth thin film transistor T5, the sixth thin film transistor T6, and the seventh thin film transistor T7 are parts where the first gate line GLn, the second gate line GLn-1 overlap the semiconductor layer. The third thin film transistor T3 may be a thin film transistor with a double gate structure, one gate electrode of the third thin film transistor T3 may be a part where the first gate line GLn overlaps the semiconductor layer, another gate electrode of the third thin film transistor T3 may be a protrusion protruding from the first gate line GLn; and the gate electrode of the first thin film transistor T1 may be the first electrode plate CE1. The fourth thin film transistor T4 may be a thin film transistor with a double gate structure, and the two gate electrodes are respectively overlapping parts of the second gate lines GLn-1 and the semiconductor layer.

For example, the gate electrodes of the above thin film transistors are integrally formed with the corresponding first gate lines GLn or the second gate lines GLn-1, respectively.

In the display substrate provided by some embodiments of the present disclosure, one or more other insulating layers are formed on the above-mentioned first conductive layer, for example, the insulating layer includes a second insulating layer 142 shown in FIG. 21.

Figure 20D:
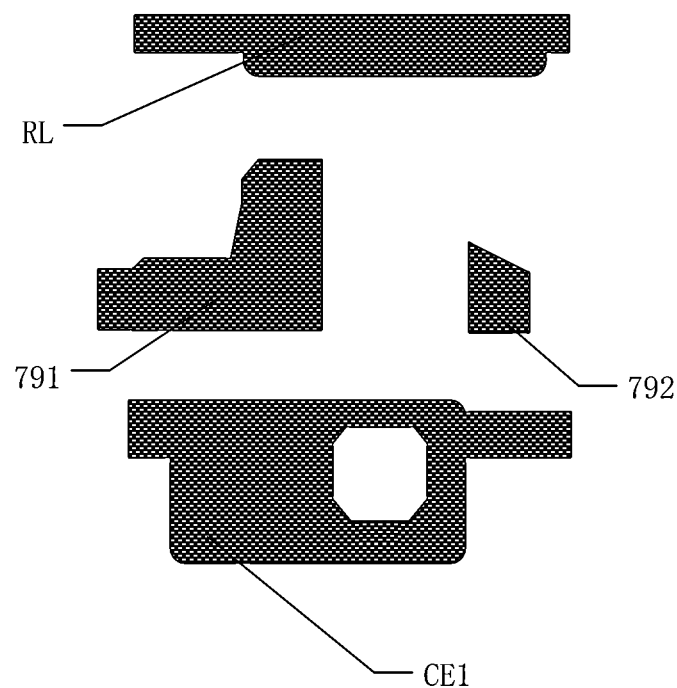

FIG. 20D shows a second conductive layer of the first pixel driving circuit. For example, in conjunction with FIG. 20A and FIG. 20D, the second conductive layer of the first pixel driving circuit includes the first electrode plate CE1 of the storage capacitor 13, the initialization line RL and the second sub-wiring line 2422, that is, the second sub-wiring line 2422 and the first electrode plate CE1 of the storage capacitor 13 are arranged in a same layer and are formed integrally. For example, the second sub-wiring line 2422 can also be regarded as a part of the extension of the first electrode plate CE1. The second electrode plate CE2 is at least partially overlapped with the first electrode plate CE1 to form the storage capacitor 13.

For example, in some embodiments, the second conductive layer may further include a first light shielding part 791 and a second light shielding part 792. An orthographic projection of the first light shielding part 791 on the base substrate 100 covers the active layer of the second thin film transistor T2, the active layer between the drain electrode of the third thin film transistor T3 and the drain electrode of the fourth thin film transistor T4, so that the external light is prevented from affecting the active layers of the second thin film transistor T2, the third thin film transistor T3, and the fourth thin film transistor T4. An orthographic projection of the second light shielding portion 792 on the base substrate 100 covers the active layer between the two gate electrodes of the third thin film transistor T3, so that the external light is prevented from affecting on the active layer of the third thin film transistor T3. The first light shielding part 791 can be integrated with a second light shielding part 792 of an adjacent pixel circuit, and the first light shielding part 791 is electrically connected with the first power line VDD1 through the tenth via hole VH9' penetrating through the insulating layer, as shown in FIG. 20A.

In the display substrate provided by some embodiments of the present disclosure, one or more other insulating layers are formed on the above-mentioned second conductive layer, for example, the insulating layer includes the third insulating layer 143 shown in FIG. 21.

Figure 20E:
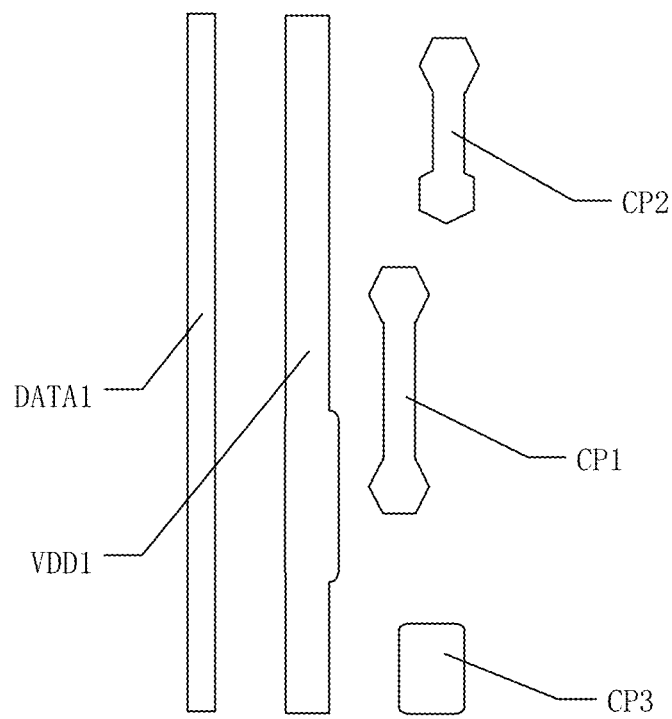

FIG. 20E shows a third conductive layer of the pixel circuit. For example, as shown in FIG. 20E, the third conductive layer of the first pixel driving circuit includes a first signal DATA1 and a first power line VDD1. In conjunction with FIGS. 20A to 20E, the first signal line DATA1 is connected with the source area of the second thin film transistor T2 in the semiconductor layer through at least one via hole (such as a via hole VH1) in the first insulating layer, the second insulating layer, and the third insulating layer. The first power line VDD1 is connected with the source area of the semiconductor layer corresponding to the fifth thin film transistor T5 through at least one via hole (such as a via hole VH2) in the first insulating layer, the second insulating layer, and the third insulating layer. The first power line VDD1 is connected with the first electrode plate CE1 in the second conductive layer through at least one via hole (such as a via hole VH3) in the third insulating layer.

For example, in conjunction with FIGS. 20A and 20E, the third conductive layer further includes a first connection part CP1, a second connection part CP2, and a third connection part CP3. One end of the first connection part CP1 is connected with the drain area corresponding to the third thin film transistor T3 in the semiconductor layer through at least one via hole (such as a via hole VH4) in the first insulating layer, the second insulating layer, and the third insulating layer, the other end of the first connection part CP1 is connected with the gate electrode of the first thin film transistor T1 in the first conductive layer through at least one via hole (such as a via hole VH5) in the second insulating layer and the third insulating layer. One end of the second connection part CP2 is connected with the initialization line RL through a via hole (e.g., via hole VH6) in the third insulating layer, the other end of the second connection part CP2 is connected with the source area of the seventh thin film transistor T7 and the source area of fourth thin film transistor T4 in the semiconductor layer through at least one via hole (such as a via hole VH7) in the first insulating layer, the second insulating layer, and the third insulating layer. The third connection part CP3 is connected with the drain area of the sixth thin film transistor T6 in the semiconductor layer through at least one via hole (such as a via hole VH8) in the first gate insulating layer, the second gate insulating layer, and the interlayer insulating layer.

For example, FIG. 21 is a schematic cross-sectional diagram of a first display area in a display substrate provided by at least one embodiment of the present disclosure. As shown in FIG. 21, the display substrate 1 further includes a first planarization layer 144 and a pixel defining layer 145. The first pixel unit includes a first light-emitting device 11 and a first pixel driving circuit 12.

For example, the first planarization layer 144 is located on a side of the first pixel driving circuit 12 away from the base substrate 100 to provide a planarized surface, the first planarization layer 144 provides a planarized surface and includes a via hole 144A. The sixth transistor T6 includes an active layer 121, a gate electrode 122, and source-drain electrodes (a source electrode 123 and a drain electrode 124). The storage capacitor 13 includes a first electrode plate CE1 and a second electrode plate CE2. The active layer 121 is arranged on the base substrate 100, the first insulating layer 141 is arranged on a side of the active layer 121 away from the base substrate 100, the gate electrode 122 and the second electrode plate CE2 are arranged in a same layer on a side of the first insulating layer 141 away from the base substrate 100, the second insulating layer 142 is arranged on a side of the gate electrode 122 and the second electrode plate CE2 away from the base substrate 100. The first electrode plate CE1 is arranged on a side of the second insulating layer 142 away from the base substrate 100, the third insulating layer 143 is arranged on a side of the first electrode plate CE1 away from the base substrate 100. The source electrode 123 and the drain electrode 124 are arranged on a side of the third insulating layer 143 away from the base substrate 100, and the source electrode 123 and the drain electrode 124 are electrically connected with the active layer 121 through the via holes in the first insulating layer 141, the second insulating layer 142, and the third insulating layer 143.

For example, the first planarization layer 144 includes inorganic insulating materials, such as silicon oxide, silicon nitride, and silicon oxynitride, and the first planarization layer 144 may also include organic insulating materials, such as polyimide, polyphthalamide, polyphthalimide, acrylic resin, benzocyclobutene or phenolic resin, which is not limited in the embodiments of the present disclosure.

For example, the material of the active layer 121 may include polysilicon or an oxide semiconductor (such as indium gallium zinc oxide). The material of the gate electrode 122 may include metal material or alloy material, such as metal single-layer or multi-layer structure formed by molybdenum, aluminum, and titanium, etc., for example, the multi-layer structure is a multi-metal stack (such as a titanium, aluminum, and titanium tri-metal stack (Ti/Al/Ti)). The material of the source electrode 123 and the drain electrode 124 may include metal material or alloy material, for example, single metal layer or multi-layer metal structure formed by molybdenum, aluminum and titanium, etc., for example, the multi-layer structure is a multi-metal stack (such as a titanium, aluminum, and titanium tri-metal stack (Ti/Al/Ti)). The embodiments of the present disclosure do not specifically limit the materials of various functional layers.

For example, as shown in FIG. 21, the first light-emitting device 11 includes a first electrode 111 (such as an anode), a first light-emitting layer 112 and a second electrode 113 (such as a cathode). The first electrode 111 is located on a side of the first planarization layer 144 away from the base substrate 100 and is connected with the source electrode 123 (or drain electrode 124) of the sixth transistor T6 through the via hole 144A in the first planarization layer 144. The pixel defining layer 145 is located on a side of the first electrode 111 of the first light-emitting device 11 away from the base substrate 100 and includes a first pixel opening 145A. The first pixel opening 145A corresponds to the first light-emitting device 11 to form a light-emitting area of the first light-emitting device 11. The second electrode 113 is located on a side of the pixel defining layer 145 away from the base substrate 100. The light-emitting layer 112 is located in the first pixel opening 145A and is located between the first electrode 111 and the second electrode 112. The part of the light-emitting layer 112 directly sandwiched between the first electrode 111 and the second electrode 112 will emit light after being energized, in this way, the area occupied by this part corresponds to the light-emitting area.

For example, the pixel defining layer 145 may include organic insulating material, such as polyimide, polyphthalamide, polyphthalimide, acrylic resin, benzocyclobutene, or phenolic resin, etc., or may include inorganic insulating material, such as silicon oxide and silicon nitride, which is not limited in the embodiments of the present disclosure.

For example, the material of the first electrode 111 may include at least one transparent conductive oxide material, including indium tin oxide (ITO), indium zinc oxide (IZO), and zinc oxide (ZnO). In addition, the first electrode 111 may include a metal, such as silver (Ag), with a high reflectivity as a reflective layer.

For example, for an OLED, the first light-emitting layer 112 may include a small molecular organic material or a polymer molecular organic material, which can be fluorescent luminescent material or phosphorescent luminescent material, and the first light-emitting layer 112 can emit red light, green light, blue light, or can emit white light. In addition, the light-emitting layer may further include functional layers, such as an electron injection layer, an electron transport layer, a hole injection layer, and a hole transport layer, as required. For an QLED, the light-emitting layer can include quantum dot material, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and Indium Arsenide Quantum Dots. A particle size of the quantum dots is from 2 nm to 20 nm.

For example, the second electrode 113 may include various conductive materials. For example, the second electrode 113 may include metal materials, such as lithium (Li), aluminum (Al), magnesium (Mg), and silver (Ag).

For example, a passivation layer may also be arranged between the first planarization layer and the source electrode 123 and the drain electrode 124. The passivation layer may be configured to include a via hole to expose one of the source electrode 123 and the drain electrode 124, for example, the drain electrode 124 is exposed. The passivation layer can protect the source electrode 123 and the drain electrode 124 from being corroded by moisture. For example, the material of the passivation layer may include organic insulating material, or inorganic insulating material, such as silicon nitride material. Due to the high dielectric constant and good hydrophobic characteristic of the silicon nitride, the first pixel circuit 12 can be well protected from being corroded by moisture.

For example, a transfer electrode may also be arranged between the first electrode 111 and the first pixel circuit 12, the transfer electrode is connected with the first electrode 111 and the first pixel circuit 12, to electrically connect the first electrode 111 with the first pixel circuit 12. The embodiments of the present disclosure are not limited to the specific structure of the first pixel unit.

For example, as shown in FIG. 21, the display substrate 1 further includes an encapsulation layer 146. The encapsulation layer 146 is located on a side of the second electrode 113 away from the base substrate 100. The encapsulation layer 146 seals the first light-emitting device 11, so that deterioration of the first light-emitting device 11 caused by moisture and/or oxygen included in the environment can be reduced or prevented. The encapsulation layer 146 can be a single-layer structure or a composite-layer structure, the composite layer structure includes a structure in which an inorganic layer and an organic layer are stacked. The encapsulation layer 146 includes at least one encapsulation sublayer. For example, the encapsulation layer 146 may include a first inorganic encapsulation layer, a first organic encapsulation layer, and a second inorganic encapsulation layer arranged in sequence.

For example, the material of the encapsulation layer 146 may include insulating materials, such as silicon nitride, silicon oxide, silicon oxynitride, and polymer resin. Inorganic materials, such as silicon nitride, silicon oxide, and silicon oxynitride have high compactness and can prevent the intrusion of water, oxygen, etc.; a material of the organic encapsulation layer can be a polymer material containing a desiccant or a polymer material that can block water vapor, etc., for example, polymer resin is used to planarize the surface of the display substrate, and stress of the first inorganic encapsulation layer and the second inorganic encapsulation layer can be relieved, a water-absorbing material, such as a desiccant, may also be included to absorb substances, such as water, oxygen, and other substances that have penetrated into the interior.

For example, FIG. 22 is a schematic cross-sectional diagram of a second display area in a display substrate provided by at least one embodiment of the present disclosure. Each of the plurality of second pixel units C in the second display area 20 of the display substrate 1 includes a second light-emitting device 21 and a second pixel driving circuit 22, the second pixel driving circuit 22 is electrically connected with the second light-emitting device 21 to drive the second light-emitting device 21.

For example, the second pixel driving circuit 22 includes structures, such as the sixth transistor T6' and the storage capacitor 23. The second light-emitting device 21 includes a third electrode 211, a fourth electrode 213, and a second light-emitting layer 212 between the third electrode 211 and the fourth electrode 213. The first planarization layer 144 is located on a side of the second pixel driving circuit 22 away from the base substrate 100 to provide a planarized surface, the first planarization layer 144 provides a planarized surface and includes a via hole 144A. The third electrode 211 is electrically connected with the second pixel driving circuit 22 through the via hole 144A. For example, the third electrode 211 is the anode of the second light-emitting device 21, the fourth electrode 213 is the cathode of the second light-emitting device 21. The pixel defining layer 145 is arranged on a side of the third electrode 211 away from the base substrate 100 and includes a plurality of openings. The second optical layer 212 is arranged in the plurality of openings of the pixel defining layer 145. The fourth electrode 213 is arranged on a side of the second light-emitting layer 212 and the pixel defining layer 145 away from the base substrate 100. The third electrode 211 and the first electrode 111 are arranged in a same layer and are made of a same material. The fourth electrode 213 and the second electrode 113 are arranged in a same layer and are made of a same material. The second light-emitting layer 212 and the first light-emitting layer 112 are arranged in a same layer and are made of a same material.

For example, the sixth transistor T6' includes structures, such as the active layer 221, the gate electrode 222, the source and drain electrodes (such as the source electrode 223 and the drain electrode 224), and the storage capacitor 23 includes a first electrode plate CE21 and a second electrode plate CE22. The active layer 321 is arranged on the base substrate 100, the first insulating layer 141 is arranged on a side of the active layer 221 away from the base substrate 100, the gate electrode 222 and the second electrode plate CE22 are arranged in the same layer on a side of the first insulating layer 141 away from the base substrate 100, the second insulating layer 142 is arranged on a side of the gate electrode 222 and the first capacitor plate 231 away from the base substrate 14, the first electrode plate CE21 is arranged on a side of the second insulating layer 142 away from the base substrate 100, the third insulating layer 143 is arranged on a side of the first electrode plate CE21 away from the base substrate 100, the source and drain electrodes are arranged on a side of the third insulating layer 143 away from the base substrate 14 and are electrically connected with the active layer 221 through the via holes in the first insulating layer 141, the second insulating layer 142, and the third insulating layer 143, and a first planarization layer 144 is arranged on the side of the source and drain electrodes away from the base substrate 100 to provide a first planarized surface, to planarize the third pixel circuit.

For example, the active layer 221, the gate electrode 222, and the source-drain electrodes (that is, the source electrode 223 and the drain electrode 224) of the sixth transistor T6' are respectively arranged in a same layer and are made of a same material as the active layer 121, the gate electrode 122, and the source-drain electrodes (the source electrode 223 and the drain electrode 224) of the sixth transistor T6. The first electrode plate CE21 and the second electrode plate CE22 of the storage capacitor 23 are respectively arranged in a same layer and are made of a same material as the first electrode plate CE1 and the second electrode plate CE2 of the storage capacitor 13.

It is to be noted that the second pixel driving circuit 22 in the second display area 20 and the first pixel driving circuit 12 in the first display area 10 include a same structure. In this way, a same patterning process can be used in the manufacturing process of the two driving circuits. For example, the first insulating layer 141, the second insulating layer 142, the third insulating layer 143, the first planarization layer 144, the pixel defining layer 145, and the encapsulation layer 146 are arranged in a same layer in the second display area 20 and the first display area 10, and they are also integrally formed in some embodiments, for example, these layers are a same insulating layer, and a same reference numeral is used in the drawings in some embodiments.

For example, the base substrate 100 in at least one embodiment of the present disclosure may be a glass plate, a quartz plate, a metal plate, a resin-based plate, or other plates. For example, a material of the base substrate may include organic material, for example, the organic material can be resins, such as polyimide, polycarbonate, polyacrylate, polyetherimide, polyethersulfone, polyethylene terephthalate, and polyethylene naphthalate. For example, the base substrate 100 may be a flexible substrate or a non-flexible substrate, which is not limited in the embodiment of the present disclosure.

Figure 23:
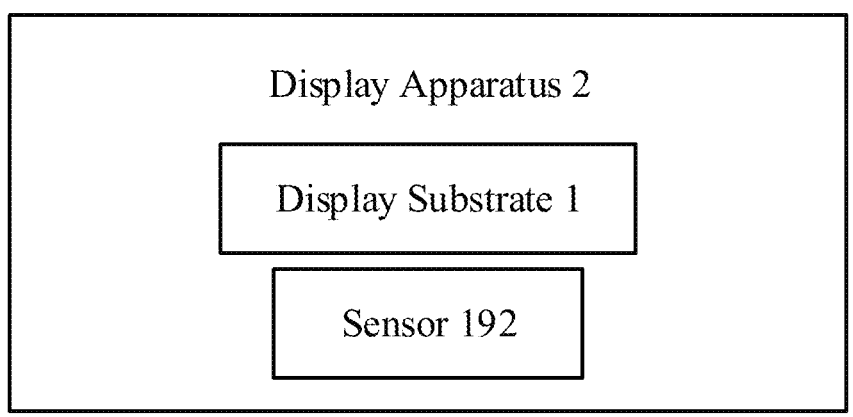
FIG. 23 is a schematic diagram of a display apparatus provided by at least one embodiment of the present disclosure.

FIG. 23 is a schematic diagram of a display apparatus according to at least one embodiment of the present disclosure. At least one embodiment of the present disclosure provides a display apparatus 2, and the display apparatus 2 may include any one of the display substrates 1 provided by the above embodiments.

For example, as shown in FIG. 23, the display apparatus 2 may further include a flexible circuit board and a control chip. For example, the flexible circuit board is bonded to the bonding area of the display substrate 1, the control chip is mounted on the flexible circuit board, thereby being electrically connected with the display area; or the control chip is directly bonded to the bonding area, thereby being electrically connected with the display area.

For example, the control chip may be a central processing unit, a digital signal processor, or a system-on-chip (SoC). For example, the control chip may also include a memory, and may also include a power module, and functions, such as power supply and signal input and output are realized through additionally provided conductive lines and signal lines. For example, the control chip may also include hardware circuits, and computer executable codes. The hardware circuits may include conventional very large scale integration (VLSI) circuits or gate arrays as well as existing semiconductors, such as logic chips, transistors, or other discrete components; the hardware circuits may also include field programmable gate arrays, programmable array logic, and programmable logic devices.

For example, the display apparatus 2 provided by at least one embodiment of the present disclosure may be any product or components with a display function, such as an OLED panel, an OLED TV, a QLED panel, a QLED TV, a mobile phone, a tablet computer, a notebook computer, a digital photo frame, and a navigator. The display apparatus 2 may further include other components, such as a data driving circuit, and a timing controller, which are not limited in the embodiments of the present disclosure.

For example, as shown in FIG. 23 and FIG. 1D, the display apparatus 2 further includes a sensor 192. The sensor 192 is arranged on the second side S2 (such as the non-display side) of the display substrate 1. The sensor 192 is configured to receive light (such as collimated light or non-collimated light) from the first side S1 of the display substrate 1 (such as the display side of the display substrate). The orthographic projection of the sensor 192 on the base substrate 100 is at least partially overlapped with the first display area 10.

For example, the sensor 192 is an image sensor, an infrared sensor, or a distance sensor, and the sensor 192 can be implemented, for example, in a form of a chip. The sensor 192 is arranged on the non-display side S2 (the side facing away from users) of the display substrate.

For example, the sensor 192 and the first display area 10 are at least partially overlapped in the normal direction of the display surface of the display substrate.

For example, the sensor 192 may be an image sensor, and can be used to collect images of the external environment facing the light-collecting surface of the sensor 192, for example, the sensor 192 can be a CMOS image sensor or a CCD image sensor; the sensor 192 may also be an infrared sensor, or a distance sensor. The sensor 192 can be used to implement a camera of a mobile terminal such as a mobile phone and a notebook, and can also include optical devices, such as lenses, mirrors or optical waveguides, as needed, to modulate the optical path. The embodiments of the present disclosure do not limit the type, function, and arrangement of the sensor 192.

The sensor 192 is arranged on the non-display side S2 of the display panel by a double-sided tape, and the orthographic projection of the sensor 192 on the base substrate 100 is at least partially overlapped with the first display area 10, and the sensor is configured to receive light from the first side S1. In this way, while the display in the first display area 10 is realized, the placement of the sensor 192 is also facilitated.

It is to be noted that, for the sake of clarity and conciseness, the embodiments of the present disclosure do not provide all the constituent units of the display device. In order to realize the substrate function of the display device, those skilled in the art can provide or arrange other structures not shown according to specific needs, which are not limited by the embodiments of the present disclosure.

Regarding the technical effect of the display device provided by the above-mentioned embodiments, reference may be made to the technical effect of the display substrate provided in the embodiments of the present disclosure, which will not be repeated herein.

The following points should be noted:
(1) the drawings of the embodiments of the present disclosure only relate to the structures related to the embodiments of the present disclosure, and other structures can refer to the general design.
(2) without conflicting with each other, the embodiments of the present disclosure and the features in the embodiments may be combined with each other to obtain new embodiments.

The above description is only the specific implementations of the present disclosure, and the scope of the present disclosure is not limited thereto. Any changes or substitutions readily conceived by those skilled in the art within the technical scope of the embodiments of the present disclosure shall fall within the scope of the present disclosure. The scope of the present disclosure should be defined by the claims.

What is claimed is:
1. A display substrate, provided with a first side for display and a second side opposite to the first side, comprising:
   a base substrate,
   a display area arranged on the base substrate, comprising a first display area, wherein the first display area allows at least part of light from the first side of the display substrate to be transmitted to the second side of the display substrate, the first display area comprises a first sub-pixel array, the first sub-pixel array comprises a plurality of first pixel unit groups, a plurality of first signal lines, and a plurality of first power lines arranged respectively in a first direction and a second direction intersecting the first direction, each of the first pixel unit groups comprises at least one first pixel unit, at least a part of each of the plurality of first signal lines extends along the first direction, and is configured to provide first display signals to a plurality of first pixel units, the plurality of first signal lines are connected with the first pixel units of the plurality of first pixel unit groups, at least a part of each of the plurality of first power lines extends along the first direction, and is configured to provide a first power supply voltage to the plurality of first pixel units, and the plurality of first power lines are connected with the first pixel units of the plurality of first pixel unit groups;

at least one connection line, wherein at least a part of each of the at least one connection line extends along the first direction, and is connected with the first power lines respectively connected to adjacent first pixel unit groups in the first direction; and at least one transfer electrode, wherein at least a part of each of the at least one transfer electrode extends along the first direction, and is connected with the first signal lines respectively connected to adjacent first pixel unit groups in the first direction;

wherein a film layer where at least part of the at least one transfer electrode is located is different from a film layer where each of the at least one connection line is located, and an orthographic projection of the at least one transfer electrode on the base substrate is at least partially overlapped with an orthographic projection of the at least one connection line on the base substrate.

2. The display substrate according to claim 1, wherein the at least one connection line comprises a first connection line, the first connection line extends along the first direction, the first connection line is connected with the first power lines connected with first pixel units that are adjacent in the first direction and are belong to different first pixel unit groups, and the first connection line and the first power lines are arranged in a same layer and are integrally formed.

3. The display substrate according to claim 2, wherein at least one first pixel unit of the first pixel unit groups comprises a plurality of first pixel units, the at least one transfer electrode comprises a plurality of transfer electrodes, the plurality of transfer electrodes are connected in a one-to-one correspondence with the plurality of first pixel units that are adjacent along the first direction and are belong to different first pixel unit groups, and film layers where the plurality of transfer electrodes are respectively located are different.

4. The display substrate according to claim 3, wherein the plurality of first pixel units of the first pixel unit groups are arranged in at least two parallel columns along the second direction, the plurality of transfer electrodes comprise a first transfer electrode and a second transfer electrode, the first transfer electrode and the second transfer electrode are arranged in parallel, the first transfer electrode and the second transfer electrode are connected with the first signal lines respectively connected with the first pixel units that are adjacent in the first direction and belong to different first pixel unit groups, a film layer where the first transfer electrode is located is different from a film layer where the second transfer electrode is located, and an orthographic projection of the first transfer electrode on the base substrate and an orthographic projection of the second transfer electrode on the base substrate are at least partially overlapped with an orthographic projection of the first connection line on the base substrate.

5. The display substrate according to claim 4, wherein an orthographic projection of a part of the first transfer electrode extending along the first direction and an orthographic projection of a part of the second transfer electrode extending along the first direction on the base substrate are overlapped with an orthographic projection of a part of the first connection line extending along the first direction on the base substrate; and gaps allowing light transmission are provided between adjacent first pixel unit groups in the first direction and between adjacent first pixel unit groups in the second direction respectively, and a part of the first connection line and a part of each of the at least one transfer electrode extend along the second direction and bypass the gaps allowing light transmission.

6. The display substrate according to claim 5, wherein the first connection line is a bending line, and comprises a first part, a second part, and a third part, a first end of the first part and a first end of the second part are connected with two ends of the third part respectively, and extend along the second direction different from the first direction, the third part extends along the first direction, and a second end of the first part and a second end of the second part are respectively connected with the first power lines that are respectively connected with adjacent first pixel units in the first direction.

7. The display substrate according to claim 6, wherein the orthographic projection of the first transfer electrode on the base substrate and the orthographic projection of the second transfer electrode on the base substrate are overlapped with an orthographic projection of at least one of the first part, the second part, and the third part of the first connection line on the base substrate.

8. The display substrate according to claim 3, wherein the plurality of first pixel units of each first pixel unit group comprise at least three columns of first pixel units arranged in parallel along the second direction, the at least one transfer electrode comprises a first transfer electrode, a second transfer electrode, and a third transfer electrode, the first transfer electrode, the second transfer electrode, and the third transfer electrode are arranged in parallel, the third transfer electrode is located between the first transfer electrode and the second transfer electrode, the first transfer electrode, the second transfer electrode, and the third transfer electrode are respectively connected with the first signal lines that are respectively connected with adjacent first pixel units in the first direction, film layers where the first transfer electrode, the second transfer electrode, and the third transfer electrode are located are different, the orthographic projection of the first connection line on the base substrate is at least partially overlapped with an orthographic projection of at least one of the first transfer electrode and the second transfer electrode on the base substrate, and the third transfer electrode is arranged in a same layer as the first connection line.

9. The display substrate according to claim 8, wherein an orthographic projection of the third transfer electrode on the base substrate is at least partially overlapped with an orthographic projection of the first transfer electrode or an orthographic projection of the second transfer electrode on the base substrate.

10. The display substrate according to claim 8, further comprising: a first insulating layer, a second insulating layer, and a third insulating layer, the first insulating layer is located on the base substrate, the second insulating layer is located on a side of the first insulating layer away from the base substrate, and the third insulating layer is located on a side of the second insulating layer away from the base substrate, the plurality of first signal lines, the plurality of first power lines, and the first connection lines are located on a side of the third insulating layer away from the base substrate, the second transfer electrode is located on a side of the first insulating layer away from the base substrate, and is connected with the first signal lines connected to adjacent first pixel units in the first direction through via holes penetrating the second insulating layer and the third insulating layer, the first transfer electrode is located on a side of the second insulating layer away from the base substrate, and is connected with the first signal lines connected to adjacent first pixel units in the first direction through via holes penetrating the third insulating layer, and the third transfer electrode is located on a side of the third insulating layer away from the base substrate.

11. The display substrate according to claim 10, wherein the plurality of first pixel units of each first pixel unit group are arranged in at least one row along the second direction, in a same row, the each first pixel unit group comprises at least two first pixel units, each of the first pixel units of the each first pixel unit group comprises a first pixel driving circuit and a first light-emitting device, the first pixel driving circuit is connected with the first light-emitting device and drives the first light-emitting device to emit light, the first pixel driving circuit comprises a storage capacitor, the storage capacitor comprises a first electrode plate and a second electrode plate arranged at least partially overlapping with the first electrode plate, the first electrode plate is located on a side of the second insulating layer away from the base substrate, the second electrode plate is located on a side of the first insulating layer away from the base substrate, the plurality of first power lines connected with each of the first pixel units are connected with the first electrode plate through a via hole penetrating the third insulating layer, and the first electrode plates of at least two first pixel units in a same row of the each first pixel unit group are connected with each other and are integrally formed.

12. The display substrate according to claim 11, further comprising a fourth transfer electrode, wherein at least a part of the fourth transfer electrode extends along the second direction, and the fourth transfer electrode is connected with the first power lines that are respectively connected with the first pixel units that are misaligned in the second direction and that are adjacently arranged and belong to different first pixel unit groups.

13. The display substrate according to claim 11, further comprising a fourth transfer electrode, wherein the fourth transfer electrode extends along the second direction, and the fourth transfer electrode is connected with first power lines that are respectively connected with two first pixel units arranged adjacent to the second direction and belonging to different first pixel unit groups, two ends of the fourth transfer electrode are respectively connected with the first electrode plates of the two first pixel units arranged adjacently and belonging to different first pixel unit groups, to connect the first power lines located in different first pixel unit groups.

14. The display substrate according to claim 13, wherein the fourth transfer electrode is located on a side of the third insulating layer away from the base substrate, the fourth transfer electrode is connected with the first electrode plates of the two first pixel units arranged adjacently and belonging to different first pixel unit groups through via holes penetrating the third insulating layer:

wherein the fourth transfer electrode is located on a side of the second insulating layer away from the base substrate, and the fourth transfer electrode and the first electrode plates of the two first pixel units arranged adjacently and belonging to different first pixel unit groups are arranged in a same layer and integrally formed.

15. The display substrate according to claim 13, wherein the fourth transfer electrode comprises a first transfer sub-electrode, a second transfer sub-electrode, and a third transfer sub-electrode, a first end of the first transfer sub-electrode and a first end of the second transfer sub-electrode are respectively connected with two ends of the third transfer sub-electrode, a second end of the first transfer sub-electrode and a second end of the second transfer sub-electrode are respectively connected with the first electrode plates of two first pixel units arranged adjacently and belonging to different first pixel unit groups, the first transfer sub-electrode and the second transfer sub-electrode are arranged in a same layer and integrally formed with the first electrode plates of the two first pixel units that are arranged adjacently and belong to different first pixel unit groups, and the third transfer sub-electrode is located on a side of the third insulating layer away from the base substrate, and the third transfer sub-electrode is connected with the first transfer sub-electrode and the second transfer sub-electrode through via holes passing through the third insulating layer.

16. The display substrate according to claim 3, wherein the plurality of first pixel units of the first pixel unit group are arranged in multiple rows and multiple columns, in a same first pixel unit group, the first signal lines connected with the first pixel units in a same column are connected with each other and are formed integrally, and the first power lines connected with the first pixel units in a same column are also connected with each other and are formed integrally.

17. The display substrate according to claim 1, wherein the display area further comprises a second display area, at least a part of the second display area surrounds the first display area, the second display area comprises a second sub-pixel array, and the second sub-pixel array comprises a plurality of second pixel units,
- each of the plurality of second pixel units comprises a second light-emitting device and a second pixel driving circuit, the second pixel driving circuit is configured to drive the second light-emitting device to emit light,
- one of the first signal lines connected to a first pixel unit near the second display area extends to the second display area, to be connected with a second pixel unit located in the first direction relative to the first pixel unit, and
- one of the first power lines connected to a first pixel unit near the second display area extends to the second display area, to be connected with a second pixel unit located in the first direction relative to the first pixel unit;
- wherein a pixel density of the second display area is greater than a pixel density of the first display area.

18. The display substrate according to claim 17, further comprising a plurality of second signal lines and a plurality of second power lines located in the second display area,
- wherein the plurality of second pixel units are arranged in a plurality of columns parallel in the second direction,
- the plurality of second signal lines extend along the first direction, each of the plurality of second signal lines passes through the plurality of second pixel units arranged in a column in the first direction, to provide second display signals to the plurality of second pixel units,
- the plurality of second power lines extend along the first direction, each of the plurality of second power lines passes through the plurality of second pixel units arranged in a column in the first direction, to provide a second power supply voltage to the plurality of second pixel units.

19. A display apparatus, comprising the display substrate according to claim 1.

20. The display apparatus according to claim 19, further comprising a sensor,
- wherein the sensor is arranged on the second side of the display substrate, and the sensor is configured to receive light from the first side of the display substrate, and an orthographic projection of the sensor on the base substrate is at least partially overlapped with the first display area.

* * * * *